United States Patent
Bishop et al.

(10) Patent No.: US 12,424,450 B2
(45) Date of Patent: Sep. 23, 2025

(54) EMBEDDED COMPONENT INTERPOSER OR SUBSTRATE COMPRISING DISPLACEMENT COMPENSATION TRACES (DCTs) AND METHOD OF MAKING THE SAME

(71) Applicant: Deca Technologies USA, Inc., Tempe, AZ (US)

(72) Inventors: Craig Bishop, Scottsdale, AZ (US); Andrew Hoetker, Castle Rock, CO (US); Ryan Sanden, Gilbert, AZ (US); Paul R. Hoffman, San Diego, CA (US); Timothy L. Olson, Phoenix, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/954,308

(22) Filed: Nov. 20, 2024

(65) Prior Publication Data

US 2025/0167003 A1 May 22, 2025

Related U.S. Application Data

(60) Provisional application No. 63/602,317, filed on Nov. 22, 2023.

(51) Int. Cl.
*H01L 21/3205* (2006.01)
*H01L 23/00* (2006.01)
(Continued)

(52) U.S. Cl.
CPC .. *H01L 21/32051* (2013.01); *H01L 23/49838* (2013.01); *H01L 24/06* (2013.01);
(Continued)

(58) Field of Classification Search
CPC ................................................ H01L 21/23051
See application file for complete search history.

(56) References Cited

U.S. PATENT DOCUMENTS 5,570,274 A 10/1996 Saito
5,790,384 A 8/1998 Ahmad
(Continued)

FOREIGN PATENT DOCUMENTS

| CN | 104253105 | | 12/2014 |
|----|-----------|---|---------|
| CN | 112234035 | A | 1/2021 |

(Continued)

OTHER PUBLICATIONS

Anandan, Ramasamy et al. "Embedded Wafer Level BGA (EWLB)—Extra-Small and Elga Packages." Electronics Packaging Technology Conference (EPTC), 2011. pp. 412-416.

(Continued)

*Primary Examiner* — William A Harriston
(74) *Attorney, Agent, or Firm* — Booth Udall, PLC; Kenneth C. Booth

(57) ABSTRACT

A method of making a substrate comprising an embedded component and further comprising a region of displacement compensation traces (DCTs) may comprise the following. A component comprising conductive contacts. Measuring a shift of the component. Forming a plurality of interconnect pads over the component according to a nominal design position. Forming the region of DCTs may comprise at least one arrangement of DCTs with unit specific patterning such that the arrangement of DCTs is coupled to, and extends between, the conductive contacts and the interconnect pads. The arrangement of DCTs may compensate for the measured shift of the component and a majority of the arrangement of DCTs does not extend beyond a shared footprint of the component and the interconnect pad region.

24 Claims, 49 Drawing Sheets

(51) Int. Cl.
*H01L 23/498* (2006.01)
*H01L 25/065* (2023.01)
(52) U.S. Cl.
CPC .......... *H01L 24/08* (2013.01); *H01L 25/0652* (2013.01); *H01L 2224/06151* (2013.01); *H01L 2224/08113* (2013.01)

(56) References Cited

U.S. PATENT DOCUMENTS

| | | |
|---|---|---|
| 6,121,065 A | 9/2000 | Wong |
| 6,133,626 A | 10/2000 | Hawke |
| 6,294,406 B1 | 9/2001 | Bertin |
| 7,456,496 B2 | 11/2008 | Hwee |
| 7,476,980 B2 | 1/2009 | Rebibis |
| 7,569,422 B2 | 8/2009 | Lin |
| 7,829,380 B2 | 11/2010 | Irsigler |
| 8,018,036 B2 | 9/2011 | Goh |
| 8,030,770 B1 | 10/2011 | Juskey |
| 8,164,171 B2 | 4/2012 | Lin |
| 8,487,435 B2 | 7/2013 | Juskey |
| 8,503,186 B2 | 8/2013 | Lin |
| 8,653,647 B2 | 2/2014 | Masuda |
| 8,664,044 B2 | 3/2014 | Jin |
| 8,804,360 B2 | 8/2014 | Lin |
| 8,860,207 B2 | 10/2014 | Jin |
| 9,355,945 B1 | 5/2016 | Ge |
| 9,368,438 B2 | 6/2016 | Lin |
| 9,385,074 B2 | 7/2016 | Pendse |
| 9,391,041 B2 | 7/2016 | Lin |
| 9,553,000 B2 | 1/2017 | Yu |
| 9,601,463 B2 | 3/2017 | Yu |
| 9,613,931 B2 | 4/2017 | Lin |
| 9,685,390 B2 | 6/2017 | Hu |
| 9,704,735 B2 | 7/2017 | Konchady |
| 9,793,231 B2 | 10/2017 | Chen |
| 9,831,170 B2 | 11/2017 | Scanlan |
| 10,056,351 B2 | 8/2018 | Yu |
| 10,229,892 B2 | 3/2019 | Appelt |
| 10,325,879 B2 | 6/2019 | Yu |
| 10,373,902 B2 | 8/2019 | Scanlan |
| 10,490,468 B2 | 11/2019 | Tsai |
| 10,510,721 B2 | 12/2019 | Bhagavat |
| 10,593,620 B2 | 3/2020 | Agarwal |
| 10,770,416 B2 | 9/2020 | Kim |
| 10,879,224 B2 | 12/2020 | Chen |
| 10,886,263 B2 | 1/2021 | Chen |
| 11,024,605 B2 | 6/2021 | Chen |
| 11,056,453 B2 | 7/2021 | Olson |
| 11,171,076 B2 | 11/2021 | Yu |
| 11,211,360 B2 | 12/2021 | Huang |
| 11,276,656 B2 | 3/2022 | Chen |
| 11,502,062 B2 | 11/2022 | Chen |
| 2003/0122246 A1* | 7/2003 | Lin .................... H01L 23/5389 257/E23.101 |
| 2007/0278701 A1 | 12/2007 | Chang |
| 2008/0038874 A1 | 2/2008 | Lin |
| 2009/0212428 A1 | 8/2009 | Yang |
| 2010/0290191 A1 | 11/2010 | Lin |
| 2011/0156239 A1 | 6/2011 | Jin |
| 2011/0202896 A1 | 8/2011 | Scanlan |
| 2011/0210442 A1 | 9/2011 | Lim |
| 2011/0285007 A1 | 11/2011 | Chi |
| 2012/0038061 A1 | 2/2012 | Su |
| 2012/0153493 A1 | 6/2012 | Lee |
| 2012/0228754 A1 | 9/2012 | Liu |
| 2013/0075894 A1 | 3/2013 | Gallegos |
| 2013/0075924 A1 | 3/2013 | Lin |
| 2013/0168830 A1 | 7/2013 | Uehling |
| 2014/0102772 A1 | 4/2014 | Chen |
| 2014/0124937 A1 | 5/2014 | Wu |
| 2014/0335658 A1 | 11/2014 | Scanlan |
| 2015/0249856 A1 | 9/2015 | Pereira |
| 2015/0380386 A1 | 12/2015 | Vincent |
| 2017/0148755 A1 | 5/2017 | Scanlan |
| 2018/0019221 A1 | 1/2018 | Appelt |
| 2018/0082911 A1 | 3/2018 | Bishop |
| 2018/0102311 A1 | 4/2018 | Shih |
| 2018/0130761 A1 | 5/2018 | Kim |
| 2018/0366423 A1 | 12/2018 | Ong |
| 2019/0027450 A1 | 1/2019 | Choi |
| 2019/0221520 A1 | 7/2019 | Kim |
| 2019/0259718 A1 | 8/2019 | Choi |
| 2019/0304938 A1 | 10/2019 | Hadizadeh |
| 2019/0326257 A1 | 10/2019 | Agarwal |
| 2019/0333893 A1 | 10/2019 | Yu |
| 2019/0341351 A1 | 11/2019 | May |
| 2020/0029435 A1 | 1/2020 | Baek |
| 2020/0043853 A1 | 2/2020 | Kim |
| 2020/0058627 A1 | 2/2020 | Chen |
| 2020/0194330 A1 | 6/2020 | Ramanathan |
| 2020/0219815 A1 | 7/2020 | Elsherbini |
| 2020/0266184 A1 | 8/2020 | Pietambaram |
| 2020/0294923 A1 | 9/2020 | Bhagavat |
| 2020/0328161 A1 | 10/2020 | Lin |
| 2020/0350272 A1 | 11/2020 | Hong |
| 2020/0402941 A1 | 12/2020 | Olson |
| 2020/0403299 A1 | 12/2020 | Gupta |
| 2020/0409859 A1 | 12/2020 | Saleh |
| 2020/0411397 A1 | 12/2020 | Han |
| 2020/0411443 A1 | 12/2020 | Guo |
| 2021/0066263 A1 | 3/2021 | Chen |
| 2021/0366854 A1 | 11/2021 | Yu |
| 2021/0366877 A1 | 11/2021 | Wu |
| 2022/0005760 A1 | 1/2022 | Dadvand |
| 2022/0262742 A1 | 8/2022 | Hou |
| 2022/0352106 A1 | 11/2022 | Sandstrom |
| 2023/0163112 A1 | 5/2023 | We |
| 2023/0275047 A1 | 8/2023 | Chen |

FOREIGN PATENT DOCUMENTS

| | | |
|---|---|---|
| JP | 2018032750 | 3/2018 |
| KR | 20150009668 | 1/2015 |
| KR | 1020160123959 | 10/2016 |
| TW | I261901 B | 9/2006 |
| TW | 201413845 | 4/2014 |
| TW | 202205600 A | 2/2022 |
| TW | 202234636 A | 9/2022 |
| WO | 2020263952 | 12/2020 |

OTHER PUBLICATIONS

Boettcher, Lars et al. Next Generation System in a Package Manufacturing by Embedded Chip Technologies. Additional Conferences (Device Packaging, HiTEC, HiTEN, & CICMT). 2010.

Boettcher, Lars et al. "Embedding of Chips for System in Package Realization—Technology and Applications." 2008. pp. 383-386.

Braun, Tanja et al. "Fan-Out Wafer and Panel Level Packaging as Packaging Platform for Heterogeneous Integration." Micromachines. 2019. vol. 10, pp. 342.

Jin, Yonggang et al. "Development and Characterization of Next Generation EWLB Embedded Wafer Level BGA) Packaging." ECTC, 2012. pp. 1388-1393.

Jin, Yonggang et al. "Enhanced Fan-Out WLP for High Power Device Packaging." International Electronics Manufacturing Technology Conference (IEMT), 2012.

Kurita, Yoichiro et al. "Fan-Out WLP With Highly Flexible Design Capabilities." 3rd Electronic System-Integration Technology Conference (ESTC), Sep. 13-16, 2010.

Ma, Yiyi et al. "Thermal Cycling Reliability Assessment and Enhancement of Embedded Wafer Level LGA Packages for Power Applications." Electronic Packaging Technology Conference (EPTC), 2012. pp. 606-611.

Motohasi, N., et al. System in Wafer Level Package Technology with RDL first process, 2011 Electronic Components and Technology Conferencepp 59-64.

(56) References Cited

OTHER PUBLICATIONS

Stahr, Hannes et al. "Embedded Components On the Way To Industrialisation." 2011. https://ats.het/wp-content/uploads/2017/03/SMTA_Austin_TX_2011_ECP_Paper.pdf.

* cited by examiner

- 48mm x 80mm EMBEDDED BRIDGE INTERPOSER
- 12 EMBEDDED BRIDGES FOR HBM3
  - ~9.5 x 7.5 mm
  - 73 μm tHBM3 PITCH
  - 43.5 x 55 μm PHY PITCH
- 10 EMBEDDED DIE-TO-DIE BRIDGES
  - 35 μm PITCH ON PROCESSORS
  - 3 x 8 mm & 3 x 5 mm
- INTEGRATED EMBEDDED COMPONENTS
  - PASSIVE OR ACTIVE DEVICES EMBEDDED IN THE INTERPOSER (EX: DTCs)

FIG. 4C

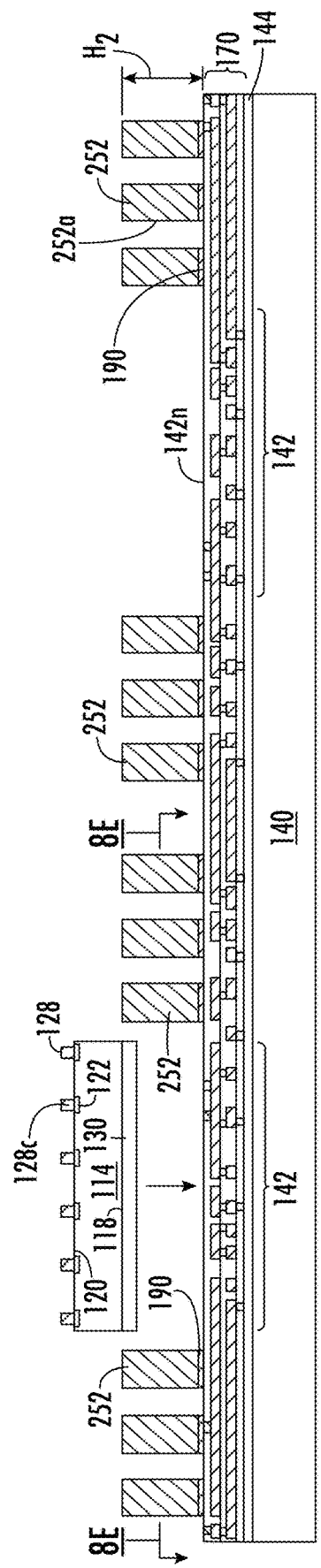

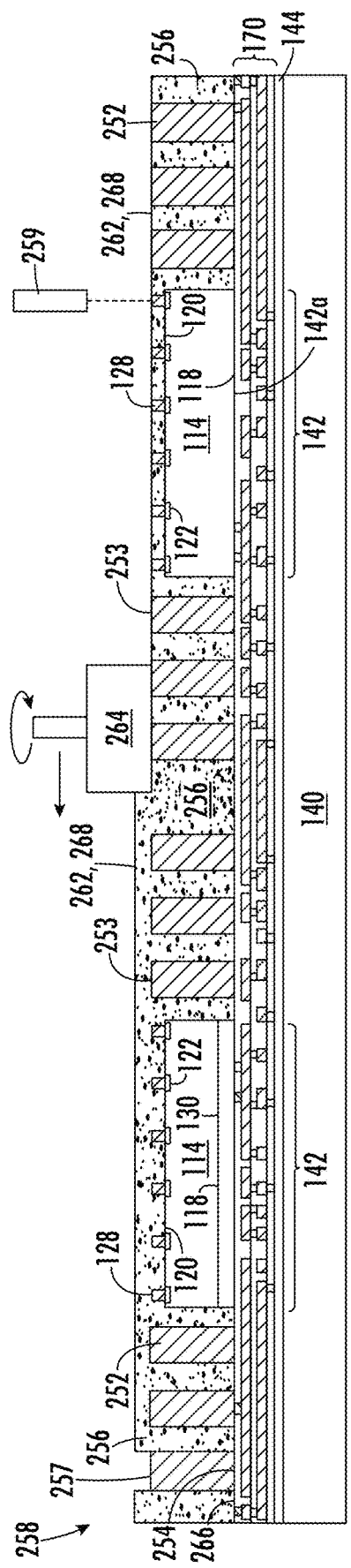

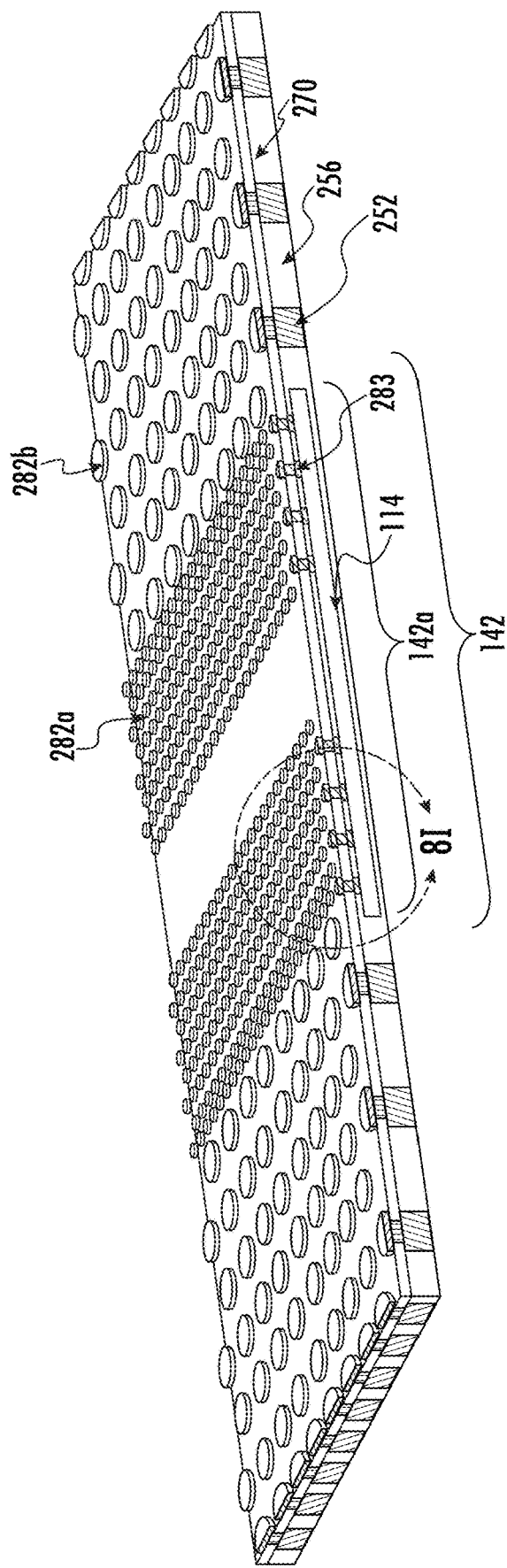

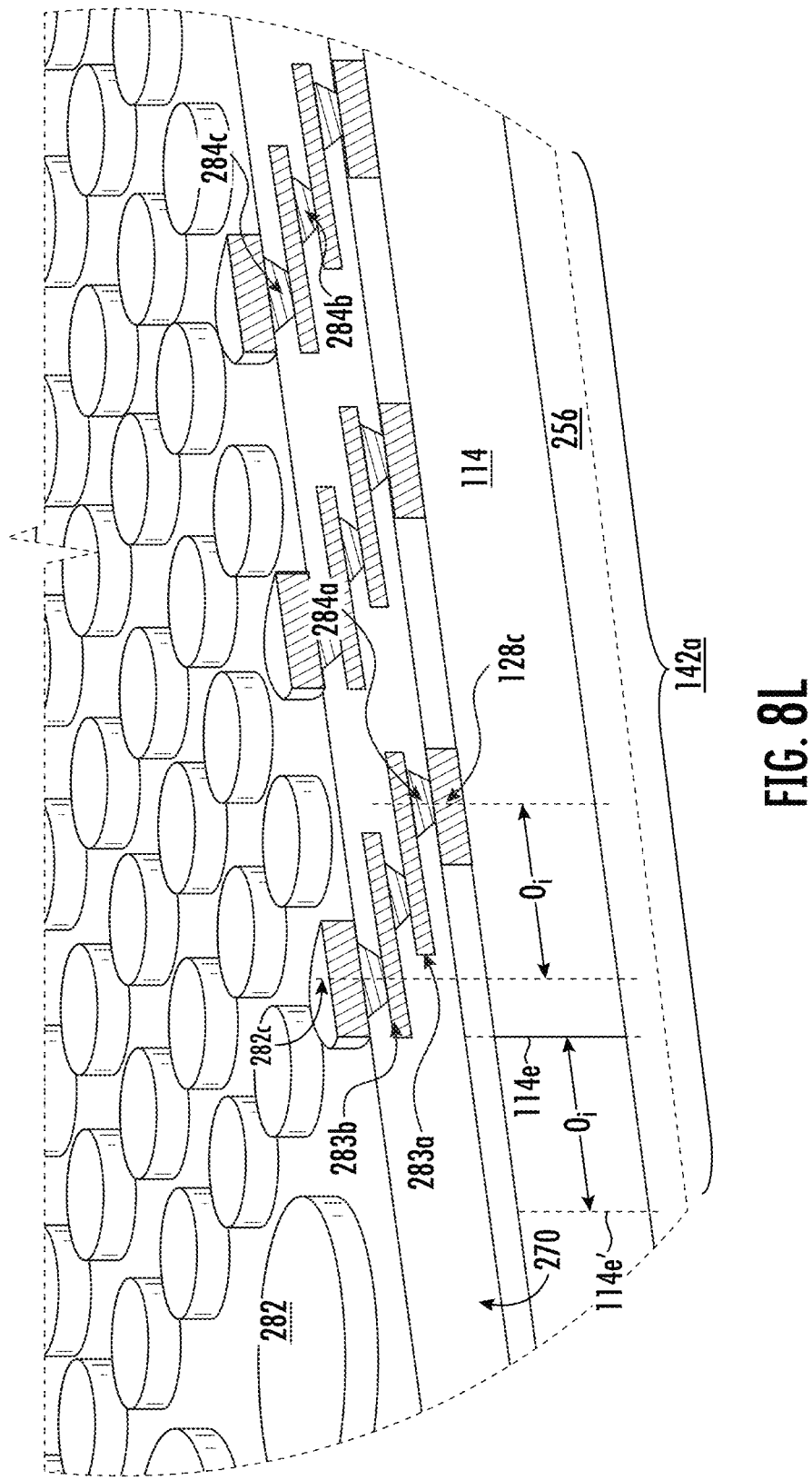

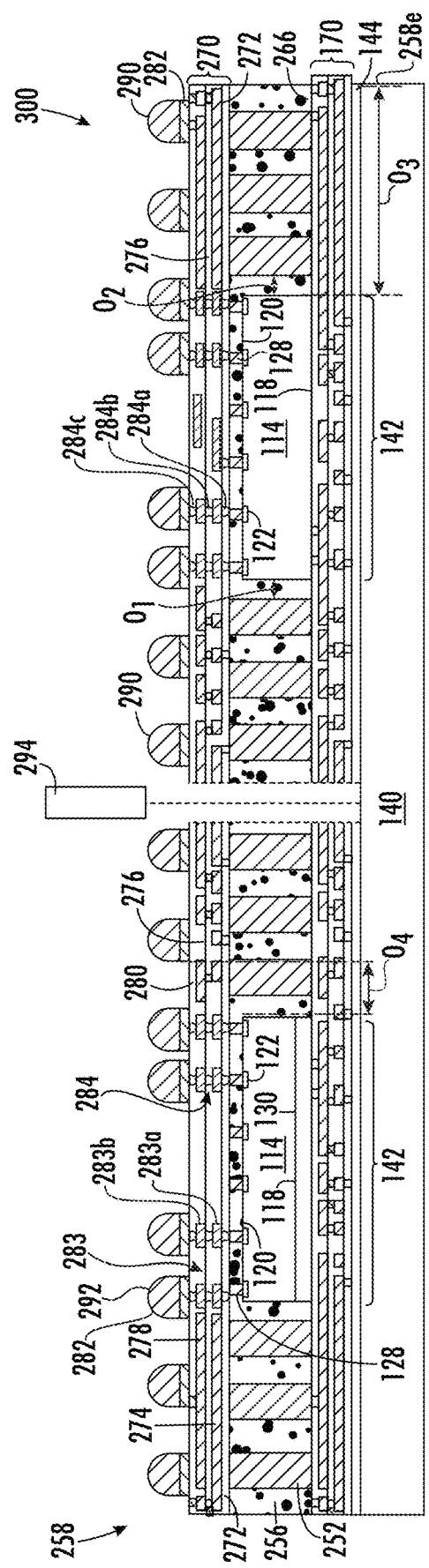

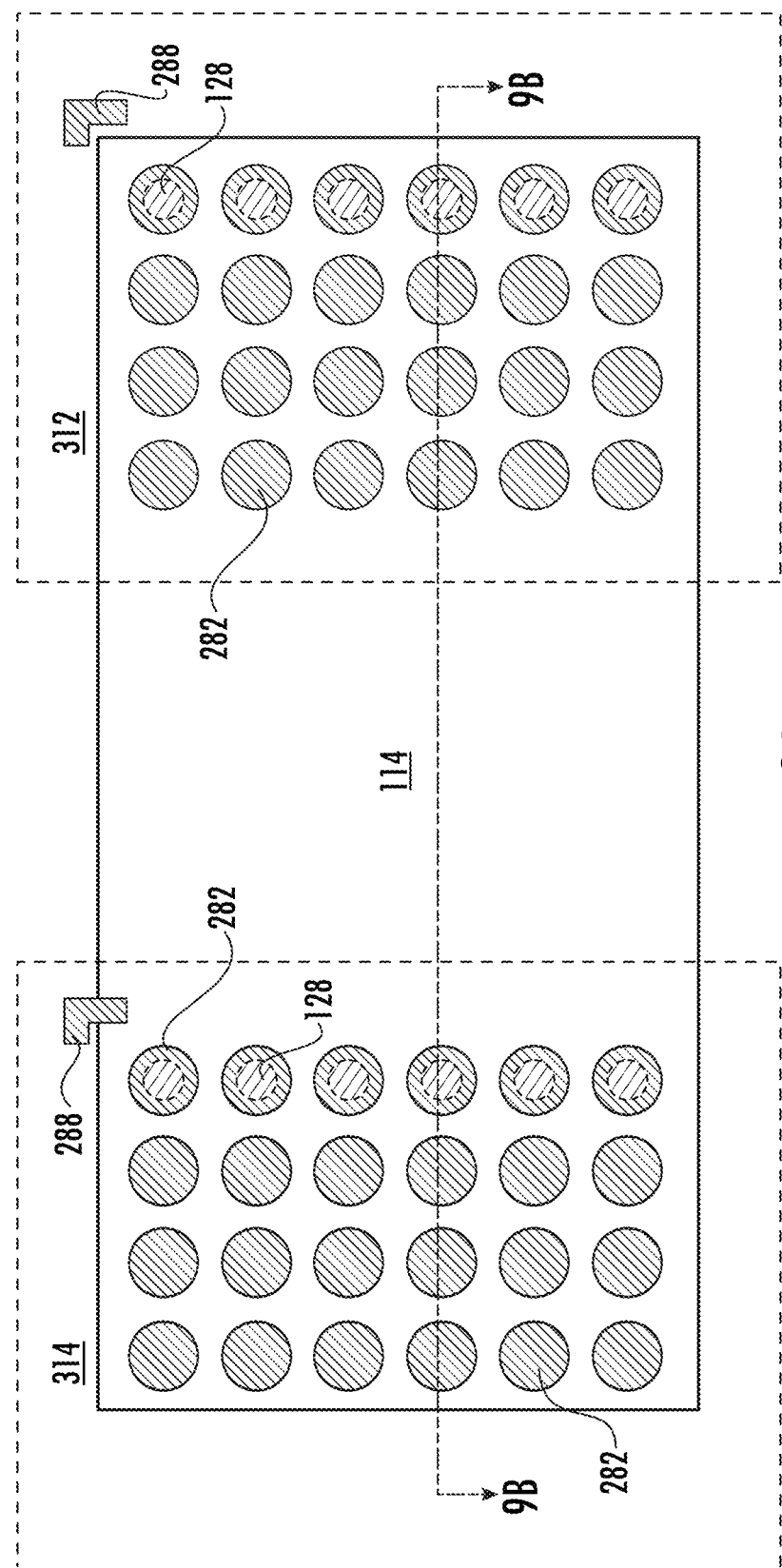

EMBEDDED COMPONENT INTERPOSER OR SUBSTRATE COMPRISING DISPLACEMENT COMPENSATION TRACES (DCTs) AND METHOD OF MAKING THE SAME

CLAIM OF PRIORITY

This application claims the benefit of U.S. provisional patent application 63/602,317, filed Nov. 22, 2023, titled "Embedded Component Interposer or Substrate Comprising Displacement Compensation Traces (DCTs) and Method of Making the Same", the entirety of the disclosure of which is hereby incorporated by this reference.

INCORPORATION BY REFERENCE OF APPLICATIONS

Applicant hereby incorporates by reference: (i) U.S. Utility patent application Ser. No. 18/085,397, entitled "Fully Molded Bridge Interposer and Method of Making the Same," which was filed on Dec. 20, 2022; (ii) U.S. Utility patent application Ser. No. 18/195,090, entitled "Molded Direct Contact Interconnect Structure without Capture Pads and Method for the Same," which was filed on May 9, 2023; and (iii) U.S. Utility patent application Ser. No. 18/225,064, entitled "Molded Direct Contact Interconnect Substrate and Methods of Making Same," which was filed on Jul. 21, 2023; the disclosures of which are hereby incorporated herein by this reference.

TECHNICAL FIELD

This disclosure relates to an embedded component interposer or substrate comprising displacement compensation traces—or members (DCTs) and methods of making the same.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, memories, analog to digital or digital to analog converters, power management and charged-coupled devices (CCDs), as well as microelectromechanical systems (MEMs) devices including digital micro-mirror devices (DMDs).

Semiconductor devices perform a wide range of functions such as signal processing, high-speed calculations, transmitting and receiving electromagnetic signals, controlling electronic devices, storing information, and creating visual projections for displays. Semiconductor devices are found in many fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar, complementary metal oxide semiconductors, and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. More recently, back-end manufacturing has been expanded to included emerging technology that allows multiple semiconductor die to be interconnected within a single package or device unit, thereby expanding the conventional definition of back-end technology. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, can be produced more efficiently, have a smaller form factor, and may be less cumbersome when integrated within wearable electronics, portable handheld communication devices, such as phones, and in other applications. In other words, smaller semiconductor devices may have a smaller footprint, a reduced height, or both, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

An opportunity exists for improved semiconductor and component manufacturing, packaging, and devices. Accordingly, in an aspect of the disclosure, a method of making a substrate comprising an embedded component and further comprising a region of displacement compensation traces (DCTs) may comprise providing a component comprising conductive contacts, measuring a shift of the component, and forming a plurality of interconnect pads formed in an interconnect pad region over the component according to a nominal design position. The region of DCTs may be formed comprising at least one arrangement of DCTs with unit specific patterning such that the arrangement of DCTs is coupled to, and extends between, the conductive contacts and the interconnect pads. The arrangement of DCTs may compensate for the measured shift of the component. The arrangement of DCTs may also comprise traces on one or more vertically separated RDL layers that extends between two termini and a majority of the traces comprise distances between the termini of the DCT traces that is less than an interconnect pad pitch.

Particular embodiments of the method may further comprise the at least one arrangement of DCTs compensates for the measured shift of the component and does not extend beyond a shared footprint of the component and the interconnect pad region. A DCT segment length for an edge case of the region that is outside the arrangement of DCTs may not exceed a spacing between the interconnect pads within the arrangement of DCTs. A DCT segment length on each RDL layer within the arrangement of DCTs may not exceed a spacing between a first interconnect pad and a closest adjacent interconnect pad. The arrangement of DCTs may comprise a length for each DCT segment that varies less than 20% of a length of each adjacent DCT for the arrangement. At least one chip or chiplet may be mounted to the interconnect pads, wherein the at least one chip or chiplet may comprise functional structures of one or more processing unit, graphics processing unit (GPU), central processing unit (CPU), AI accelerator, AI processor, network processor, SOC, memory device, high-bandwidth memory (HBM) stack, optical interface device, and an application specific integrated circuit (ASIC). The substrate may comprise an interposer. The component may comprise one or more of an embedded bridge die, an active device, or a passive device. A shift of the embedded component may comprise a shift of a first embedded component, which is different than a shift for the shift of a second embedded component disposed within the same substrate. A first arrangement of DCTs may compensate for a shift of the first embedded component. A second arrangement of DCTs may compensate for a shift of the second embedded component. A two-sided arrangement of DCTs may provide for at least one additional arrangement of DCTs is disposed over a backside of the substrate. The two-sided arrangement may further comprise at least one additional embedded component included over a backside of the substrate, opposite the embedded component. The substrate may be formed comprising molded direct contact interconnect structures.

According to an aspect of the disclosure, a method of making a substrate comprising an embedded component and further comprising a region of displacement compensation traces (DCTs) may comprise providing a component comprising conductive contacts, measuring a shift of the component, and forming interconnect pads within an interconnect pad region over the component according to a nominal design position. The region of DCTs may be formed comprising at least one arrangement of DCTs with unit specific patterning such that the arrangement of DCTs is coupled to, and extends between, the conductive contacts and the interconnect pads, wherein the arrangement of DCTs compensates for the measured shift of the component and a majority of the arrangement of DCTs does not extend beyond a shared footprint of the component and the interconnect pad region.

Particular embodiments of the method may further comprise the at least one arrangement of DCTs extends across two or more vertically separated RDL layers. A DCT segment length for an edge case of the region that is outside the arrangement of DCTs may not exceed a spacing between the interconnect pads within the arrangement of DCTs. A DCT segment length on each RDL layer within the arrangement of DCTs may not exceed a spacing between a first interconnect pad and a closest adjacent interconnect pad. The arrangement of DCTs may comprise a length for each DCT segment that varies less than 20% of a length of each adjacent DCT for the arrangement. At least one chip or chiplet mounted to the interconnect pads may comprise functional structures of one or more processing unit, GPU, CPU, AI accelerator, AI processor, network processor, SOC, memory device, and HBM stack, optical interface device, and an ASIC. The substrate may comprise an interposer. The component may comprise one or more of an embedded bridge die, an active device, or a passive device. A length of each DCT within the arrangement may be proportional to a distance between each DCT and a center of the embedded component. A shift of the embedded component comprises a shift of a first embedded component, which may be different than a shift for the shift of a second embedded component disposed within the same substrate. A first arrangement of DCTs may compensate for a shift of the first embedded component. A second arrangement of DCTs may compensate for a shift of the second embedded component. A two-sided arrangement may comprise at least one additional embedded component being included over a backside of the substrate, opposite the embedded component. The substrate may be formed comprising molded direct contact interconnect structures.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

FIGS. 4A-4C illustrate examples of embedded interposers according to an aspect of the disclosure.

FIGS. 9A-9F illustrate various aspects of substrates or interposers comprising embedded components that can be part of a chiplet arrangement.

DETAILED DESCRIPTION

Figure 1A:
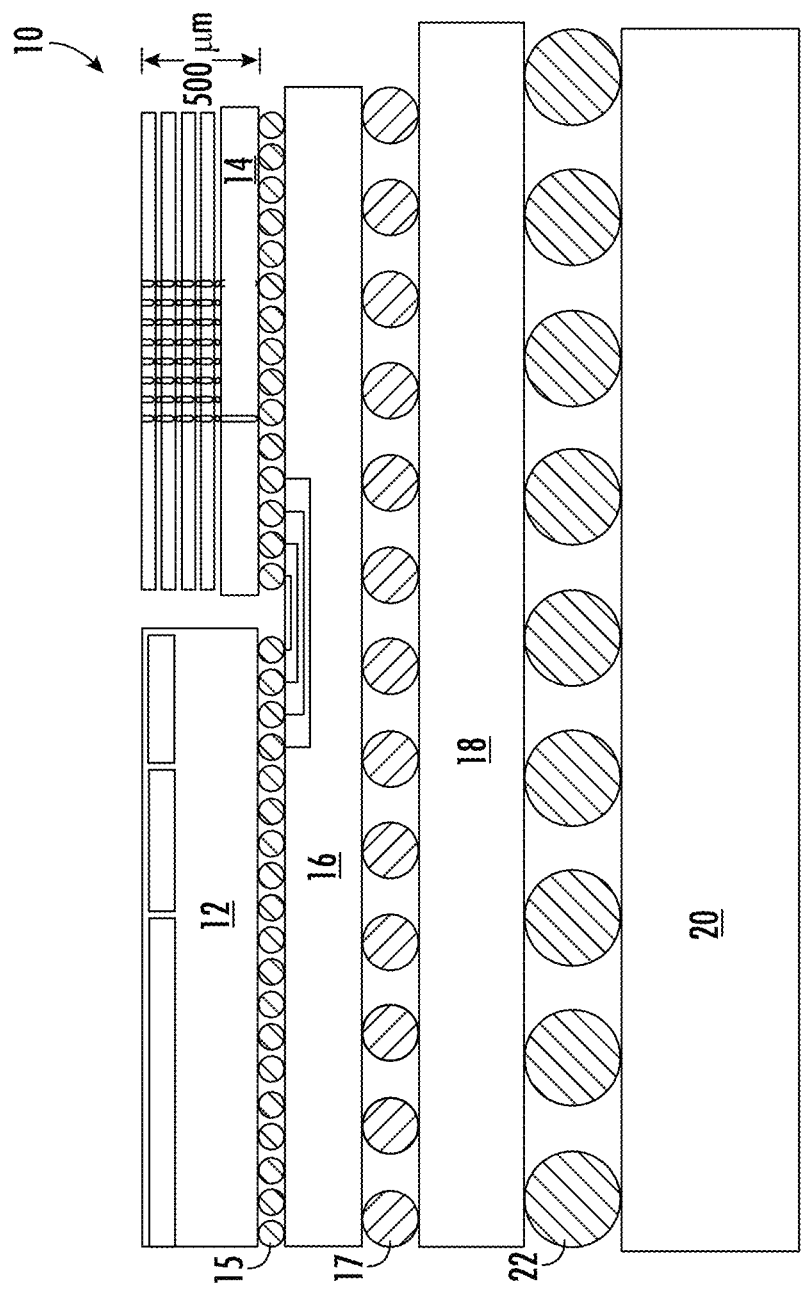
FIGS. 1A-1C illustrate existing semiconductor device designs including bridge interconnects.

This disclosure relates to interposers or substrates comprising embedded components, including fully molded semiconductor structures, devices, and packages, which may comprise a fully molded bridge interposer. In some instances, the fully molded semiconductor structures may comprise DCTs to accommodate shift of components.

This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise one or more of any components, models, types, materials, versions, quantities, and the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition or etch process using techniques such as electroless and electrolytic plating.

Patterning is the basic operation by which portions of the photoresist material are partially removed, so as to provide a pattern or electroplating template for the subsequent formation of structures, such as patterning RDLs, under bump mentalization (UBM), copper posts, vertical interconnects, or other desirable structures. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle, masks, or direct write imaging design file are transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes or electroplating adds the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed by etching or a layer is added by electroplating. The process of forming, exposing, and removing the photoresist, as well as the process of removing or adding a portion of the semiconductor wafer can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e. the portions exposed to light) with chemical solvents or base developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition or etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool, laser silicon lattice disruption process or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

Back-end manufacturing as disclosed herein also does more than merely packaging an embedded device or the semiconductor die for structural support and environmental isolation. The packaging described herein further provides non-monolithic electrical interconnection of die for increased functionality & performance. Previously, nearly all advanced semiconductor die were monolithic systems on chips (SoCs) where all electrical interconnect occurred on the silicon wafer during front-end processing. Now, however, work that was traditionally the domain of front-end domain work may be handled or moved to the back-end manufacturing, allowing many semiconductor die (chiplets) to be connected with packaging technology to form a chiplet-based SoC (which is non monolithic) and provides a composite package with greater functionality. The chiplet approach may also decrease waste from defects, increase production efficiency, reliability, and performance.

The electrical system can be a stand-alone system that uses the semiconductor device to perform one or more electrical functions. Alternatively, the electrical system can be a subcomponent of a larger system. For example, the electrical system can be part of a portable hand-held electronic device, such as smart phone, a wearable electronic device, or other video or electronic communication device. Additionally, the electrical system may comprise a graphics component, network interface component, or other signal processing component that can be inserted into a computer or electronics device and may assist with such functions as mobile computing, artificial intelligence, and autonomous functions such as autonomous driving. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor devices, structures, or packages with fan-out technology, manufacturers can incorporate multiple components or elements into more highly compact and integrated electronic devices and systems. Because the semiconductor devices include sophisticated functionality, electronic devices can be manufactured less expensively and as part of a streamlined manufacturing process. The resulting devices are less likely to fail and less expensive to manufacture resulting in a lower cost for consumers.

FIG. 1A shows prior art relative to connecting multiple semiconductor die or semiconductor packages together, that may be used for high intensity or high demand computing, such as computing utilizing or dealing with graphics cards.

FIG. 1A illustrates an existing packaging technology or structure 10 comprising a graphics processing unit (GPU 12) coupled to an HBM controller die 14 with bumps or microbumps 15 and through a silicon interposer 16 comprising silicon vias formed in and extending therethrough. The silicon interposer 16 may then be disposed over and coupled to a package substrate 18, with conductive or solder interconnects, bumps, or balls 17. The package substrate 18 may then be disposed over and coupled to a substrate 20, such as a graphics card or PCB with conductive or solder interconnects, bumps, or balls 22. The substrate or graphics card 20 may comprise a multi-layer PCB, and the conductive bumps may be used for: display connections, electrical current, as well as for peripheral component interconnect express (PCIe) interconnections or high-speed serial computer expansion bus connections.

Figure 1B:
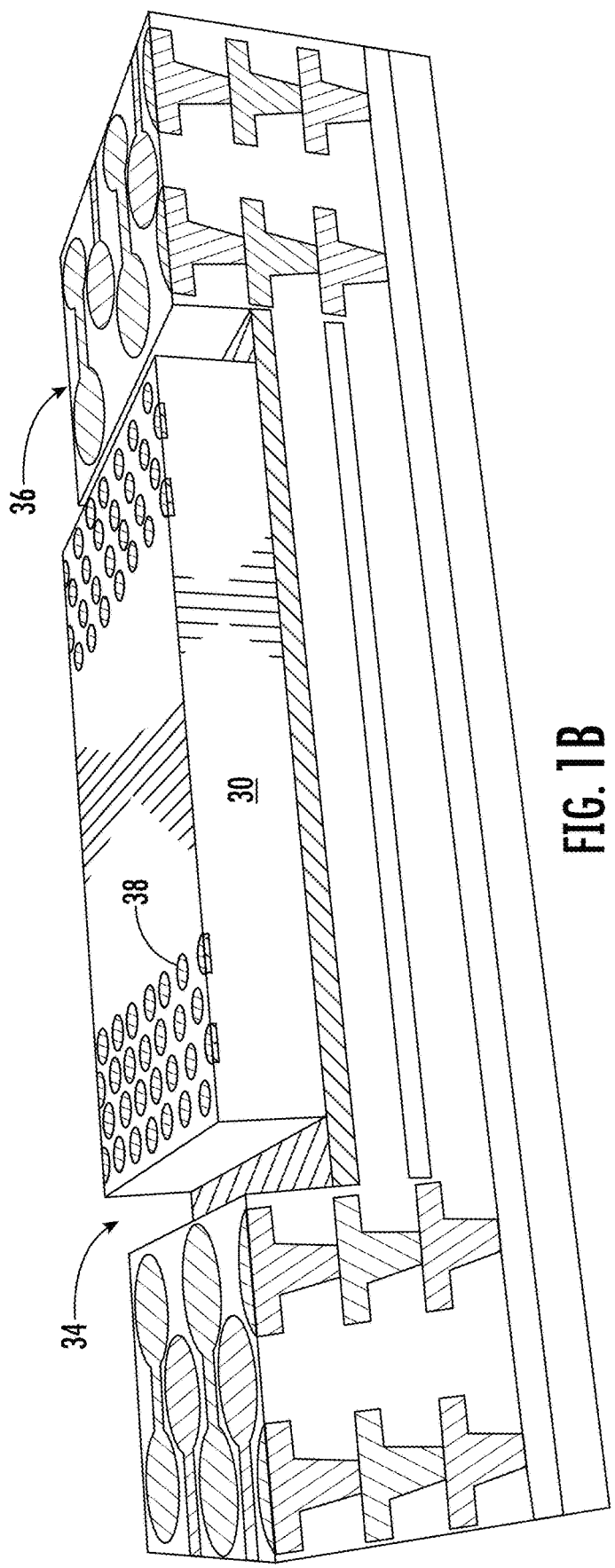
Figure 1C:
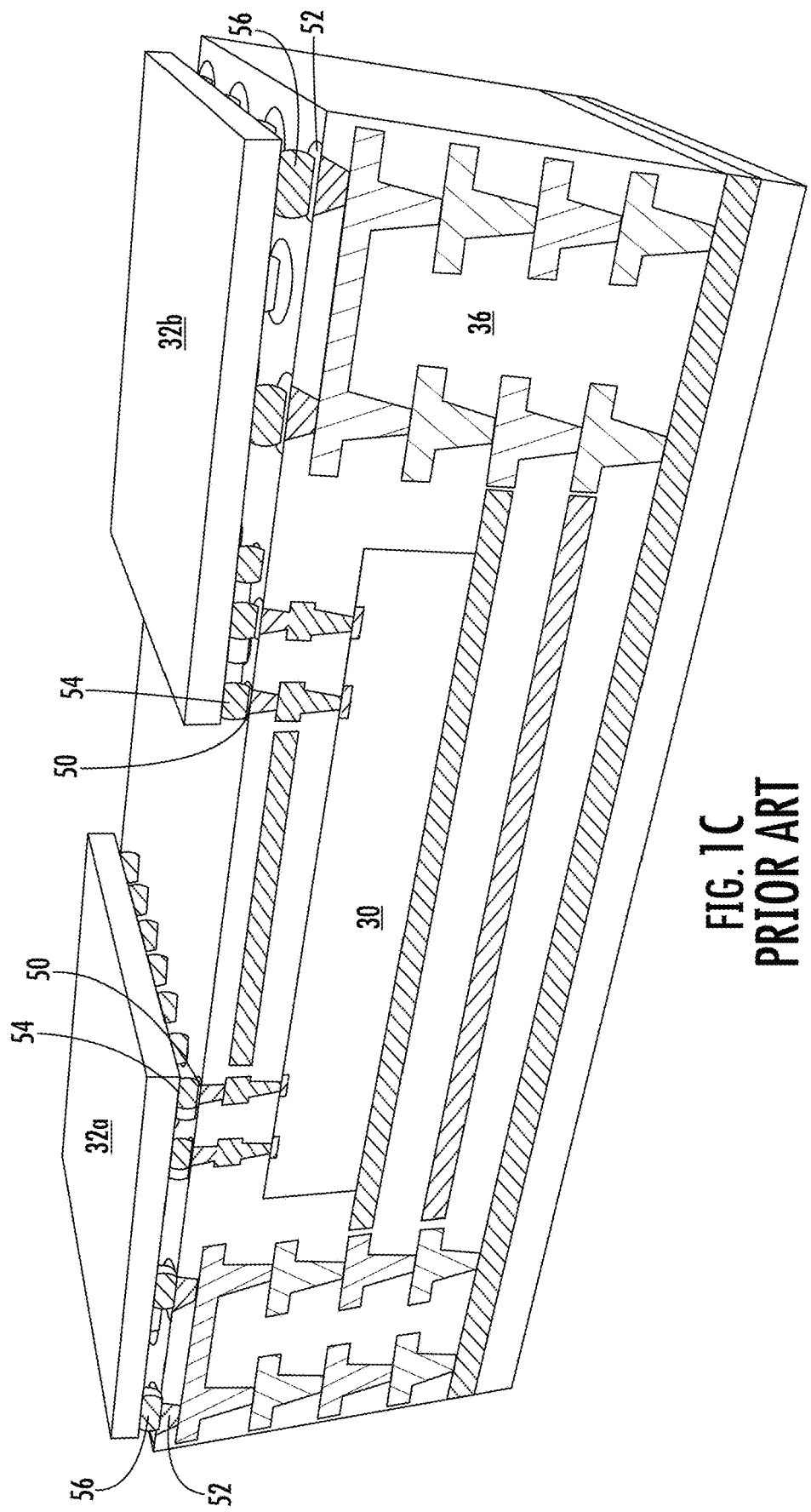

FIGS. 1B and 1C illustrate an existing technology of Intel's Embedded Multi-die Interconnect Bridge (EMIB) 30, that was developed to provide a cost-effective approach to in-package high density interconnect of chips or semiconductor die 32 and 32b, shown, e.g. in FIG. 1C. FIG. 1B illustrates the EMIB 30 embedded in a cavity 34 of an organic substrate 36, the EMIB 30 comprises conductive pads or contact pads 38 that may be coupled together with a conductive redistribution layer RDL.

FIG. 1C illustrates resin 42 formed over the EMIB 30, and vias 44 formed in, or extending through, the resin 42 with the vias 44 further coupled with the EMIB 30. RDLs 46 may be formed over the resin 42 and over the EMIB 30 and coupled with the vias 44 for lateral connection that extends from the EMIB 30 and vias 44 to mounting sites 48 for chips 32. Additional vias 44 and layers of resin 42 formed over the EMIB 30 with contact pads for microbumps 50 formed over the EMIB 30 and contact pads for ordinary bumps 52 formed at semiconductor die mounting sites 48. A first semiconductor die 32a on the left and a second semiconductor die 32b on the right, each mounted over respective semiconductor die sites 48 with microbumps 54 and ordinary bumps 56 and RDLs 46 and vias 44 for routing of signals and interconnections for the semiconductor die 32a, 32b being routed through the organic substrate 36 and through the EMIB 30.

Figure 2A:
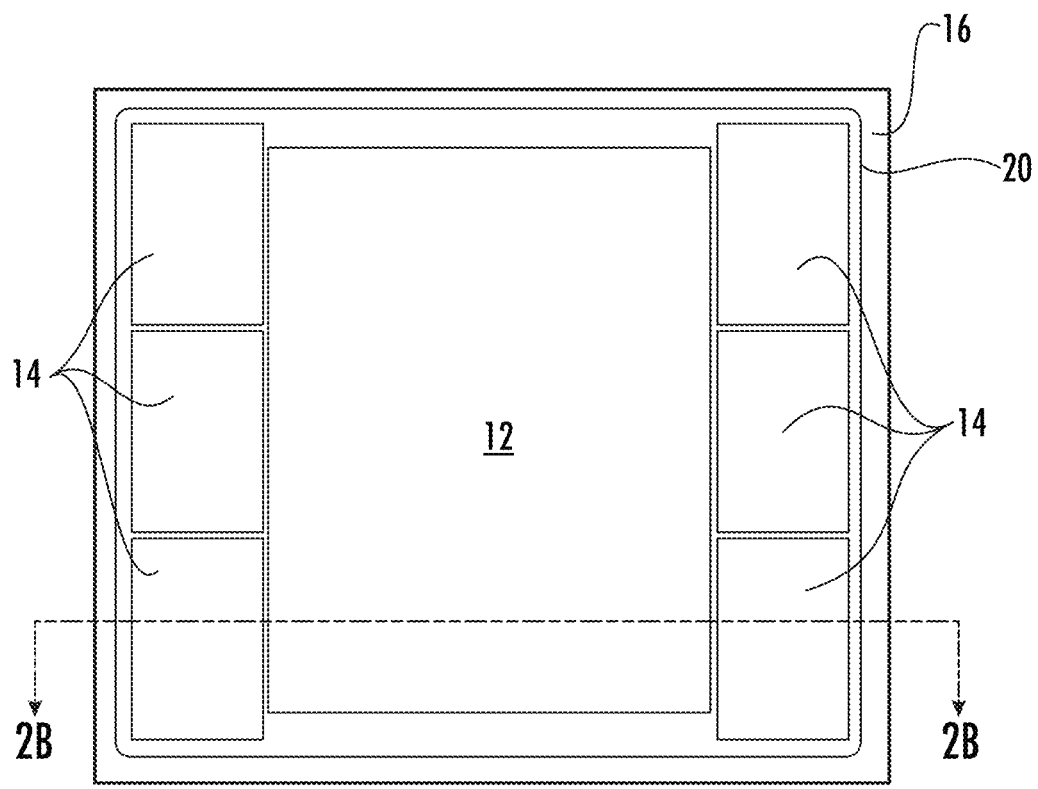
FIGS. 2A-2E illustrate various structures comprising interposers or embedded bridge die as known in the prior art.
Figure 2B:
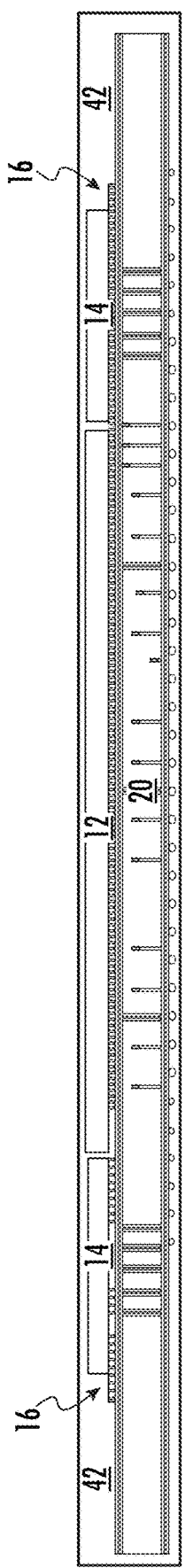

FIGS. 2A-2B illustrate an Nvidia A100 Ampere GPU, a plan view of which is illustrated in FIG. 2A and a cross-sectional side view is shown in FIG. 2B. As shown in FIG. 2A, the chiplet package comprises 6 HBM3 memory stacks 14 comprising 1 GPU die 12 included, which result in an overall size of about 43.1 mm×37.5 mm, which includes at least one silicon (Si) interposer 16, and a size of about 2× reticle size. The memory stacks 14, silicon interposer 16 and GPU die 12 may be mounted to a substrate or PCB 20 and surrounded by encapsulant or resin 42.

FIG. 2B illustrates a cross-sectional side view of the Nvidia A100 Ampere GPU taken along the section line 2B in FIG. 2A.

Figure 2C:
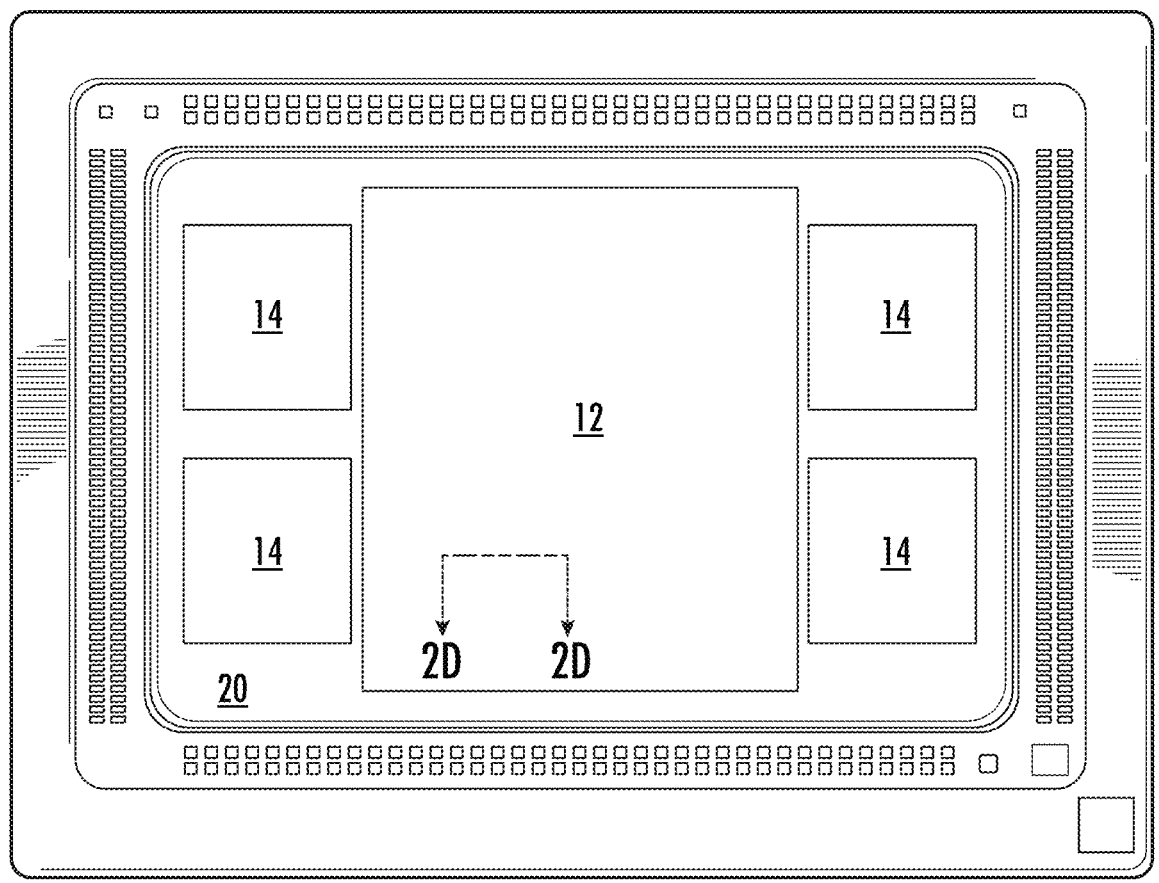
Figure 2D:
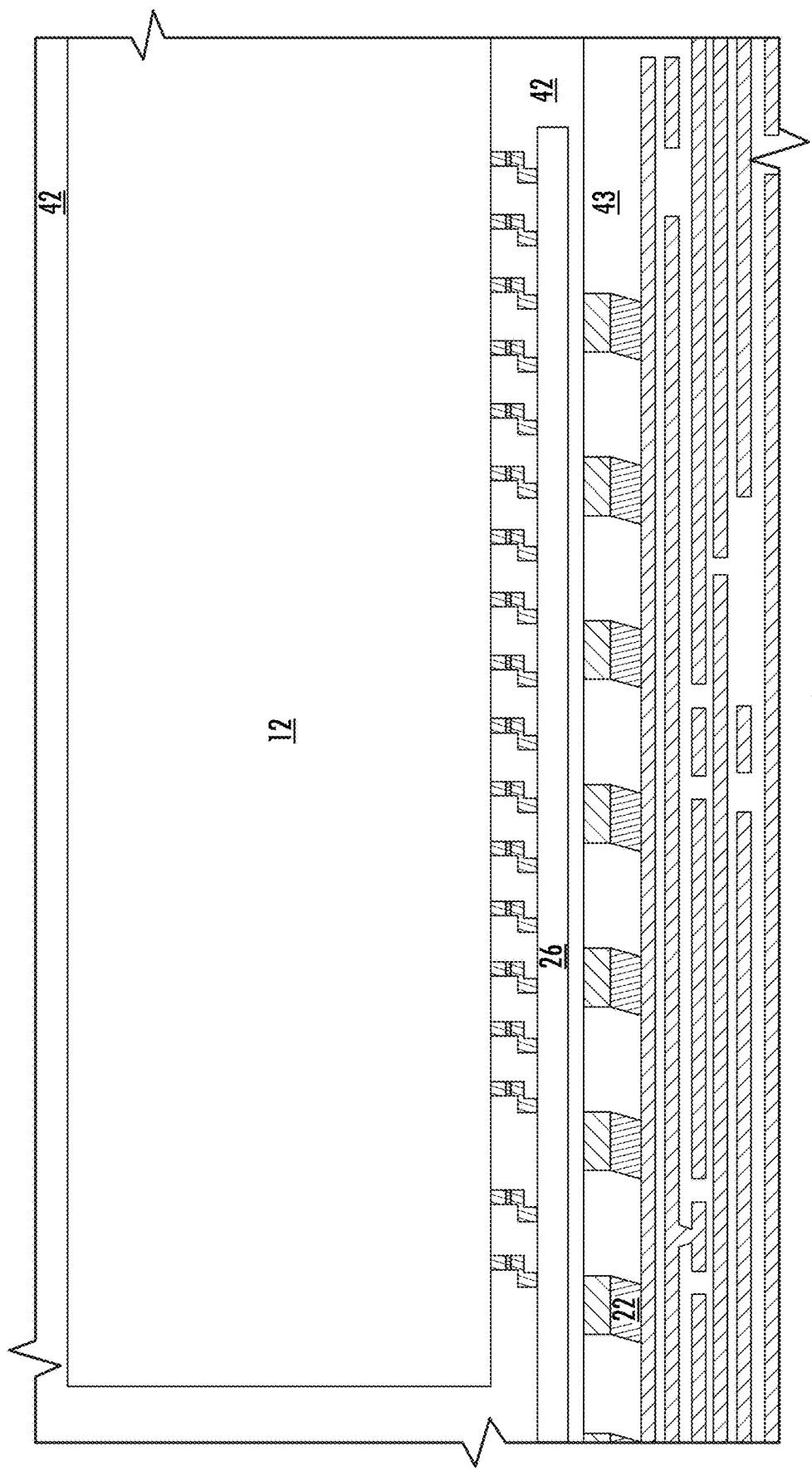

FIG. 2C illustrates a plan view of an AMD Instinct™ MI200 Series chiplet package, a cross-sectional side view of which is shown in FIG. 2D. The chiplet package comprises 4 HBM3 stacks and one GPU die, which result in an overall size of about 49 mm×43 mm, or about 2.5× reticle size.

FIG. 2D illustrates a cross-sectional side view of the MD Instinct™ MI200 Series chiplet package taken along the section line 2D in FIG. 2C, showing GPU 12 and bridge die 26 surrounded by encapsulant or resin 42 and second encapsulant 43.

Figure 2E:
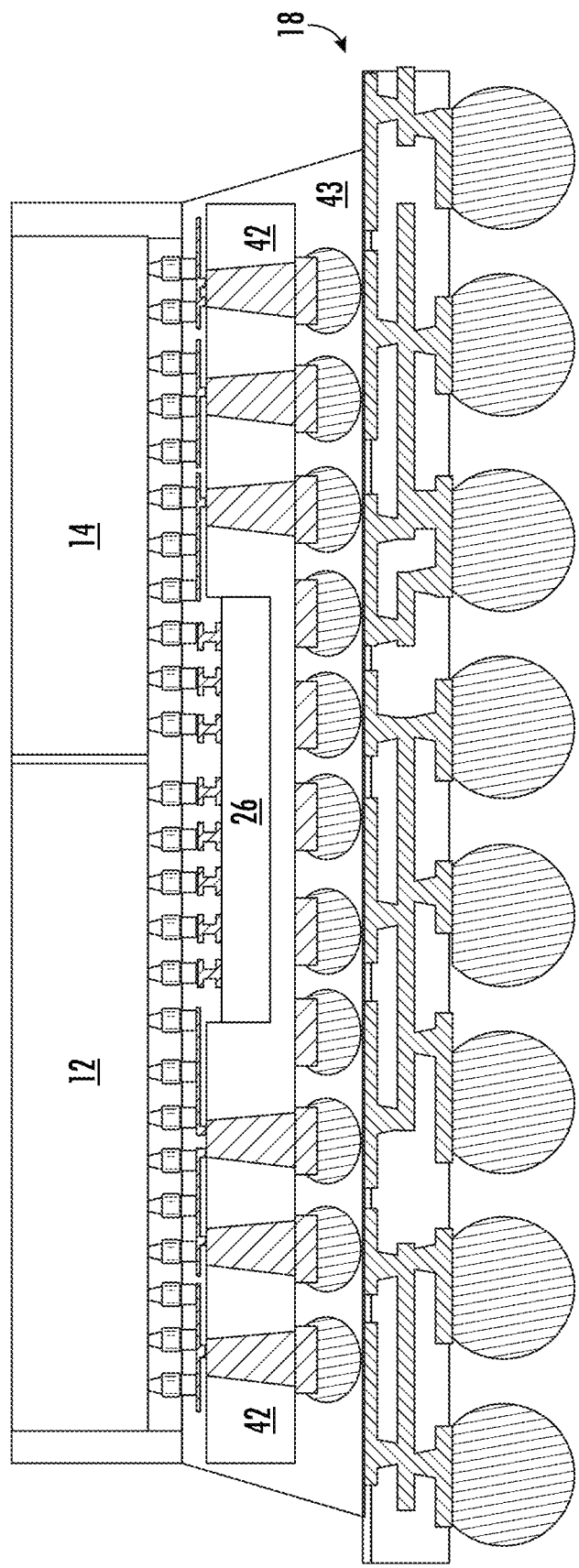

FIG. 2E illustrates a chiplet package comprising a molded interposer comprising a bridge die 26 surrounded by resin or encapsulant 42 disposed over substrate 18, as known in the prior art.

Figure 3A:
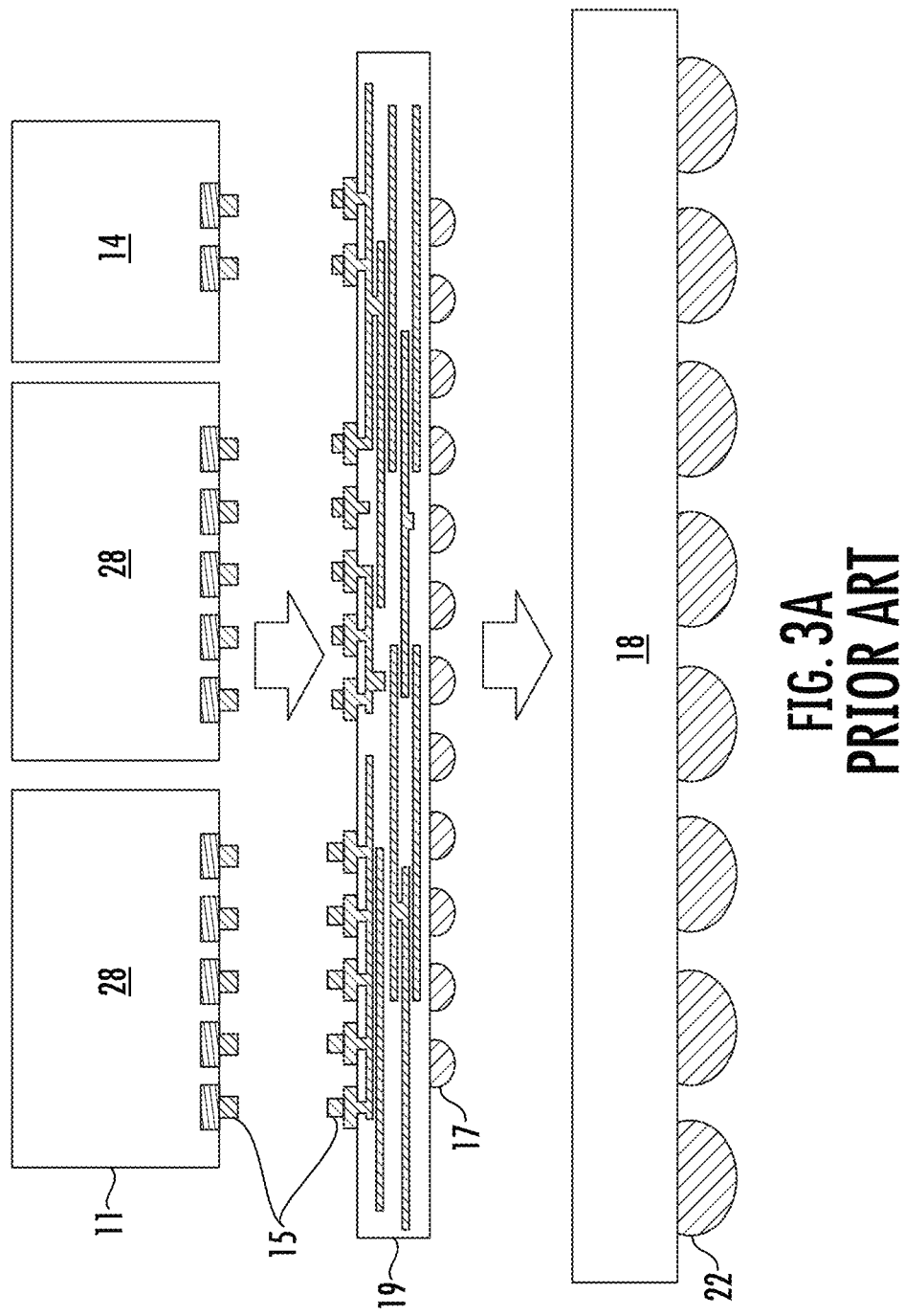
FIGS. 3A and 3B illustrate examples of CoWoS solutions as known in the prior art.

FIG. 3A illustrates an example of TSMC's CoWoS-R packaging that utilizes an RDL interposer 19 to serve as an interconnect through micro bumps 15 between chiplets or top chips 11, especially in HBM (High Bandwidth Memory) 14 and SoC 28 heterogeneous integration. The RDL interposer 19 is comprised of polymer and copper traces, and has been touted to have mechanical flexibility, which in some instances may introduce reliability problems and make construction difficult.

Figure 3B:
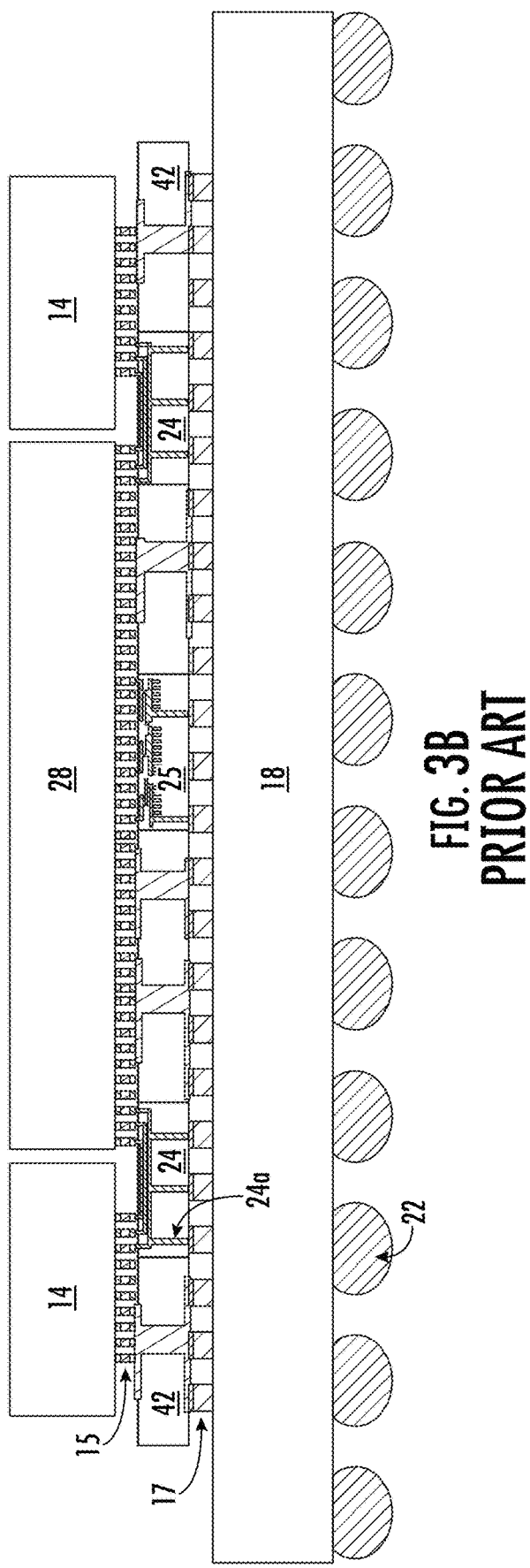

FIG. 3B illustrates an example of TSMC's CoWoS-L chip-last for multi-die integration. Local Silicon Interconnect (LSI) chips 24 enable high-density die-to-die connections between chips like SoCs 28 and HBMs 14 with varied routing architectures. A molding-based interposer with wide-pitch routing distribution layers on both sides and through-silicon vias 24a in LSI chips 24 provides power delivery and low-loss transmission of high-frequency signals. Integrated passive devices 25 can also be integrated directly underneath SoC dies 28 to optimize signal communication. By leveraging LSI for dense interconnects, an advanced interposer for power or signaling, and integrated passives for signal integrity, the CoWoS-L platform provides a flexible chip-last integration solution for complex multi-die packages requiring heterogeneous chip integration with optimized signaling.

Figure 4A:
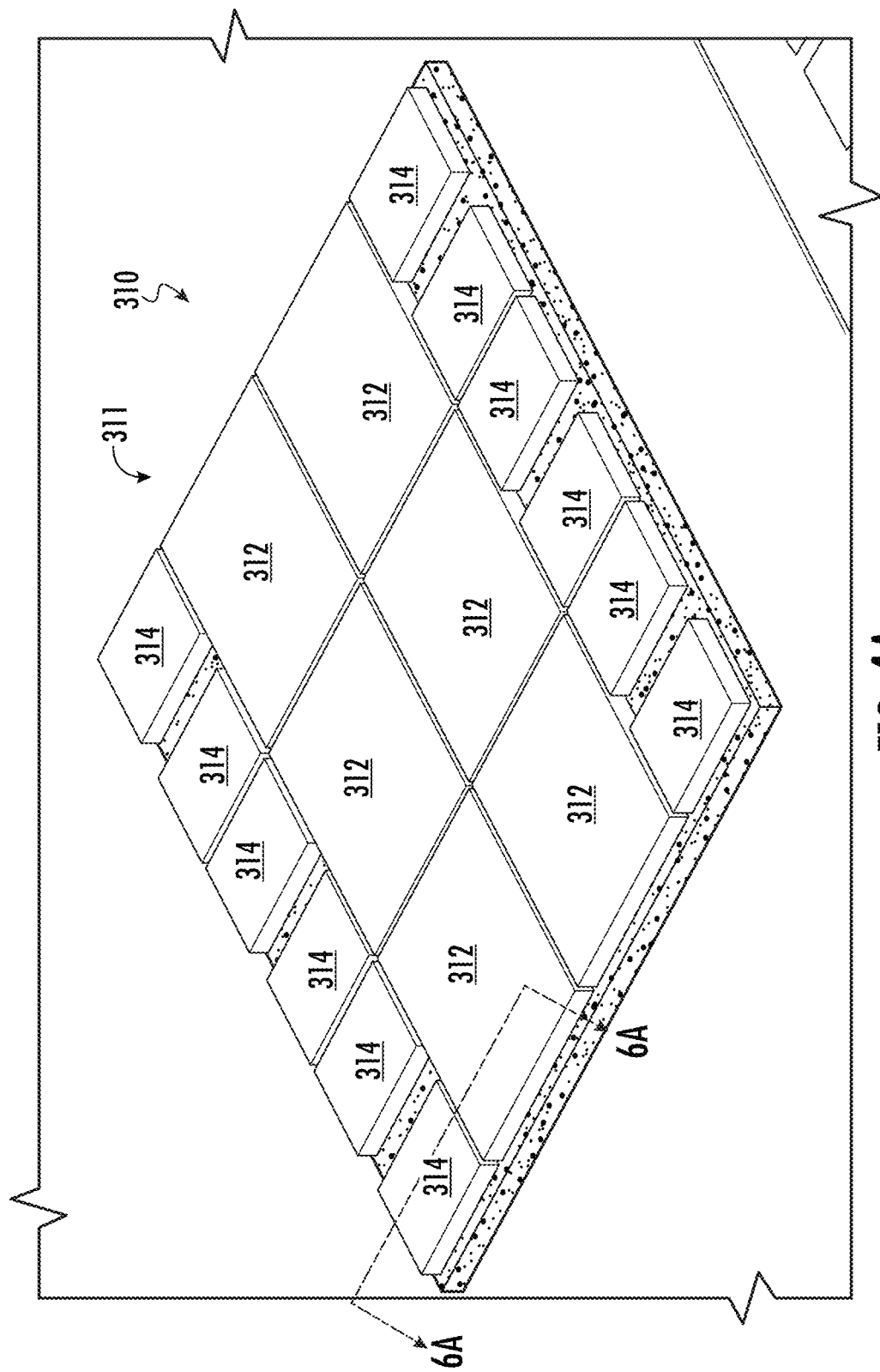
Figure 4B:
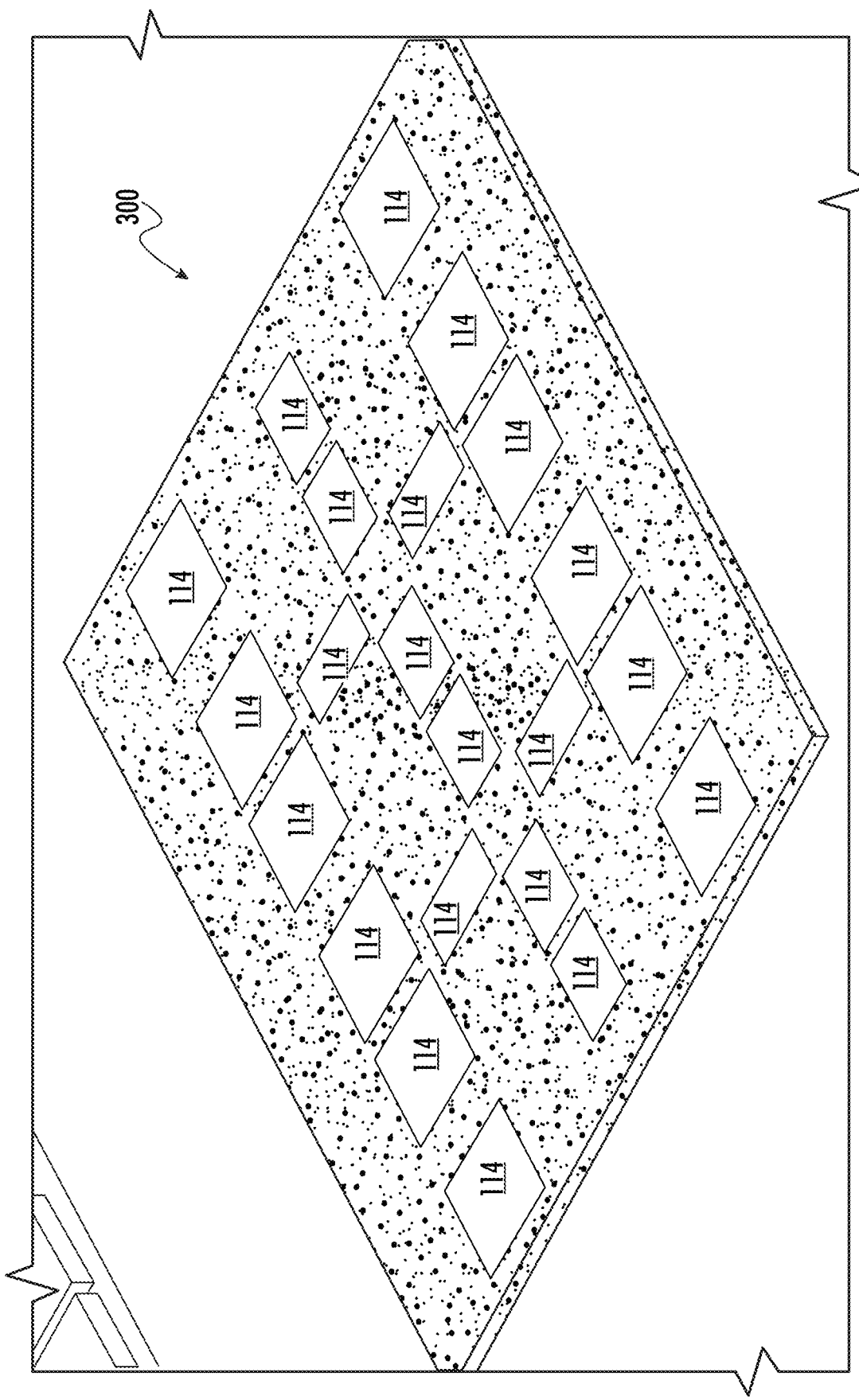

FIGS. 4A-4C illustrate various views of substrate or interposer 300, comprising a chiplet (or chip) arrangement 310 of multiple chips (or chiplets) 311. The chips or chiplets 311 may comprise one or more of a central processing unit (CPU), a modem, a graphics processing unit (GPU), chips, semiconductor die, or processors specialized for running artificial intelligence (AI) algorithms, an AI accelerator, AI processor, network processor, SOC, optical interface device, an application specific integrated circuit (ASIC), chips, semiconductor die or processors specialized for input-output (IO), Serializer-Deserializer (SERDES) devices, and various other memory devices such as chips or semiconductor die specialized for cache or storing data, and chips specialized for high bandwidth memory (HBM) or high-speed computer memory. As a non-limiting example, FIG. 4A illustrates an instance in which the chiplet arrangement 310 of the chips 311 comprise artificial intelligence (AI) processors or system on chip (SOC) 312 and high bandwidth memory (HBM) 314, which may be interconnected with embedded components 114 (such as bridge die) and molded together. The embedded components 114 comprise active devices, passive devices, interconnect structures, and molded structures comprising RDL disposed thereover. FIG. 4A illustrates a perspective view with the AI processor 312 and the HBM 314 exposed over the panel, molded panel, molded substrate, or molded bridge interposer panel 300.

FIG. 4B illustrates another view of an interposer or organic substrate 300, which differs from that of FIG. 4A, by showing a cut-away view of a lower portion of the interposer or organic substrate 300, with the embedded components 114 exposed on a molded bridge interposer panel 258.

FIG. 4C illustrates a list of features for an exemplary substrate 300, such as that illustrated in FIGS. 4A and 4B.

Figure 5:
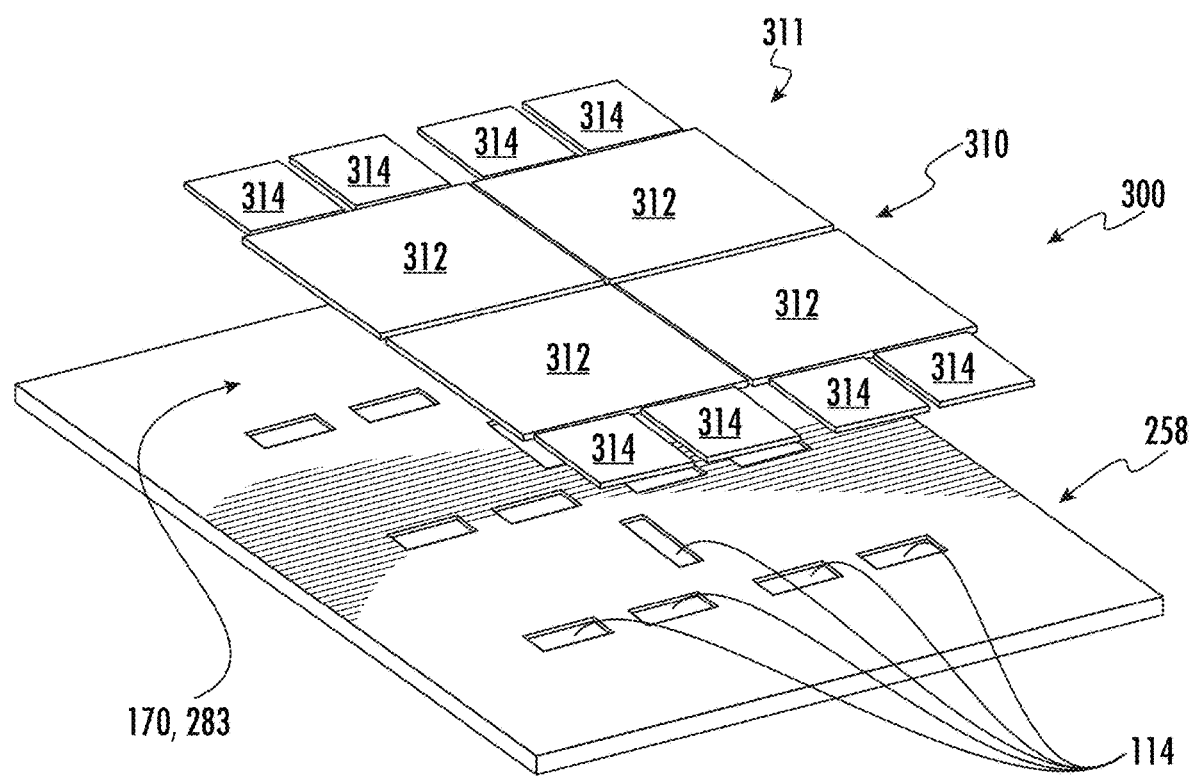
FIG. 5 illustrates another examples of an interposer with embedded components according to an aspect of the disclosure.

FIG. 5 illustrates an exploded view of the substrate 300, in which the chips 311 (comprising AI processor 312 and HBM 314) are shown in an elevated position to reveal the molded bridge interposer panel 258, comprising embedded components 114 (such as bridge die) below the chips 311. Between the layers of the embedded components 114 and the chips 311, the frontside interconnect layer 170 (comprising DCTs 283) may be formed on the interposer panel 258 to provide interconnection and to adjust for shift or movement of the embedded components 114 during molding.

Figure 6A:
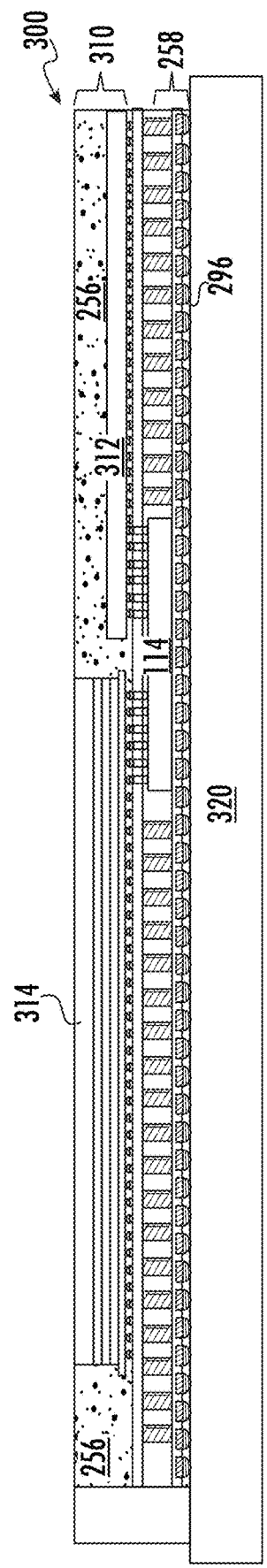
FIGS. 6A-6E illustrate other examples of an interposer with embedded components according to an aspect of the disclosure.

FIG. 6A-6E illustrates more detailed views of the interposer or substrate 300 with embedded components illustrated in FIGS. 4A-5. FIG. 6A illustrates a cross-sectional profile view of a substrate 300 or portion of substrate 300 comprising a chiplet arrangement 310 surrounded by encapsulant 256 coupled to the panel or molded bridge interposer panel 258 and interconnected by frontside interconnect structure 270 (as shown in FIG. 8G). According to some embodiments, the substrate or molded bridge interposer panel 258 may operate as an interposer and may be further mounted over a substrate, such as substrate 320. Frontside interconnect structure 270 comprises DCTs 283 and traces 274, formed as part of the conductive layer 274. Additional detail of the frontside interconnect 270 is included throughout the application, including at FIG. 8G. FIG. 6A also illustrates the substrate 300 may be coupled to, or disposed over (or on), a substrate or package substrate 320, which may be further coupled to, or mounted on, a motherboard, a printed circuit board (PCB), an interposer, or another semiconductor device or package. The method and device described herein may be advantageously used for applications in which the substrate 300 is mounted to another substrate or PCB 320 and may also be used for instances in which it is not mounted to a substrate, like for applications within a handheld mobile electronic device, such as a smartphone or other wearable technology.

The substrate 258 may operate as an interposer that is disposed between the chips 312, 314 mounted on one side of the substrate 300, and another substrate that is not the PCB or substrate 320 mounted on the other side. Alternatively, the substrate 300 may be directly mounted to the PCB 320, replacing any other intermediate or additional interposers, and acting as a replacement for an interposer, like silicon interposer 16 shown in FIG. 2B. As such, the substrate 300 described herein comprises both an interposer and a substrate within a package on its own.

Figure 6B:
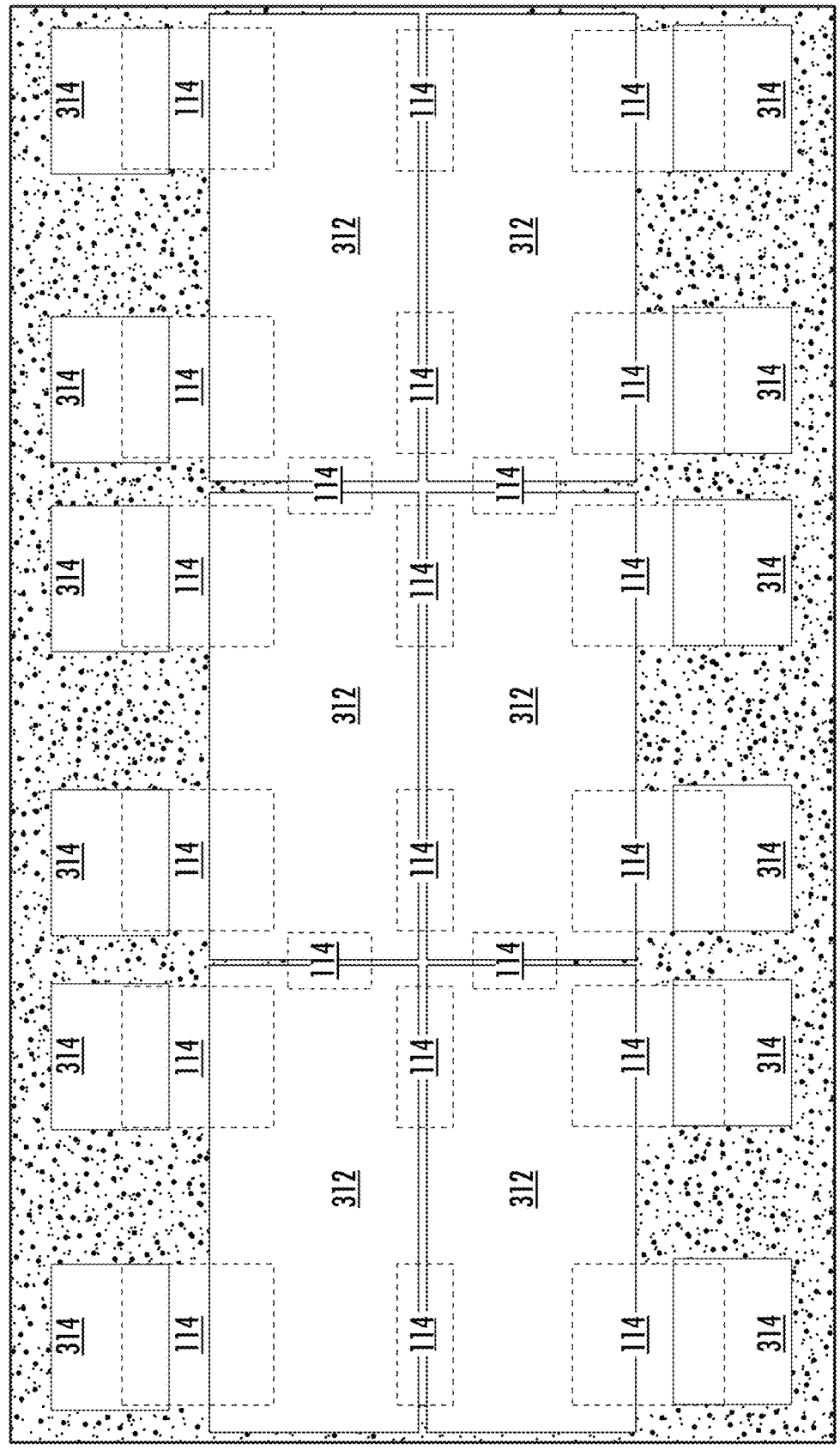

FIG. 6B illustrates a cut-away or transparent plan view of a substrate 300 with embedded components or bridge die 114, disposed between or connecting the chips 312 and 314, similar to what was shown in FIGS. 4A, 4B, and 6A.

Figure 6C:
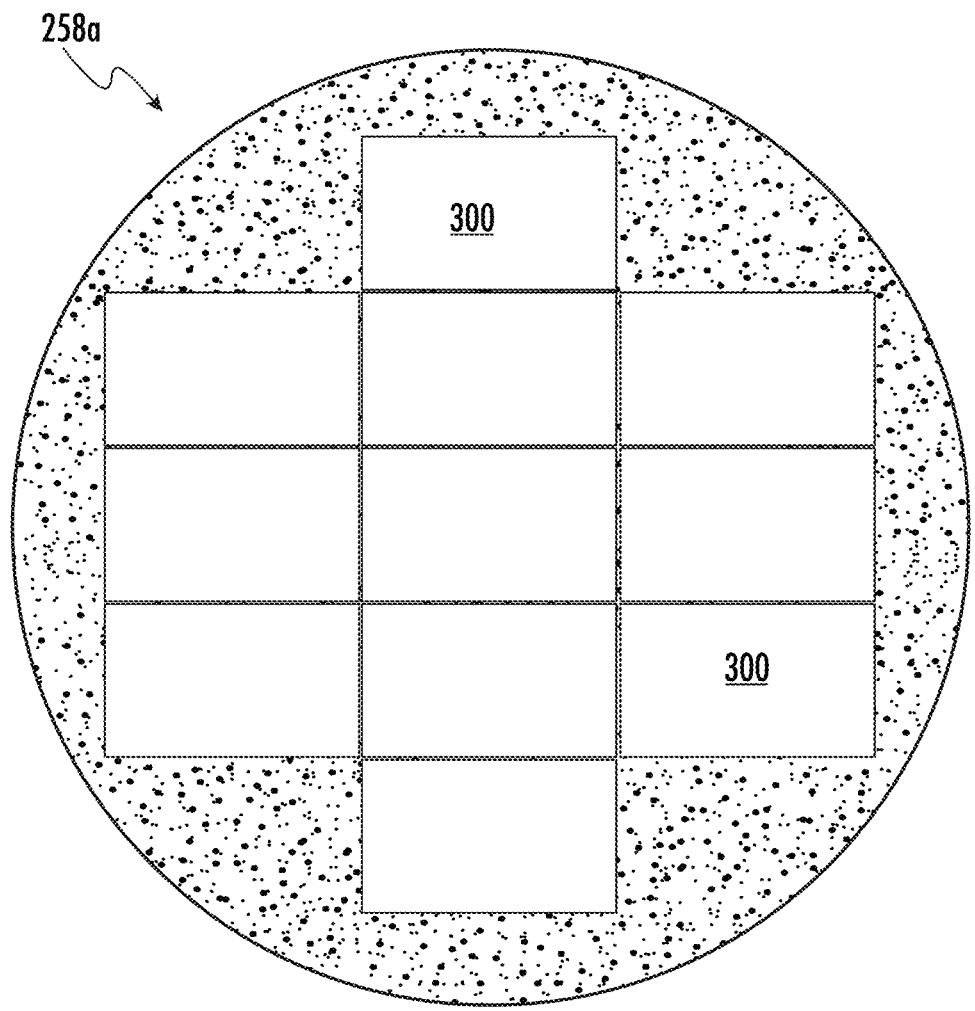

FIG. 6C illustrates an example of a number of substrates 300, such as that illustrated in FIG. 6B, formed as part of (or arranged over) a 300 mm wafer or molded panel 258a. FIG. 6C shows 11 substrates 300 of 48 mm×80 mm (as illustrated in FIG. 6B) may be formed on the wafer or molded panel 258a. As a result, 60% area efficiency is achieved, with 40% of the 300 mm round wafer 258a not being covered with substrates 300.

Figure 6D:
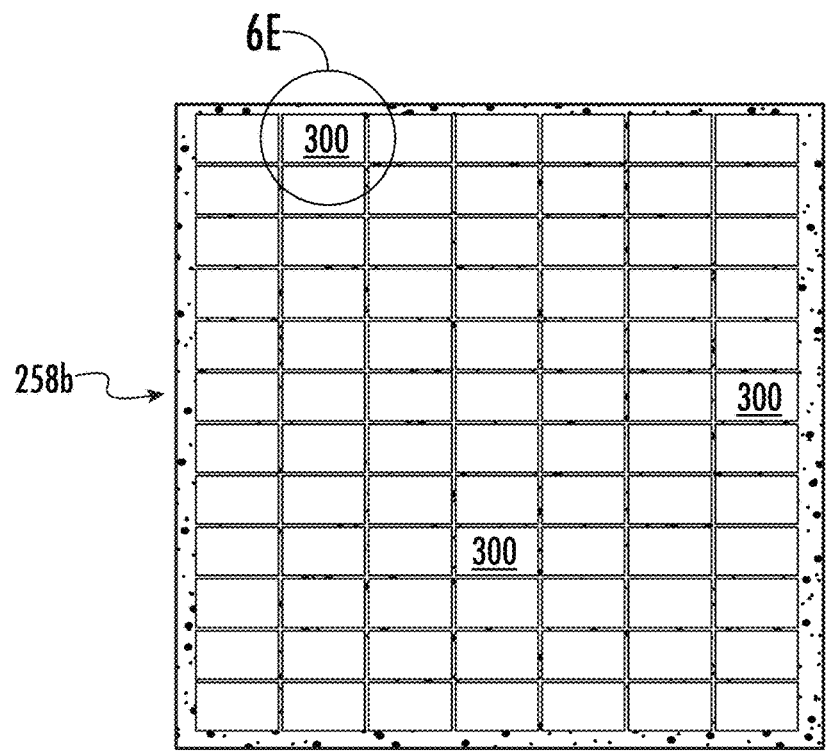
Figure 6E:
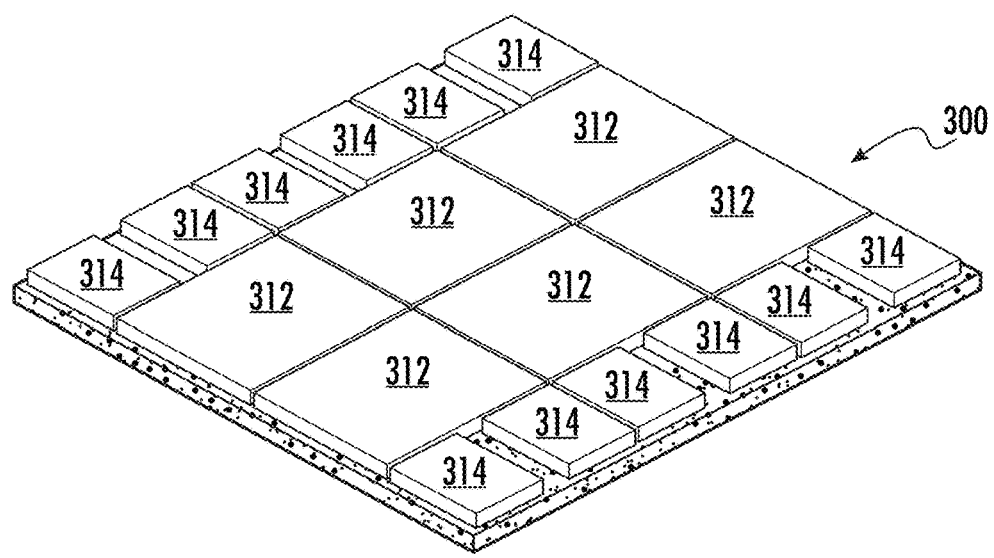

FIG. 6D illustrates a plan view of an example of a number of substrates 300, such as that illustrated in FIG. 6B, formed as part of a 600 mm square molded panel 258b, such that 84 substrates 300 may be formed on the molded panel 258b. As a result, 90% area efficiency is achieved. The larger 600 mm panel delivers a number of advantages with respect to the 300 mm round wafer shown in FIG. 6C. Advantages include a 500% increase in active area, an approximate 25% reduction in the cost of capital per unit output, an approximate 15% reduction in the cost of materials (higher utilization of polyimide (PI) and photo resist (PR)), and an approximate 20% overall cost reduction. The example illustrated in FIGS. 6D and 6E is a substrate 300 that may advantageously be used for AI applications, comprising a footprint or area of 80×48 mm, with a size 4.5 times a size of a reticle, making imaging and patterning using a stepper and standard lithography processes impractical or impossible, and at a significant disadvantage with respect to the new approach using DCTs 283 with unit specific patterning and Laser Direct Imaging (LDI). However, with the use of DCTs and unit specific pattering, the formation of substrates 300 becomes feasible and practical.

FIG. 6E shows a detailed perspective view of substrate 300 as shown in FIG. 6D. In some embodiments, substrate 300 may comprise six AI processors 312, and twelve HBMs 314 as part of the 600 mm, molded panel 258b. While the substrate 300 is shown comprising six AI processors 312, and twelve HBMs 314, a person of ordinary skill in the art (POSA) will appreciate that fewer or more AI processors 312 and/or HBMs 314 can be used depending on the configuration and design of the substrate 300.

Figure 7A:
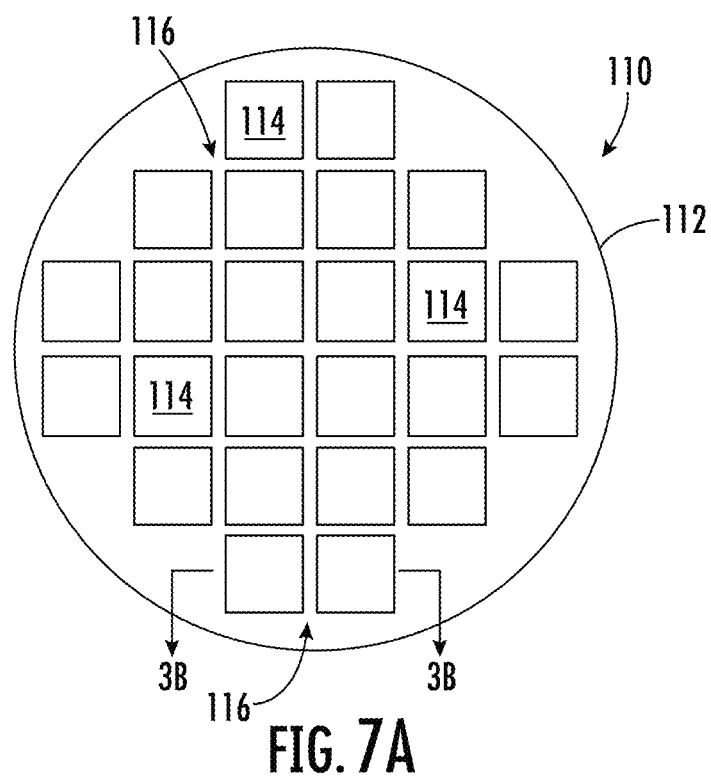
FIGS. 7A-7C illustrate components or bridge die comprising electrical interconnects being singulated from a native wafer.
Figure 7B:
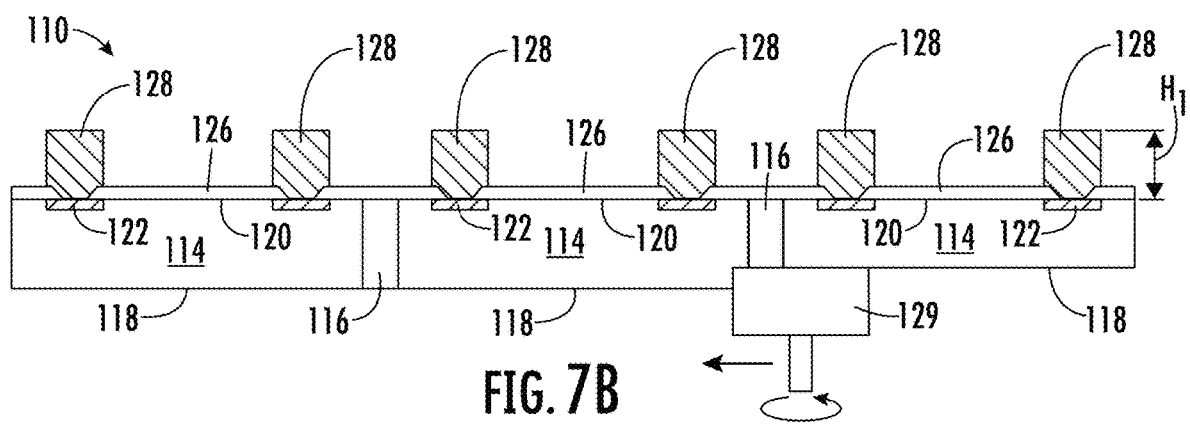
Figure 7C:
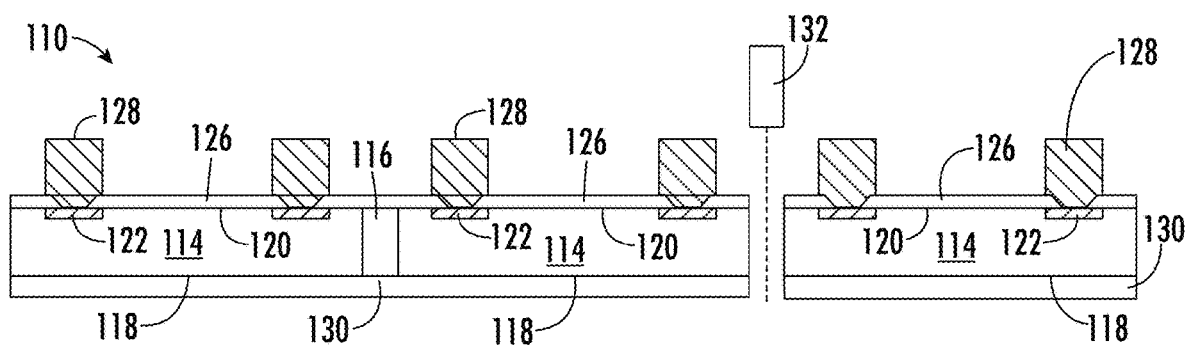

FIGS. 7A-7C illustrate various views of components 114 that are included within substrates 300, and their inclusion within semiconductor wafer 110 and the formation and separation of individual components, semiconductor die, chips, embedded devices, or bridge die 114 therefrom. FIG. 7A illustrates a plan view of a semiconductor wafer or native wafer 110 with a base substrate material 112, such as, without limitation, silicon, germanium, gallium arsenide, indium phosphide, or silicon carbide, for structural support. A plurality of semiconductor die or components 114 can be formed on wafer 110 separated by a non-active, inter-die wafer area or saw street 116 as described above. The saw street 116 can provide cutting areas to singulate the semiconductor wafer 110 into the individual components 114.

Each component 114 may comprise a backside or back surface 118 and an active surface 120 opposite the backside 118. The active surface 120 may contain analog or digital circuits implemented as active devices, passive devices, conductive layers, and dielectric layers formed within the die and electrically interconnected according to the electrical design and function of the components 114. For example, the circuit may include one or more transistors, diodes, and other circuit elements formed within active surface to implement analog circuits or digital circuits, such as DSP, ASIC, memory, or other signal processing circuits. The components 114 may also contain IPDs such as inductors, capacitors, and resistors, such as for power management, RF signal processing, and clocking or other functions. The components 114 may be formed on a native wafer in a wafer level process as one of many packages being formed simultaneously on a carrier. In other instances, the components 114 may be formed as part of a reconstituted wafer and may comprise multiple die molded together. The components 114 may also be another suitable embedded device, which is subsequently formed within an interposer with embedded components 300 and surrounded (partially or entirely) by encapsulant 256. The components 114 within the interposer with embedded components 300 may be an active die, a bridge die, and in other instances may be formed without an active surface, and with copper studs or conductive interconnects 128 of the bridge die electrically connected or coupled with wiring, routing, or RDLs.

FIG. 7B. illustrates a cross sectional sideview of the wafer 110, as shown taken along the section line 7B-7B in FIG. 7A.

FIG. 7B also illustrates an optional dielectric, insulating. or passivation layer 126 conformally applied over the active surface 120 and over conductive layer or component contacts 122. Insulating layer 126 can include one or more layers that are applied using PVD, CVD, screen printing, spin coating, spray coating, sintering, thermal oxidation, or other suitable process. Insulating layer 126 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, components 114 are packaged without the use of any PBO layers, and insulating layer 126 can be formed of a different material or omitted entirely. In another embodiment, insulating layer 126 includes a passivation layer formed over the active surface 120 without being disposed over conductive layer 122. When insulating layer 126 is present and formed over conductive layer 122, openings are formed completely through insulating layer 126 to expose at least a portion of conductive layer 122 for subsequent mechanical and electrical interconnection. Alternatively, when insulating layer 126 is omitted, conductive layer 122 is exposed for subsequent electrical interconnection without the formation of openings.

FIG. 7B also illustrates conductive bumps, conductive interconnects, conductive studs or electrical interconnect structures 128 that can be formed as columns, pillars, posts, thick RDLs, bumps, or studs that are formed of copper or other suitable conductive material. The electrical interconnect structures 128 are disposed over, and coupled or connected to, conductive layer 122. In some embodiments, conductive layer 122 or component contacts may comprise contact pads 122. When formed as posts 128, the posts will have a height greater than a thickness, whereas a pillar has a tin cap and a stud is wider than it is tall. Conductive studs 128 can be formed directly on conductive layer 122 using patterning and metal deposition processes such as printing, PVD, CVD, sputtering, electrolytic plating, electroless plating, metal evaporation, metal sputtering, or other suitable metal deposition process. Conductive studs 128 can be one or more layers of Al, Cu, Sn, Ni, Au, Ag, palladium (Pd), or other suitable electrically conductive material and can include one or more layers. In some instances, one or more UBM layers comprising one or more layer of any suitable barrier or seed material, comprising Al, Cu, Sn, Ni, Au, Ag, Pd, or other suitable electrically conductive material can optionally be disposed between conductive layer 122 and conductive studs 128. In some embodiments, conductive studs 128 can be formed by depositing a photoresist layer over the components 114 and conductive layer 122 while the components 114 are part of the semiconductor wafer 110. A portion of the photoresist layer can be exposed and removed by a development process, and the conductive studs 128 can be formed as copper pillars in the removed portion of the photoresist and over conductive layer 122 using a selective plating process. The photoresist layer can be removed leaving conductive studs 128 that provide for subsequent mechanical and electrical interconnection and a standoff with respect to active surface 120. Conductive studs 128 can include a height H1 in a range of 5-100 micrometers (μm) or a height in a range of 20-50 μm, or a height of about 25 μm.

FIG. 7B also illustrates the semiconductor wafer 110 can undergo an optional grinding operation with a grinder 129 to planarize the surface and reduce a thickness of the semiconductor wafer 110. A chemical etch or a plasma etch can also be used to remove and planarize a portion of the semiconductor wafer 110.

FIG. 7C illustrates attaching a die attach film (DAF) 130 to the semiconductor wafer 110 that can be disposed over, and in direct contact with, the backsides 118 of the components 114. The DAF 130 can comprise epoxy, thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, epoxy resin with organic filler, silica filler, or polymer filler, acrylate based adhesive, epoxy-acrylate adhesive, a polyimide (PI) based adhesive, or other adhesive material.

FIG. 7C also illustrates semiconductor wafer 110 can be singulated through gaps or saw streets 116 using one or more of laser grooving, a saw blade, a laser cutting tool, plasma dicing, or other suitable process or too signified by element 132, to singulate the semiconductor wafer 110 into individual components 114 with conductive studs 128. The components 114 can then be used as part of a subsequently formed semiconductor component package as discussed in greater detail below with respect to FIGS. 8A-8O.

Figure 8A:
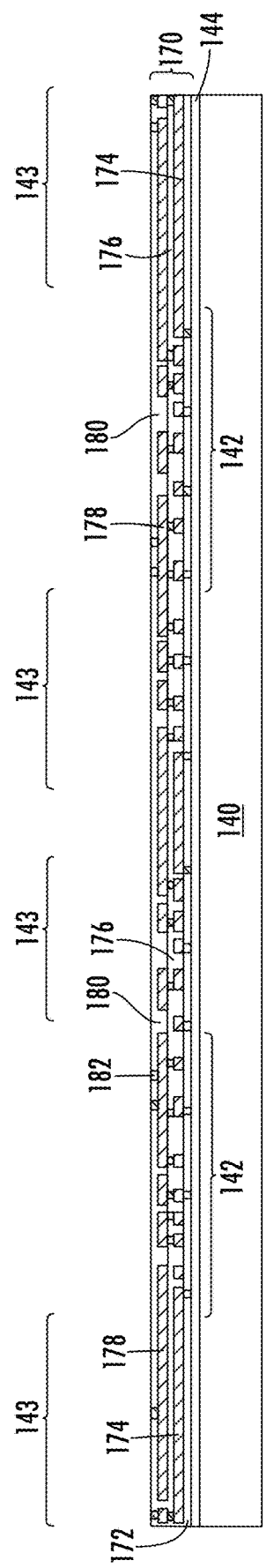
FIGS. 8A-8P illustrate the formation of fully molded substrate or interposer comprising the components of FIGS. 7A-7C.

FIGS. 8A-8O, illustrate a structure, method, process flow for forming the semiconductor device or molded bridge interposer that may comprise a bridge die and peripheral posts. FIG. 8A illustrates providing a temporary carrier or substrate 140, on which subsequent processing of the fully-molded bridge substrate 300 can occur, as described in greater detail herein. Carrier 140 may be a temporary or sacrificial carrier or substrate, and in other instances may be or a reusable carrier or substrate. The carrier 140 may be of any desirable or suitable size, including a circular shape comprising a diameter of 300 mm.

The carrier 140 can contain one or more base materials formed in one or more layers, which may comprise base materials such as metal, silicon, polymer, polymer composite, ceramic, perforated ceramic, glass, glass epoxy, stainless steel, mold compound, mold compound with filler, or other suitable low-cost, rigid material or bulk semiconductor material for structural support. When a UV release is used with a temporary carrier 140, the carrier 140 may comprise one or more transparent or translucent materials, such as glass. When a thermal release is used with a temporary carrier 140, the carrier 140 may comprise opaque materials. The carrier 140 can be circular, square, rectangular, or other suitable or desirable shape and can include any desirable size, such as a size equal to, similar to, or slightly larger or smaller than a reconstituted wafer or panel that is subsequently formed on or over the carrier 140. In some instances, a diameter, length, or width of the temporary carrier can be equal to, or about, 200 millimeters (mm), 300 mm, or more.

The carrier 140 can comprise a plurality of semiconductor die mounting sites or die attach areas 142 spaced or disposed across a surface of the carrier 140, according to a design and configuration of the final substrate 300, which may comprise fully-molded bridge interposer semiconductor devices, to provide a peripheral area or space 143. The peripheral area 143 can partially or completely surround the die attach areas 142 to provide space for subsequent vertical, through package interconnections, and an area for fan-out routing or build-up interconnect structures. For example, the peripheral area 143 can surround, or be offset from, one side of the components 114, or more than one side of the components 114, such as 2, 3, 4, or more sides of the components 114.

When a temporary carrier 140 is used, an optional release layer, interface layer or double-sided tape 144 can be formed over carrier 140 as a temporary adhesive bonding film or etch-stop layer. The release layer 144 may be a film or laminate, and may also be applied by spin coating or other suitable process. The temporary carrier can be subsequently removed by strip etching, chemical etching, mechanical peel-off, CMP, plasma etching, thermal, light releasing process, mechanical grinding, thermal bake, laser scanning, UV light, or wet stripping.

FIG. 8A further illustrates forming a build-up interconnect structure or backside build-up interconnect structure 170 over the carrier 140 to electrically connect, and provide routing between, conductive interconnects 252, the conductive studs 128, and other device mounted on, or coupled with, the substrate 300, which may comprise a fully-molded bridge substrate or interposer. While the build-up interconnect structure 170 is shown comprising three conductive layers and three insulating layer, a POSA will appreciate that fewer layers or more layers can be used depending on the configuration and design of the substrate 300. The build-up interconnect structure 170 can optionally comprise a first insulating, dielectric, or passivation layer 172 formed or disposed over the carrier 140. The first insulating layer 172 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 172 can be formed using PVD, CVD, printing, spin coating, spray coating, sintering or thermal oxidation. Openings or first level conductive vias can be formed through the insulating layer 172 for subsequent interconnection with bumps 296.

A first conductive layer 174 can be formed over the substrate 140 and over the first insulating layer 172 as a first RDL layer to extend through the openings in the first insulating layer 172, to electrically connect with the first level conductive vias, and to electrically connect with the conductive studs 128 and the conductive interconnects 252. Conductive layer 174 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating, dielectric, or passivation layer 176, which can be similar or identical to the first insulating layer 172, can be disposed or formed over the substrate 140, the first conductive layer 174, and the first insulating layer 172. An opening or second level conductive via can be formed through the second insulating layer 176 to connect with the first conductive layer 174.

A second conductive layer 178, when desirable and when present, may be similar or identical to the first conductive layer 174, can be formed as a second RDL layer over substrate 140, over the first insulating layer 172, over the first conductive layer 174, over the second level conductive via, or within an opening of the second insulating layer 172, to electrically connect with the first conductive layer 174, the first level and second level conductive vias, and the components 114.

A third insulating or passivation layer 180, when desirable and when present, may be similar or identical to the first insulating layer 172, can be disposed or formed over the second conductive layer 178 and the second insulating layer 176. An opening or a third level conductive via can also be formed in or through the third insulating layer 280 to connect with the second conductive layer 178.

A third conductive layer 182, when desirable and when present, may be formed as vias or vertical interconnects through the third insulating layer 180—and further disposed over the second insulating layer 176, over the second conductive layer 178, over the second level conductive via, or within an opening of the second insulating layer 176, to electrically connect with the second conductive layer 178, and the components 114. In other instances, the third conductive layer 182 may be formed not only as vias, but may also further comprise a third RDL layer (not shown) similar or identical to the second conductive layer 178. A POSA will appreciate that the interconnect structure 170 can comprise and desired number of conductive layer layers.

Figure 8B:
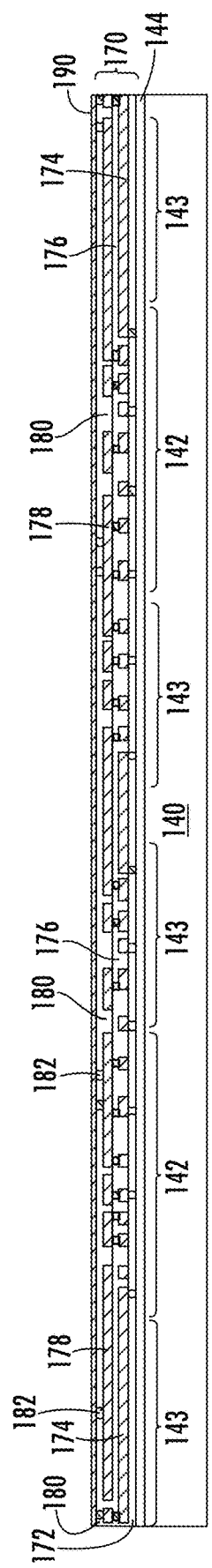

FIG. 8B further illustrates forming a seed layer 190 over the build-up interconnect structure 170. The seed layer 190 can be one or more layers of Al, Cu, Sn, Ni, Au, Ag, Titanium (Ti), Tungsten (W), Tantalum (Ta) or other suitable electrically conductive material. In some instances, the seed layer 190 will be, or may include, Ti—Cu, TiW—Cu, W—Cu, or a coupling agent-Cu. The formation, placement, or deposition of the seed layer 190 can be with PVD, CVD, electrolytic plating, electroless plating, or other suitable process. The seed layer 190 can be deposited by sputtering, electroless plating, or by depositing laminated foil, such as Cu foil, combined with electroless plating.

Figure 8C:
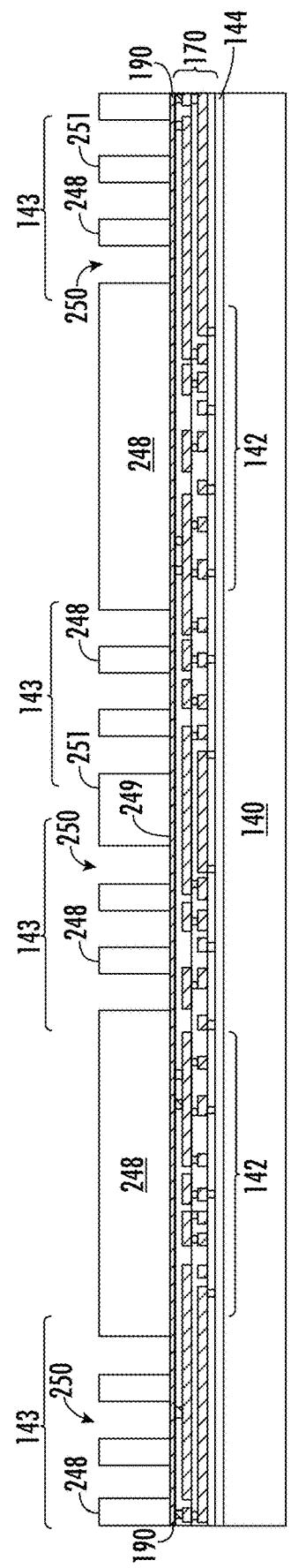

FIG. 8C illustrates forming or depositing a resist layer or photosensitive layer 248 over and directly contacting seed layer 190, over build-up interconnect structure 170, and over the temporary carrier 140. After formation of the resist layer 248 over the temporary carrier, the resist layer 248 can then be exposed and developed to form openings 250 in the resist layer 248. In some instances, more than one photoresist layer 248 may be used. Openings 250 may be formed in the photoresist 248, and can be positioned over, or within a footprint of, the peripheral area 143 of the carrier 140. The openings 250 can extend completely through the resist layer 248, such as from a first surface or bottom surface 249 of the resist layer 248 to second surface or top surface 251 of the resist layer 248 opposite the first surface 249. An After Development Inspection (ADI) of the developed resist layer 248 and the openings 250 can be performed to detect the condition or quality of the openings 250. After the ADI of resist layer 248 and openings 250, a descum operation can be performed on the developed resist layer 248.

FIG. 8D shows an opening in the photoresist defining a footprint formed according to the semiconductor die mounting sites or die attach areas 142, as well as the formation of a plurality of conductive interconnects 252 that were formed within the openings 250 in resist layer 248 of FIG. 8C. In some embodiments, die mounting sites 142 may be formed to be larger than an actual position, 142a of the embedded component 114 (depicted in FIG. 8F, 8L), and also larger than a nominal position, 142n, (as seen in FIG. 8D), to account for shifts or changes between the actual position 142a and the nominal position 142n, of the embedded component 114. According to some embodiments, the plurality of vertical conductive interconnects 252 as shown in FIG. 8D may be formed in a periphery 143 of the component 114, as seen in FIGS. 8A and 8C. The conductive interconnects 252 can be formed as columns, pillars, posts, bumps, or studs that are formed of copper or other suitable conductive material. Conductive interconnects 252 can be formed using patterning and metal deposition processes such as printing, PVD, CVD, sputtering, electrolytic plating, electroless plating, metal evaporation, metal sputtering, or other suitable metal deposition process. When conductive interconnects 252 are formed by plating, the seed layer 190 can be used as part of the plating process. Conductive interconnects of posts 252 can be one or more layers of Al, Cu, Sn, Ni, Au, Ag, Pd, solder, or other suitable electrically conductive material and can include one or more layers. In other instances, the conductive interconnects 252 may be formed as a 3D Block or a Molded Interconnect Block™ (MIB™) as disclosed, e.g., in US Provisional Patent Application No. 63/435,185, Titled "Semiconductor Assembly Comprising a 3D Block and Method of Making the Same," filed Dec. 23, 2022, the entirety of which is hereby incorporated herein.

After formation of the conductive interconnects 252, the resist layer 248 when present, can be removed, such as by a stripping process, leaving conductive interconnects 252 in the peripheral area 143 around the semiconductor die mounting sites 142 to provide for subsequent vertical or three dimensional (3D) electrical interconnection for the substrate 300. Conductive interconnects 252 can include a height H2 in a range of 80-300 µm or a height in a range of 100-150 µm, or a height thereabout. In other instances, conductive vertical interconnects 252 may include a height in a range of 10-600 µm, 60-100 µm, 70-90 µm, or about, 80 µm. As used herein, "thereabout," "about," or "substantially" means a percent difference in a range of 0-5%, 1-10%, 1-20%, 1-30%, or 1-50% of the number or range indicated.

After removal of the resist layer 248, the semiconductor die mounting sites 142 on or over the temporary carrier 140, the build-up interconnect structure 170, or both, can be exposed and ready to receive the components 114. The orientation of components 114 can be either face up with active surface 120 oriented away from the temporary carrier 140 to which the components 114 are mounted, or alternatively can be mounted face down with the active surface 120 oriented toward the temporary carrier 140 to which the components 114 are mounted. After mounting the components 114 to the temporary carrier 140 in a face up orientation, the DAF 130 can undergo a curing process to cure the DAF 130 and to lock the components 114 in place to the build-up interconnect structure 70 and over the temporary carrier 140. According to some embodiments, the DAF 130 being first formed on the backside 118 of component 114 may be optional, and another adhesive or attachment method may be placed over the carrier or over the build-up interconnect structure 170.

Figure 8E:
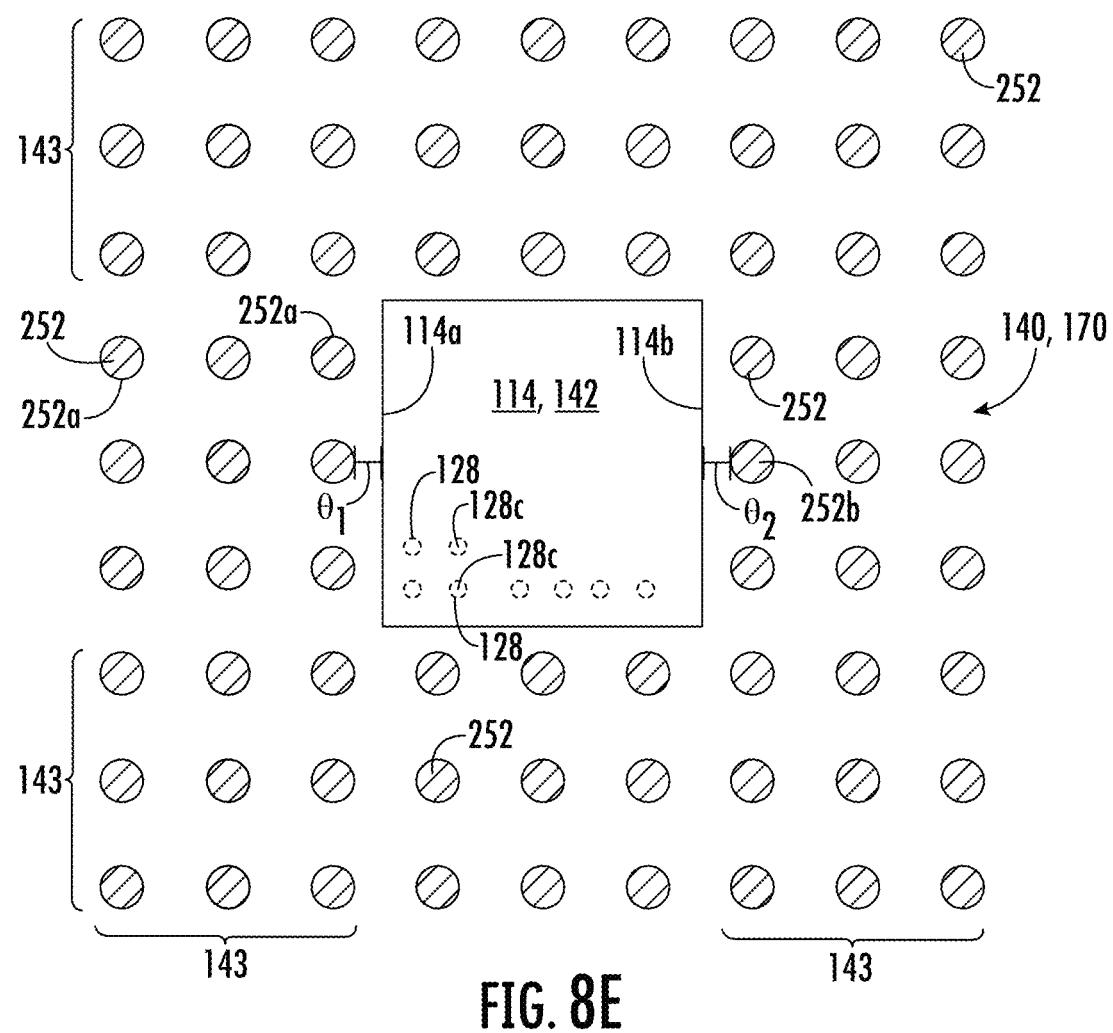
Figure 8G:
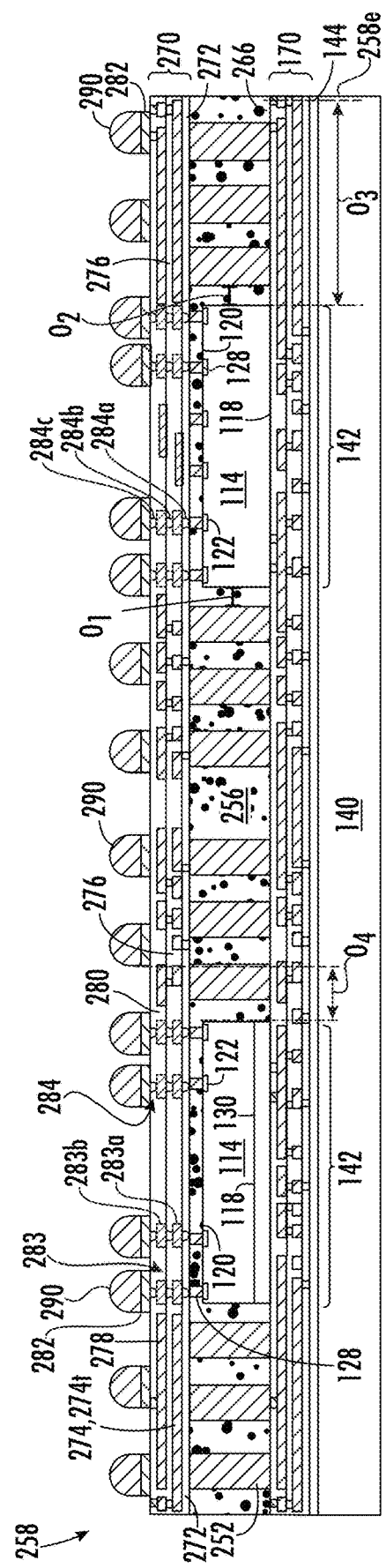

FIG. 8E shows a top or plan view of a portion of the temporary carrier 140 and the conductive interconnects 252 taken along the section line 8E from FIG. 8D. FIG. 8E shows that the conductive interconnects 252 can be formed within, and extend intermittently across, the peripheral area 143 and surround the semiconductor die mounting sites 142 (and the components 114) without being formed within the semiconductor die mounting sites 142. Additionally, FIG. 8E shows that after the component 114 is mounted at the mounting side 142, a first side 114a of components 114 is offset by an offset $\Theta_1$ from the conductive posts 252 adjacent the first side 114a. A second side 114b of components 114 (which is opposite the first side 114a) is offset by an offset $\Theta_2$ from the conductive posts 252 adjacent the first side 114b.

FIG. 8F, continuing from FIGS. 8D and 8E, illustrates that after mounting the components 114 to the carrier 140 over first interconnect structure 170, a mold compound or encapsulant 256 can be deposited around the plurality of components 114 using a paste printing, compression molding, transfer molding, liquid encapsulant molding, lamination, vacuum lamination, spin coating, or other suitable applicator. The encapsulant 256 can be a polymer composite material, such as epoxy resin with filler, epoxy acrylate with filler, PBO, polyimide, polymer with or without proper filler. Components 114 can be embedded in encapsulant 256, which can be non-conductive and environmentally protect the components 114 from external elements and contaminants. The encapsulant 256 can be formed as a single encapsulant in a single step adjacent to and directly contacting all lateral sides of the semiconductor die (such as four sides), as well as be formed over the active surface 120 of the components 114. The same single encapsulant 256 can also be formed around and directly contact the sides of the conductive studs 128 and the sides 252a of conductive interconnects 252 in a single step to form at least part of a molded substrate, molded bridge interposer panel, or panel 258. The panel 258 may comprise one build-up interconnect structure 170, as shown in FIG. 8F, or may comprise two opposing build-up interconnect structures 170, 270, as illustrated in FIG. 8G. While a method is shown of forming build-up interconnect structure 170 first, followed by building build-up interconnect structure 270, the order may be reversed. In some instances, the encapsulation and frontside build-up interconnect structure 270 may be built first, followed by removal of the temporary carrier 140, and further followed by the formation of the backside build-up interconnect structure 170.

The panel 258 can optionally undergo a curing process or Post Mold Cure (PMC) to cure the encapsulant 256. In some instances, a top surface, front surface, or first surface 262 of the encapsulant 256 can be substantially coplanar with first end 25 of the conductive interconnects 252. Alternatively, the top surface 262 of the encapsulant 256 can be over, offset, or vertically separated from the second ends 253 of the conductive interconnects 252, such that the second ends 253 of the conductive interconnects 252 are exposed with respect to the encapsulant 256 after the panel 258 undergoes a grinding operation, or through a recess 257 in the encapsulant 256 to expose the second end 253.

The panel 258 can also undergo an optional grinding operation with grinder 264 to planarize the top surface, front surface, or first surface 268 of the panel 258 and to reduce a thickness of the panel 258, and to planarize the top surface 262 of the encapsulant 256 and to planarize the top surface 268 of the panel 258. The top surface 268 of the panel 258 can comprise the top surface 262 of the encapsulant 256, the first ends of the conductive interconnects 252, or both. A chemical etch can also be used to remove and planarize the encapsulant 256 and the panel 258. Thus, the top surface 268 of the conductive interconnects 252 can be exposed with respect to encapsulant 256 in the peripheral area 143 to provide for electrical connection between components 114 and a subsequently formed redistribution layer or build-up interconnect structure 170.

The panel 258 can also undergo a panel trim or trimming to
remove excess encapsulant 256 that has remained in undesirable locations as a result of a molding process, such as eliminating a flange present for a mold chase. The panel 258 can include a footprint or form factor of any shape and size including a circular, rectangular, or square shape, the panel 258 comprising a diameter, length, or width of, or about, 200 millimeter (mm), 300 mm, or any other desirable size.

FIG. 8F also shows that actual positions, depicted as 142a within die placement area 142, of the components 114 within
the panel 258 may be measured with an inspection device or optical inspection device 259. As such, subsequent processing of the panel 258 as shown and described with respect to subsequent FIGs. can be performed with respect to the actual positions 142a of the components 114 within the panel 258.

FIG. 8G shows forming a frontside build-up interconnect structure or frontside interconnect structure 270—such as a second or active side build-up interconnect structure—over the panel 258 to electrically connect, and provide routing between, conductive interconnects 252 and the conductive studs 128. While the build-up interconnect structure 270 is shown comprising three conductive layers and three insulating layer, a POSA will appreciate that fewer layers or more layers can be used depending on the configuration and design of the substrate 300, which may comprise fully-molded bridge interposer.

The frontside build-up interconnect structure 270 can optionally comprise a first insulating or passivation layer 272 formed or disposed over the panel 258. The first insulating layer 272 may comprise one or more layers of $SiO_2$, $Si_3N_4$, SiON, $Ta_2O_5$, $Al_2O_3$, polymer, polyimide, BCB, PBO, epoxy, mold compound, or other material having similar insulating and structural properties, with or without filler. The insulating layer 272 can be formed using PVD, CVD, printing, spin coating, spray coating, sintering or thermal oxidation, molding, or other suitable process. Openings or first level conductive vias 284a can be formed through the insulating layer 272 over the conductive interconnects 252 and the conductive studs 128 to connect with the components 114. In other instances, the first insulating or passivation layer 272 may be omitted, and the first conductive layer 274 may be formed in direct contact with the encapsulant 256.

A first conductive layer 274 can be formed over the panel 258 and may also be formed over the first insulating layer 272. As part of the frontside interconnect structure 270, the first conductive layer 274 may be formed comprising DCTs 283 formed with unit specific patterning and further comprising RDL traces 274t, such that the traces 274t and DCTs 283 are disposed over the embedded component 114. The traces 274t may be coupled to second ends 253 (as seen in FIG. 8F) of the vertical conductive interconnects 252 in a periphery 143 (as shown in FIGS. 8C and 8E) of the DCTs 283.

The first conductive layer 274 may comprise first level conductive vias and may extend through the openings in the first insulating layer 272, to electrically connect with the conductive studs 128 and the conductive interconnects 252. As used herein, the term RDL includes distribution, redistribution, or movement, of signal through the conductive material in a vertical direction, horizontal direction, or both. As such, an RDL may, but need not have, a horizontal component. Conductive layer 274 can be one or more layers of Al, Cu, Sn, Ni, Au, Ag, or other suitable electrically conductive material formed using a patterning and metal deposition process such as sputtering, electrolytic plating, and electroless plating, or other suitable process.

When the first conductive layer 274 is formed, it may be formed at least partially within the first insulating layer 272 of the frontside build-up interconnect structure 270. The first conductive layer 274 may comprise vias 284a aligned to centers 128c (as shown in FIG. 8E) of the conductive interconnects 128. The alignment with the centers 128c of studs or conductive studs 128 may be measured for an individual unit or with an $r^2$ (or R-squared) value for a lot (or statistically significant number) of components 114 or substrates 300. The R-squared value (also known as the coefficient of correlation) is a statistical measure of how closely data is fitted to a regression line, which in this case is based on the lot of components 114 or substrates 300. Stated another way, an R-squared value is the proportion of the variation in the dependent variable that is predictable from the independent variable. The alignment with the centers 128c of studs or conductive studs 128 may have an $r^2$ value greater than or equal to 0.5, 0.6, 0.7, 0.8, or in a range greater than or equal to 0.5-0.8 relative to a difference between an offset $O_1$ between a first side 114a, or component edge 114e, of the bridge die 114 and a copper post or conductive interconnect 252a adjacent the first side 114a of the bridge die 114 and a second offset $O_2$ between a second side 114b of the bridge die 114 opposite the first side 114a of the bridge die 114 and a corresponding copper post or conductive interconnect center 252b adjacent the second side 114b of the bridge die 114. See, e.g., FIG. 8E.

In other instances, a misalignment between an edge 258e (as seen in FIG. 8P) of the molded substrate 258 and an edge

114e of the first component 114 (along offset $O_3$) is greater than a misalignment between the edge 258e of the molded substrate 258 and the plurality of interconnect pads 282 (along offset $O_4$) in a single instance, wherein the interconnect pads 282 may comprise UBM pads or other suitable input-output or IO pads. Or, for a group of measurements of lot of devices may comprise an $r^2$ value greater than or equal to 0.5, 0.6, 0.7, 0.8, or in a range greater than or equal to 0.5-0.8. See, e.g., FIG. 8E.

As such, the $r^2$ value provides a structural way of identifying that the processing of the frontside interconnect structure 270 was performed with respect to the actual positions of the components 114 within the panel 258, thereby allowing for finer pitch connections with the high density and ultra-high density interconnection with the bridge die 114 and the frontside interconnect structure 270. Stated another way, the differences, offsets, or misalignments between the centers 128c of the conductive interconnects 128 and the centers of the vias 284 of the conductive layer 274 is less than (or more closely aligned), than the differences, offsets, or misalignments between the differences in offsets $O_1$ and $O_2$ between the copper posts or conductive posts 252 of the bridge die 114 for the lot of die 114 or substrates 300. Stated yet another way, for a lot of die 114 or substrates 300, the differences, offsets, or misalignments between the centers 128c and the centers of the vias 284 is not statistically correlated (or has an $r^2$ value less than 0.5) to the alignment of the die to the copper or conductive posts 252 on each side of the die 114 (measured by looking at the offsets $O_1$ and $O_2$).

A second insulating or passivation layer 276, which can be similar or identical to the first insulating layer 272, can be disposed or formed over the panel 258, the first conductive layer 274 (including DCTs 283 or first DCT segments or traces 283a and traces 274t), and the first insulating layer 272. An opening or second level conductive via 284b can be formed through the second insulating layer 276 to connect with the first conductive layer 274.

A second conductive layer 278, when desirable and when present, may be similar or identical to the first conductive layer 274, can be formed as a second RDL layer (comprising traces 273t and second DCT segment or traces 283b) over panel 258, over the first insulating layer 272, over the first conductive layer 274, over the second level conductive via, or within an opening of the second insulating layer 272, to electrically connect with the first conductive layer 274 (comprising DCTs segments 283a and traces 274t), the first level vias 284a and second level conductive vias 284b, and the components 114. Additional detail of the peripheral traces 274t and DCTs 283, are shown in greater detail in other figures, including FIGS. 8J-9F.

A third insulating or passivation layer 280, when desirable and when present, may be similar or identical to the first insulating layer 272, can be disposed or formed over the second conductive layer 278 and the second insulating layer 276. An opening or a third level conductive via 284c can also be formed in or through the third insulating layer 280 to connect with the second conductive layer 278.

A third conductive layer 282, when desirable and when present, may be similar or identical to the second conductive layer 278, can be formed as a third RDL layer (comprising traces 273t and second DCT segment 283b)—and be further disposed over the second insulating layer 276, over the second conductive layer 278, over the second level conductive via 284b, or within an opening of the second insulating layer 276. The third conductive layer 282 can electrically connect with the second conductive layer 278 and be coupled with the conductive interconnects 252 and the components 114.

In some instances, the third (or final) conductive layer within the frontside build-up interconnect structure 270 can be formed as INTERCONNECTs 282 that are formed over the third insulating layer 280 to electrically connect with the other conductive layers and conductive vias within the build-up interconnect structure 270, as well as electrically connect to the components 114, the conductive studs 128, and the conductive interconnects 252. INTERCONNECTs 282, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, tantalum (Ta) or chromium (Cr). The barrier layer can be formed over the adhesion layer and can be made of Ni, NiV, platinum (Pt), palladium (Pd), TiW, or chromium copper (CrCu). In some instances, the barrier layer can be a sputtered layer of TiW, Ta or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstroms). The seed layer can be formed over the barrier layer and can act as an intermediate conductive layer below subsequently formed upper bumps, balls, or interconnect structures 290. In some instances, the wetting layer can comprise a layer of Cu with a thickness in a range of about 5-11 μm or 7-9 μm. Upper bumps 290, such as when formed of SnAg solder, can consume some of the Cu interconnect 282 during reflow and forms an intermetallic compound at the interface between the solder bump 290 and the Cu of the wetting layer. However, the Cu of the wetting layer can be made thick enough to prevent full consumption of the Cu pad by the solder during high temperature aging.

Interconnects 282 may be formed as a POP UBM pad, UBM structure, or land pad, such as for stacked PoP structure, an additional electronic component. In some instances, the interconnects 282 can comprise Ni, Pd and Au. Interconnects 282 can provide a low resistive interconnect to frontside interconnect structure 270 as well as a barrier to solder diffusion and seed layer for solder wettability. The plurality of interconnects pads 282 may be formed disposed over the DCTs 283 and over the frontside RDL traces according to a interconnect pad design position without regard for a measured shift of each component. As noted above, a pitch of the DCTs 283, a pitch of the conductive studs, and a pitch of the interconnect pads 282 do not permit enough space for the DCTs 283 to be routed between the conductive studs or the interconnect pads. The interconnect pads 282 may be formed at a first smaller pitch within a footprint of the bridge die and at a second larger pitch outside a footprint of the bridge die. In other instances, the interconnect pads may be formed at a same pitch across the substrate 300.

The upper bumps 290 can be formed on or coupled to the interconnect pads 282. The bumps 290 can be formed by depositing an electrically conductive bump material over the interconnect pads 282 using an evaporation, electrolytic plating, electroless plating, ball drop, or screen-printing process. The bump material can be Al, Sn, Ni, Au, Ag, Pb, bismuth (Bi), Cu, solder, and combinations thereof, with an optional flux solution. For example, the bump material can be eutectic Sn—Pb, high-lead solder, or lead-free solder. The bump material can be bonded to the interconnect pads 282 using a suitable attachment or bonding process. In one embodiment, the bump material is reflowed by heating the material above its melting point to form spherical balls or bumps 290. In some applications, bumps 290 are reflowed a second time to improve electrical contact to interconnect pads 282. The bumps 290 can also be compression bonded or thermocompression bonded to the interconnect pads 282. Bumps 290 represent one type of interconnect structure that can be formed over the conductive interconnects 252, and other desirable structures, such as conductive paste, stud bump, micro bump, or other electrical interconnects may also be used as desired.

FIG. 8H illustrates additional detail of the frontside interconnect structure, frontside build-up interconnect structure, or frontside RDL layer 270. The frontside interconnect structure 270 comprises DCTs 283 as well as interconnect pads 282. Interconnect pads 282 may be formed of a same size and same pitch across the frontside interconnect structure 270, or may be formed of different sizes and pitches, such as a smaller first size and pitch 282a within a footprint of the component 114 and a larger second size and pitch 282b outside a footprint of the component 114.

Figure 8I:
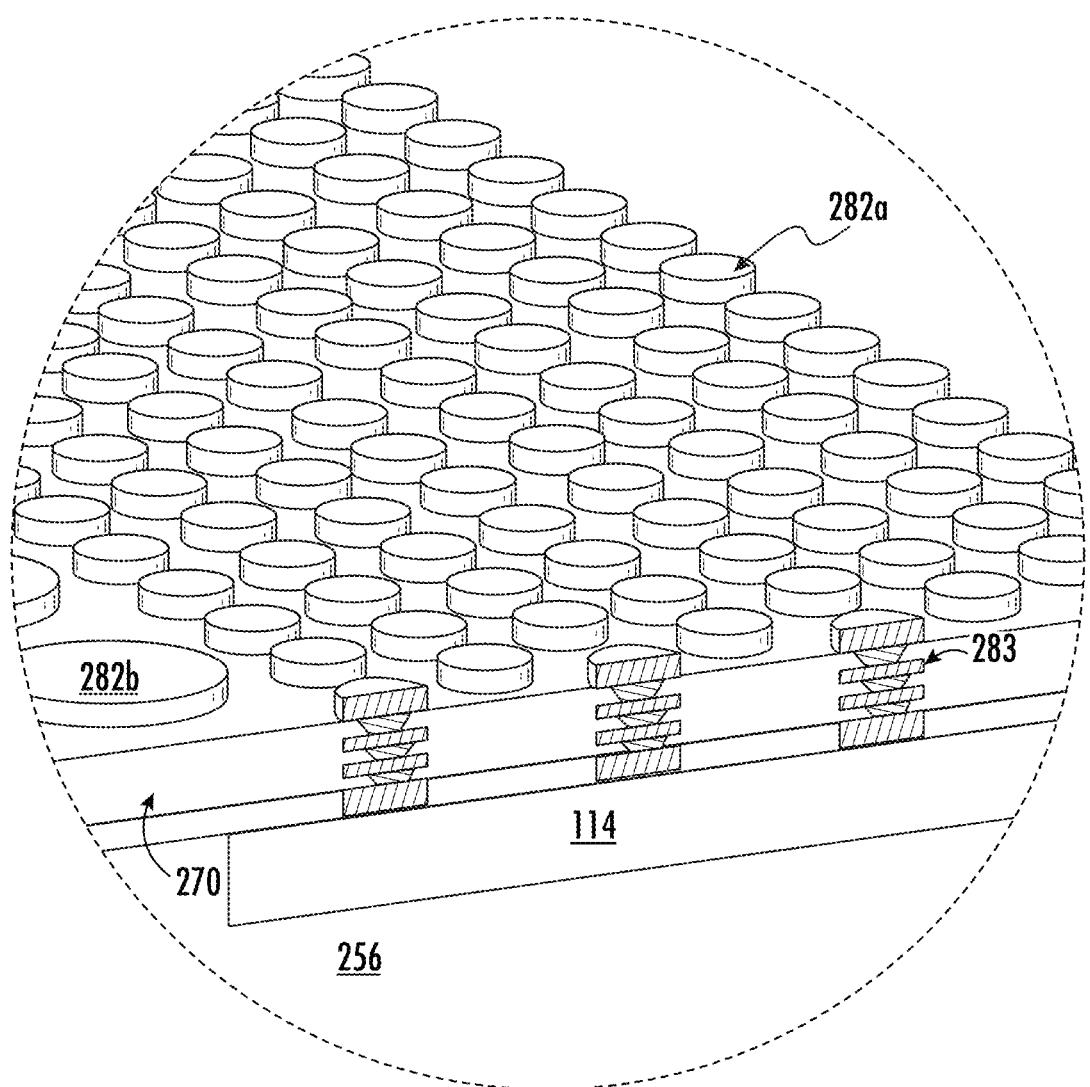

FIG. 8I illustrates a close-up perspective view of the portion of FIG. 8H indicated by section line 8I, showing DCTs 283 disposed within frontside interconnect structure 270. A pitch 282a of interconnect pads 282 within a footprint or die attach area 142 of the embedded component 114 is less than a pitch 282b of interconnect pads 282 outside a footprint or die attach area 142 of the embedded component 114, as may also be seen in FIG. 8H.

Figure 8J:
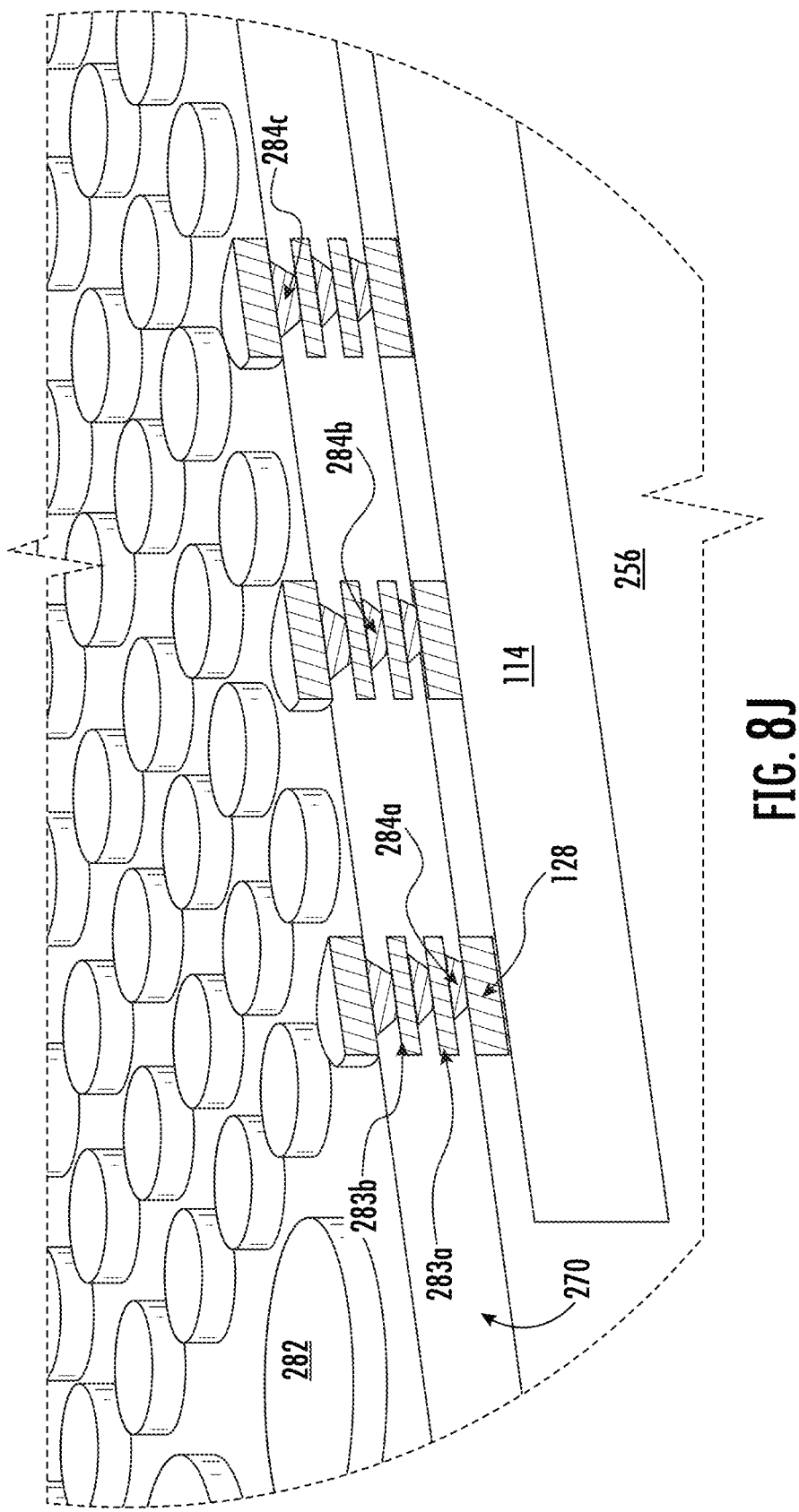

FIG. 8J illustrates an additional close-up perspective view of the lower portion of FIG. 8I, and provides additional details with respect to DCTs 283, including first DCT segments 283a and second DCT segments 283b. FIG. 8J also illustrates the vias or conductive stumps 284a-284c connecting the DCT segments 283a-283b to each other on vertically separated layers. The vias 284 are shown with the additional detail of first vias 284a formed over conductive stud 128, second vias 284b formed over first via 284a and first DCT segment 283a, and third vias 284c formed over second via 284b and second DCT segment 283b. In some instances, the vias 284a, 284b, and 284c may be formed in a same process or plating step as the DCT segments or traces 283x. In other instances, the vias 284 (or conductive stumps) may be formed in a separate or different process or plating step from that of the DCT segments 283x. The interconnect pads 282 may then be formed over the DCTs 283 and vias 284. As shown in FIG. 8I, the interconnect pads 282 may comprise differing diameters and pitches 282a and 282b, respectively, dependent upon if they are disposed over or proximal to embedded component 114.

Figure 8K:
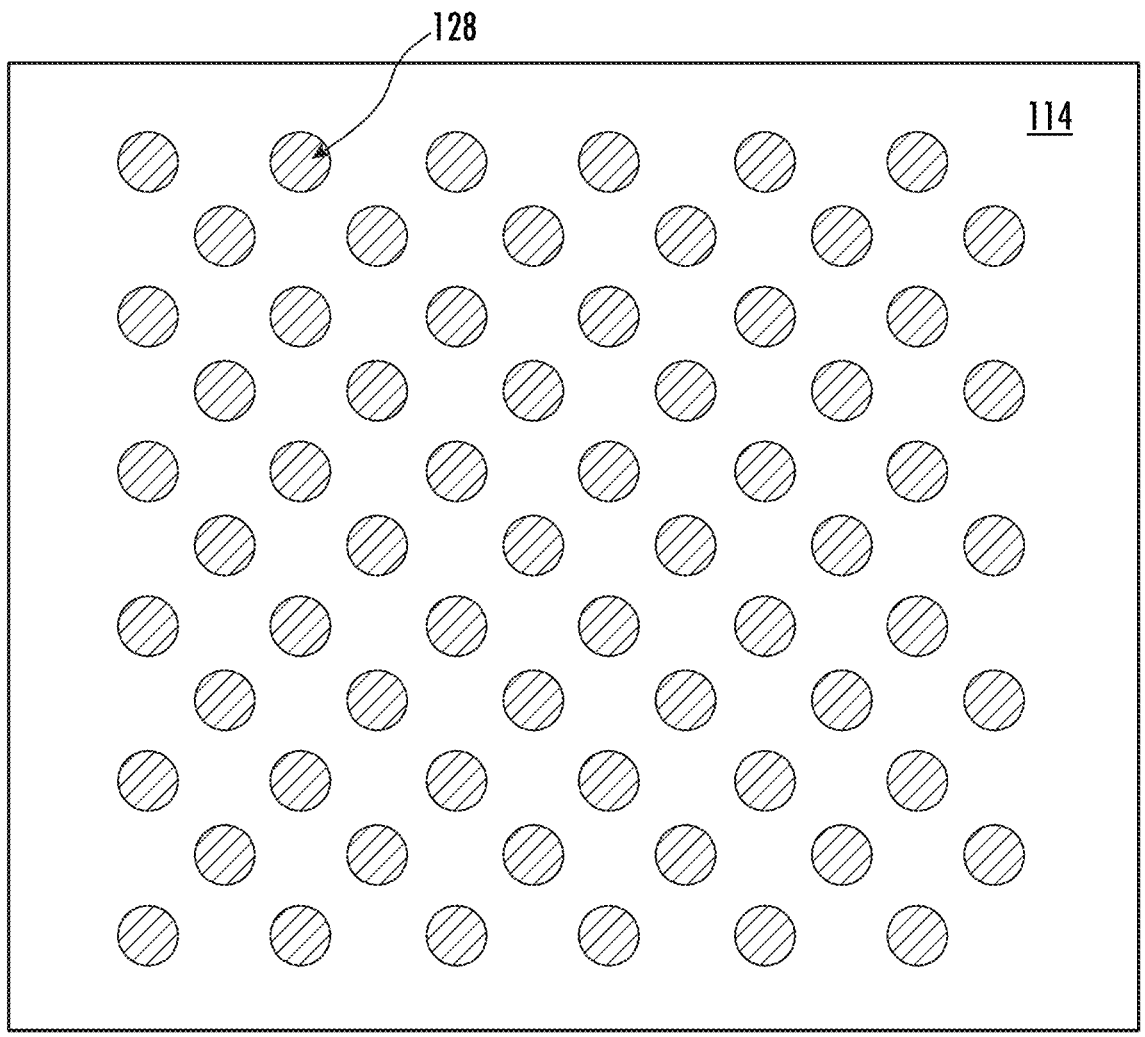

FIG. 8K illustrates a plan view of a component 114 with conductive studs 128 coupled thereto.

FIG. 8L, similar to FIG. 8J, illustrates a cross-sectional perspective view of a component 114 with the DCTs 283 formed thereover and coupled to the conductive studs 128. FIG. 8L differs from FIG. 8J in that component 114 has experienced a shift and requires compensation with the routing of DCTs 283 to couple the component 114 (at its new shifted position, as shown by interconnect offset, Oi) to interconnect pads 282. The shift is a difference between a nominal design position 142n, and an actual measured position 142a, such as measured by automated optical inspection (AOI). The shift is measured from the center 128c of the conductive stud 128, to the center 282c of the interconnect pads 282. An edge 114e of the component 114 is similarly shifted by the same amount to reflect the actual position, 142a (as shown by bracket 142a, of component 114.

Figure 8M:
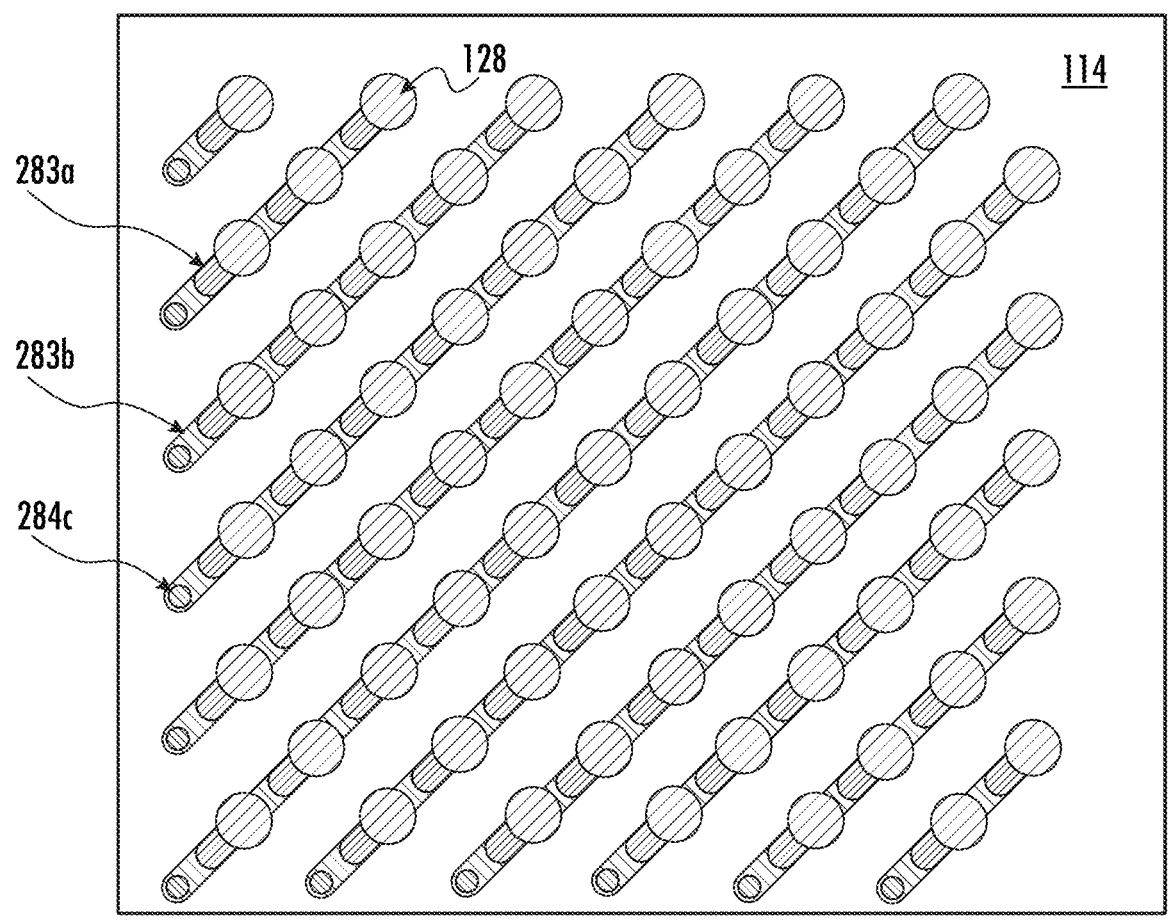

FIG. 8M illustrates a plan view of a component 114 with conductive studs 128 coupled thereto. With a shift in position of component 114 DCTs 283 with DCT segments 283x are created to couple the component 114 (at its new shifted position) to interconnect pads 282 (not shown). The conductive studs 128 or contact pads 122 are coupled to first DCT segments 283a, which are in turn coupled with second DCT segments 283b, which is in turn coupled with third via 284c, which is then coupled with interconnect pads 282.

The DCTs 283 may be comprised of one or more DCT segments 283x. The DCTs 283 may be formed such that each DCT 283 and each DCT segment 283x (including any DCT segment 283a, 283b etc.)—or a majority (50%) or about a supermajority (80%) of the DCTs—is formed entirely within: (i) a footprint of its respective component 114, (ii) a footprint of its respective chip 311 to which it is coupled, (iii) a shared footprint 300 that is the area of overlap between the footprint of the component 114 and the footprint of the chip 311 or of the footprint of the interconnect pad area 336, or (iv) a combined footprint 332 that the area of footprint of the component 114 or the interconnect pad area 336 and the footprint of the chip 311. Each DCT 283 and each DCT segment 283x may be oriented in substantially the same direction, such that a direction of each DCT 283 is within 15°, 10°, 5°, 3°, 2°, or 1°, of each adjacent DCT 283. Each DCT 283 and each DCT segment 283x may comprise a length that varies less than or equal to 20%, 15%, 10%, 5%, 3%, 2%, or 1%, of a length of each adjacent DCT 283. Each DCT 283 and each DCT segment 283x may comprise a length that varies less than 10%, 5%, 3%, 2%, or 1% of a length of each adjacent DCT 283 when a measured rotation of the component is less than 3%, 2%, 1%, or 0.05%. Each DCT 283 and each DCT segment 283x is not a fan-out trace. Each DCT 283 and each DCT segment 283x does not extend farther than a next adjacent row of DCTs 283 or DCT segment 283x. Each DCT 283 and each DCT segment 283x may not be routed between conductive studs 128 or interconnect pads 282. A pitch of each DCT 283 and each DCT segment 283x may be within 10% of a pitch of the conductive studs 128 and within 10% of a pitch of the interconnect pads 282. A pitch of the DCTs 283, a pitch of conductive studs, and a pitch of the interconnect pads 282 may be such so as to not permit enough space for the DCTs 283 to be routed between the conductive studs 128 or the interconnect pads 282. In some embodiments, a pitch of the DCTs is within 10% of a pitch of the conductive contacts and within 10% of a pitch of the interconnect pads 282 along an entire length of the DCTs.

Figure 8N:
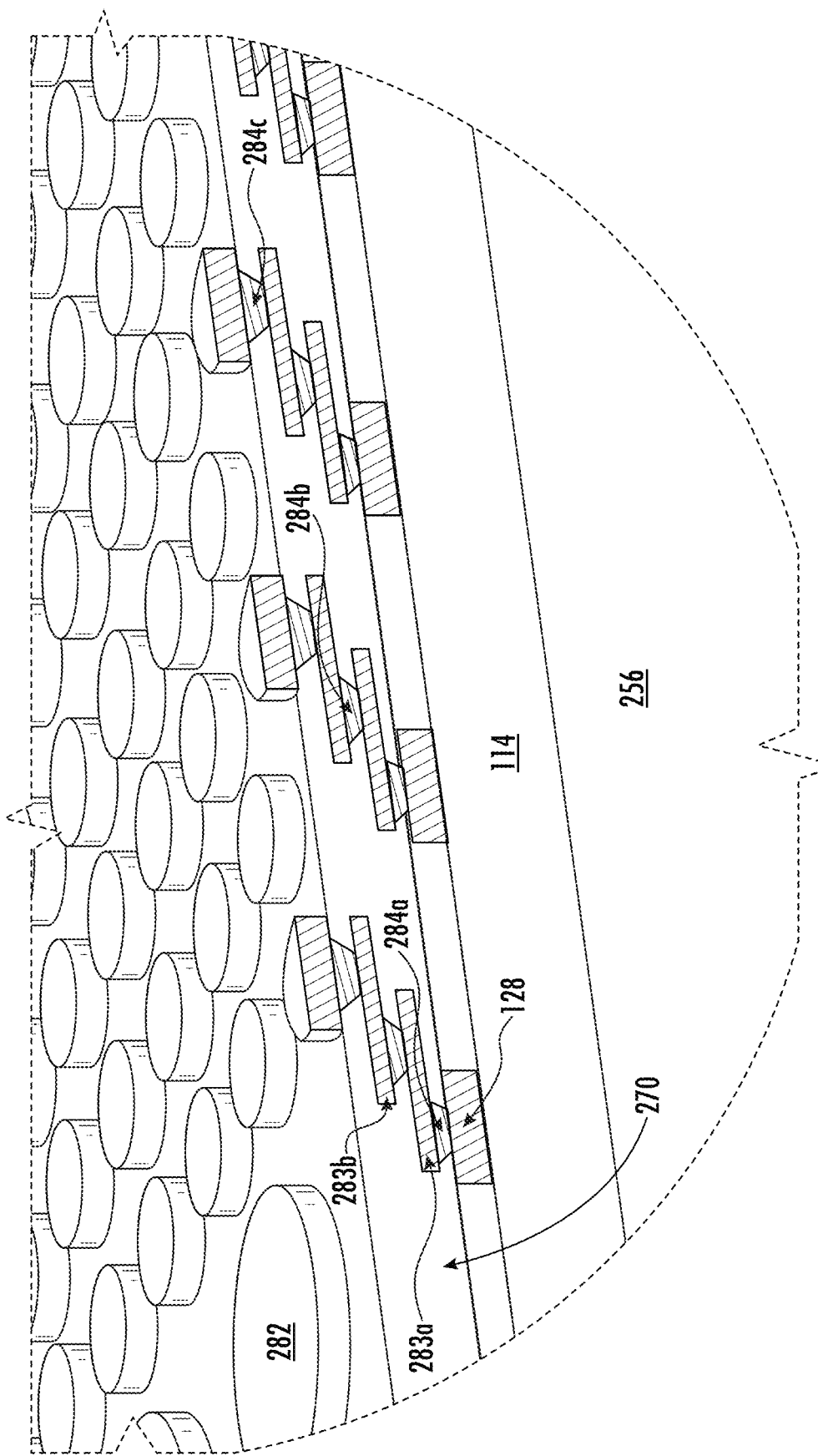
Figure 80:
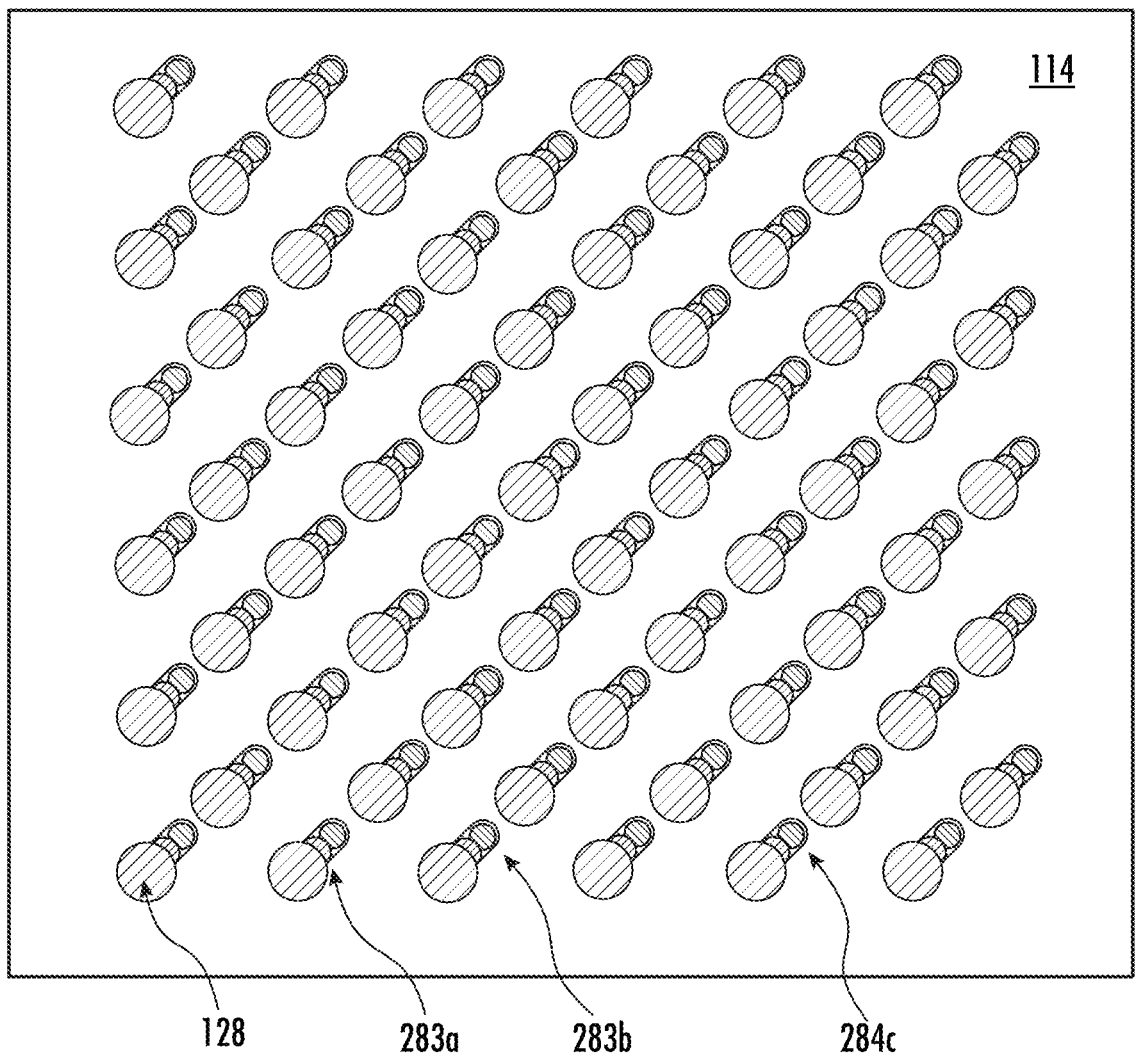

FIG. 8N, similar to FIG. 8L, illustrates a cross-sectional perspective view of a component 114 with the DCTs 283 formed thereover and coupled to the conductive studs 128. FIG. 8N differs from FIG. 8L in that component 114 has experienced a shift in an opposite direction of that shown in FIG. 8L and requires different compensation with the routing of DCTs 283 to couple the component 114 (at its new shifted position) to interconnect pads 282.

FIG. 8O, similar to FIG. 8M, illustrates a plan view of a component 114 with conductive studs 128 coupled thereto, and further with a shift in position of component 114. FIG. 8O differs from FIG. 8M based on a direction and distance of the shift, and a corresponding and compensatory shift in the length and direction of the DCTs 283 with DCT segments 283x, which are created to couple the component 114

(at its new shifted position) to interconnect pads 282 (not shown). The conductive studs 128 or contact pads 122 are coupled to first DCT segments 283a, which are in turn coupled with second DCT segments 283b, which is in turn coupled with third via 284c, which is then coupled with interconnect pads 282.

FIG. 8P illustrates singulation of the panel 258 and interconnect structures 170, 270 with saw blade or laser cutting tool 294 to form individual substrates 300. For simplicity the substrates 300 are shown with one embedded component 14, but may comprise two or more components 114, including 22 or more components, as illustrated, e.g., in FIG. 6B. The final substrates 300 may be thinner than previous packages, comprising an overall height or thickness of, or on the order of, or about, 50-250 µm, 100-200 µm, or less than or about 150 µm. Stacks of multiple layers can be correspondingly thicker, and increase in multiples of the above ranges, resulting in an overall thickness in a range of 200-1,000 µm. As part of the reduced height of the structure, the final structure may be made without another interposer, comprising the build-up interconnect layers and conductive vertical providing the function of an interposer, and serving as s sort of embedded interposer. In some instances, chips 311 (as shown in for example FIG. 4A and others) will be mounted to the substrates 300 before singulation. In other instances, chips 311 will be mounted to the substrates 300 after singulation.

The temporary carrier 140 may be removed to expose the first interconnect structure 170. The carrier 140 can be removed, e.g., by grinding the carrier 140, by exposing UV release tape 144 to UV radiation separate the UV tape 144 from the glass substrate 140, by thermal release, or other suitable method. After removal of the carrier 140, the panel 258 can also undergo an etching process, such as a wet etch, to clean the surface of the panel 258 exposed by removal of the temporary carrier 140, including the exposed first ends 254 of the conductive interconnects 252. The exposed first ends 254 of the conductive interconnects 252 can also undergo a coating or pad finishing process, such as by an Organic Solderability Preservative (OSP) coating, solder printing, electroless plating, or other suitable process, to form a PoP interconnect pads 282, UBM structures, land pads, or other suitable structure, as desired.

Lower bumps, balls, or interconnect structures 296 (illustrated, e.g., in FIG. 6A), can be formed on or coupled to the exposed first ends 254 of the conductive interconnects 252. The bumps 296 can be formed by depositing an electrically conductive bump material over the exposed first ends 254 of the conductive interconnects 252 using an evaporation, electrolytic plating, electroless plating, ball drop, or screen-printing process. The bump material can be Al, Sn, Ni, Au, Ag, Pb, Bi, Cu, solder, and combinations thereof, with an optional flux solution. For example, the bump material can be eutectic Sn—Pb, high-lead solder, or lead-free solder. The bump material can be bonded to the exposed first ends 254 of the conductive interconnects 252 using a suitable attachment or bonding process. In one embodiment, the bump material is reflowed by heating the material above its melting point to form spherical balls or bumps 296. In some applications, bumps 296 are reflowed a second time to improve electrical contact to conductive interconnects 252. The bumps 296 can also be compression bonded or thermocompression bonded to the conductive interconnects 252. Bumps 296 represent one type of interconnect structure that can be formed over the conductive interconnects 252, and other desirable structures, such as conductive paste, stud bump, micro bump, or other electrical interconnects may also be used as desired.

FIG. 9A illustrates a plan view of two chips 311, embodied as AI processor 312 and HBM 314, disposed over embedded component 114. The embedded component 114 is illustrated as not having experienced any appreciable or significant shift, such that the conductive studs 128 (or contact pads 122) are aligned with the interconnect pads 282, there being no need for DCTs 283. Fiducials 288 may also be included in one or more layers of the substrate or package solution, which may be used to assist with one or more of alignment, shift measurement, and formation of features.

Figure 9B:
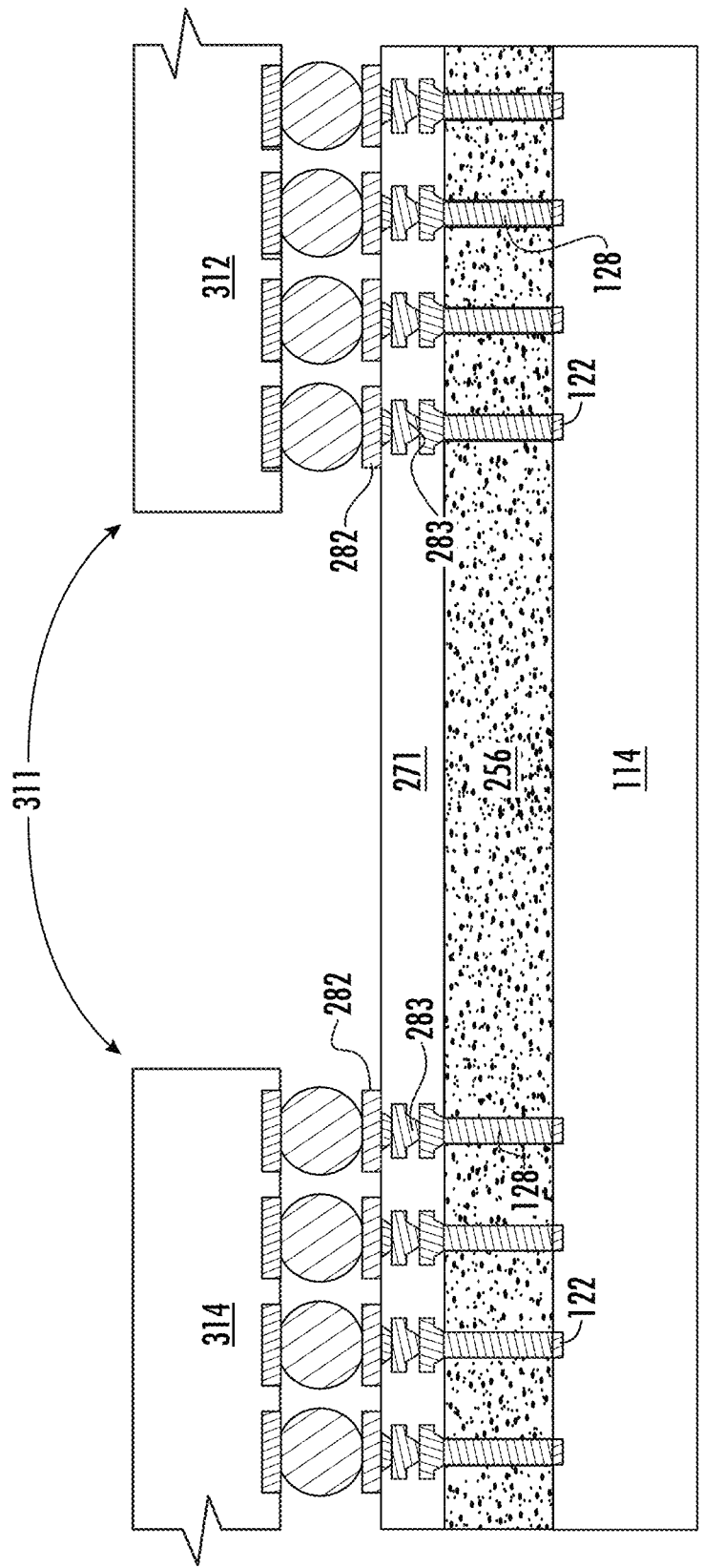

FIG. 9B illustrates a cross-sectional profile view taken along the section line 9B in FIG. 9A, so as to illustrate two chips 311, embodied as AI processor 312 and HBM 314, disposed over embedded component 114, wherein there is no appreciable shift to the component 114. Frontside insulating layer 271 may be any of insulating layers 272, 276 and 280 as represented in FIG. 8P.

Figure 9C:
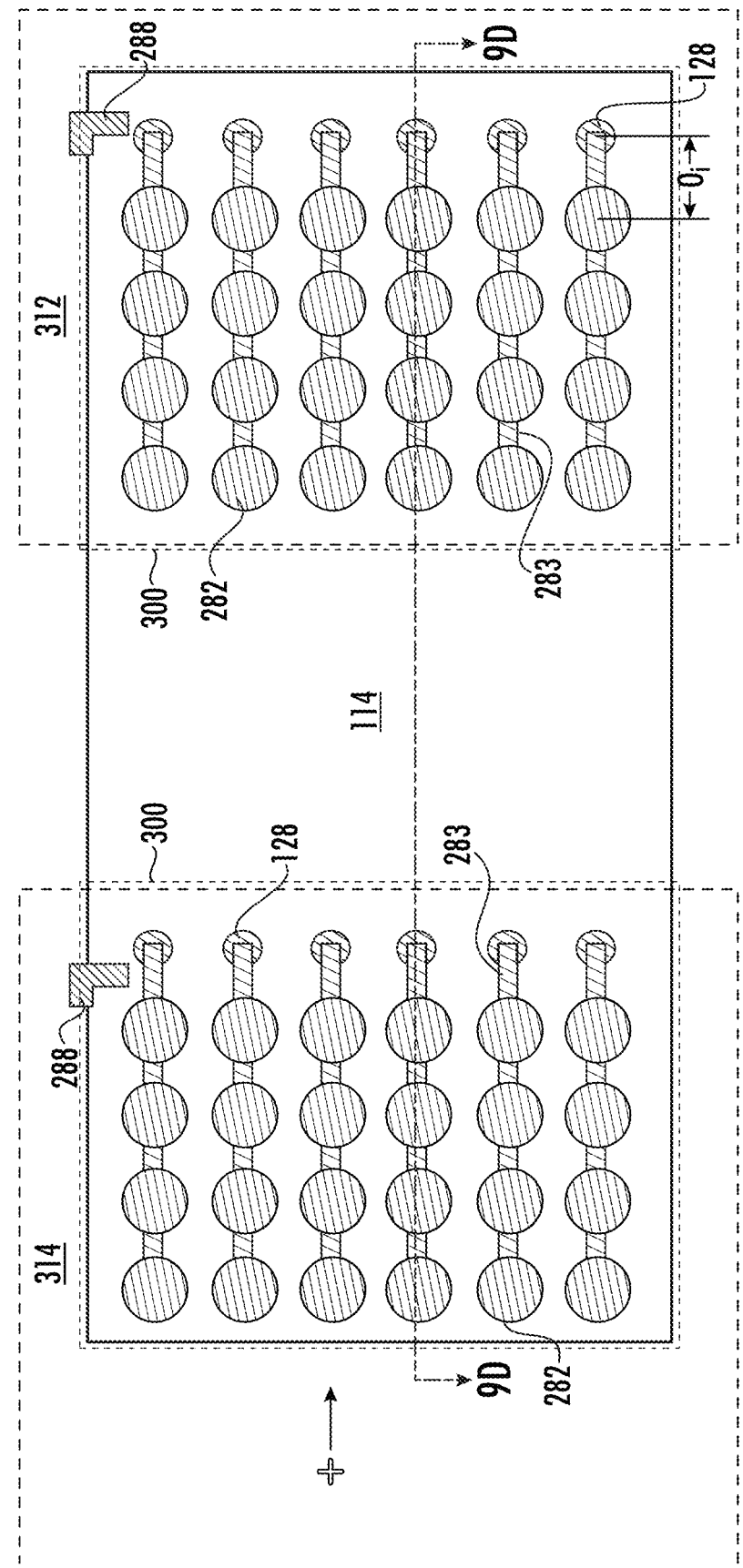

FIG. 9C illustrates a plan view of two chips 311, embodied as AI processor 312 and HBM 314, disposed over embedded component 114, similar to what was shown in FIG. 9A. FIG. 9C differs from FIG. 9A in that the embedded component 114 is illustrated as having experienced appreciable or significant shift, as indicated by the arrow, which shows embedded component 114 shifting in a +shift", to the right as indicated by interconnect offset shift Oi. After the shift of component 114, the conductive studs 128 (or contact pads 122) are not aligned with the location of interconnect pads 282, thereby introducing a need for DCTs 283, which are also included and shown coupling the conductive studs 128 to the interconnect pads 282 by way of DCTs 283.

Figure 9D:
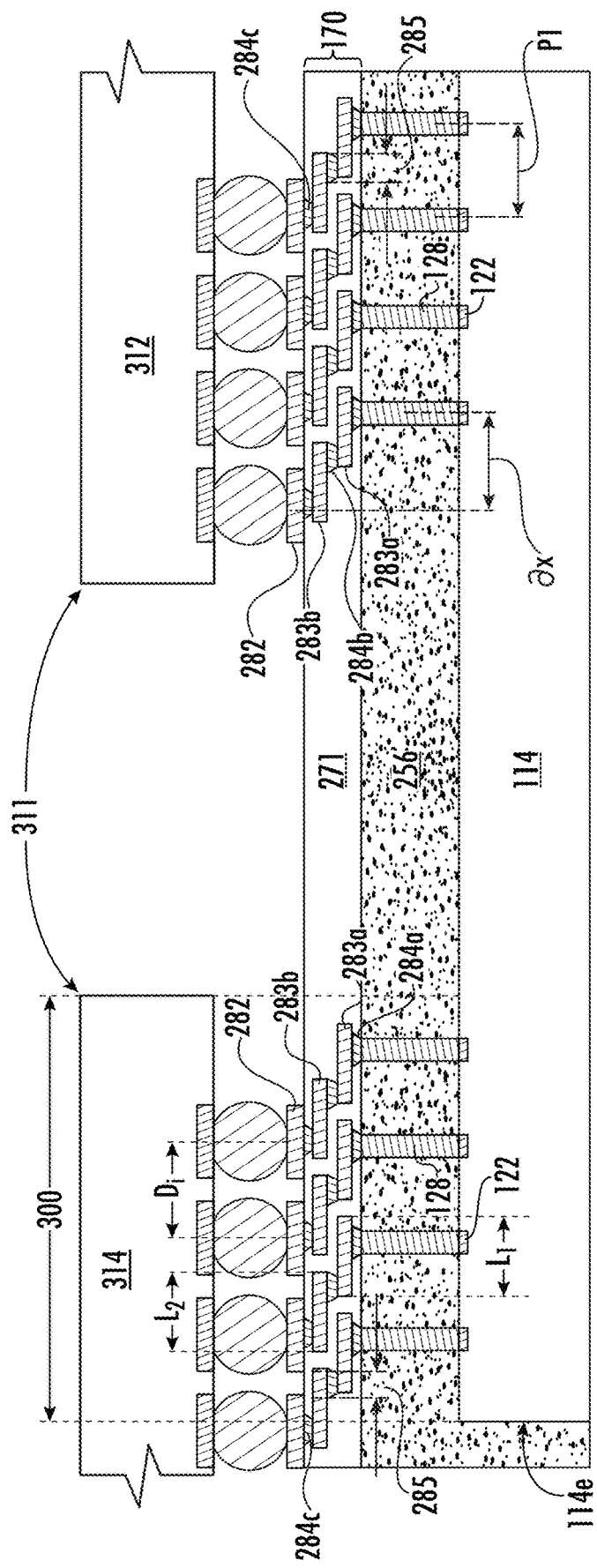

FIG. 9D illustrates a cross-sectional profile view taken along the section line 9D in FIG. 9C, so as to illustrate two chips 311, embodied as SOC 312 and HBM 314, disposed over embedded component 114, wherein there is appreciable shift to the embedded component 114. After the shift of component 114, the conductive studs 128 (or contact pads 122) are not aligned with the location of interconnect pads 282, thereby introducing a need for DCTs 283, which are also included and shown coupling the conductive studs 128 to the interconnect pads 282. FIG. 9D illustrates DCT segments 283a and 283b coupled with first via 284a, 284b, and 284c, as well as interconnect pads 282. A DCT segment overlap 285 allows for a distance ox between a center 128c of conductive stud 128 and a center 282c of interconnect pads 282 to be greater than a pitch P1 between the conductive studs 128.

The DCTs 283 may be formed with a 1:1 correspondence between the conductive studs 128 or conductive pads 122 and the interconnect pads 282. In other instances, the at least one DCT 283 may be formed with a one-to-many correspondence between a component contact 122 and many interconnect pads 282 that are used for clock, power or ground. The DCTs 283 may comprise a plurality of DCT segments 283x, which may be distributed across at least two vertically separated layers. In other instances, the DCTs 283 may comprise a plurality of DCT segments 283x on a single conductive layer. A sum of lengths of all DCT segments 283x from one conductive stud 128 or component contact 122 to one interconnect pad 282, minus a DCT segment overlap 285, is equal to a total displacement ∂x of the one conductive stud 128 or component contact 122 with respect to the one interconnect pad 282. A direction of DCTs 283 extending from each conductive stud center 128c, or from each conductive contact center 122c, toward each interconnect pad center 282c for the component 114 may be the same direction for each of the DCTs 283. A direction and length of DCTs 283$x_a$ for a first component 114a comprising a first shift ∂xa may be different than a direction and length of DCTs 283$x_b$ for a second component 114b with a second shift ∂xb within a same organic substrate 300 with embedded components 114. The substrate 300 may comprise an area greater than a reticle size, or equal to 20 mm by 40 mm, and the DCTs 283, RDL traces 274t, and interconnect pads 282 may be formed without reticle stitching. An amount of compensation provided by a group of DCT segments 283 for each component 114 may be greater than a pitch P1 of the conductive studs 128 (or contact pads 122), and greater than a pitch of the interconnect pads 282 when the group of DCT segments 283x is distributed across two or more vertical layers. Frontside insulating layer 271 may be any of insulating layers 272, 276 and 280 as represented in FIG. 8P.

Figure 9E:
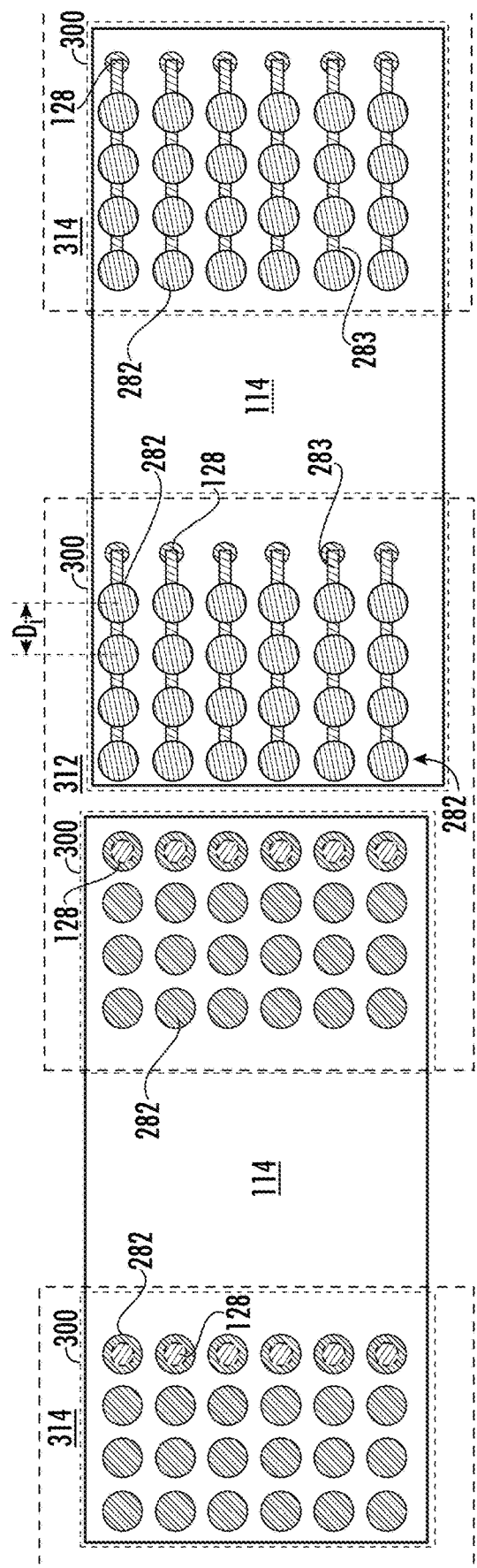

FIG. 9E illustrates a close-up view of two or more embedded components 114, such as a bridge die, being used within a substrate 300 to accommodate three or more heterogeneous chips 311, such as AI processors 312 and HBMs 314. A POSA will understand the additional detail shown in FIG. 9E applies to larger substrates 300, such as that illustrated in FIG. 6B. With one embedded component 114 or bridge die, the conductive layer or patterning coupled to the embedded component 114 could be formed using a conventional approach, such as with a stepper. However, with multiple components 114, and large substrates 300 with a plurality of components 114, laser direct imaging (LDI) and unit specific patterning allow for larger tolerance in the movement and shift of components 114, while still being able to maintain tighter pitch and fidelity with interconnect pad 282. Further, with larger 600 mm×600 mm panels, as shown in FIG. 6C, placement of (and connection with) components 114 across the panel or wafer becomes more difficult. For example, with 300 mm wafers, components 114 generally need to be placed with an accuracy of within 1-2 μm of a design position. For 600 mm panels, control has to be double given the larger size, so it is much harder to achieve 1-2 μm component placement accuracy. Similarly, thermal and moisture expansion and contraction is also doubled. Further, tool travel distance with large panels (which often have two or more gantries and two or more heads to service different areas of the panel) may introduce additional complications for accuracy, including separate calibration or drift, which may make the instruments less accurate, less precise, or both. However, each of the above may be accounted for and remedied with unit-specific patterning and the use of DCTs.

When two or more components 114 are present and different shifts and rotations are being accounted for with the DCTs 283, a direction and length of a plurality of DCTs 283 for a first component 114 may comprise a first shift that is different than a direction and length of a plurality of DCTs 283 for a second component 114 with a second shift within a same substrate or interposer 300 with embedded components 114. A POSA will appreciate that a plurality of DCTs 283 means 2 or more DCTs 283 and that the plurality of DCTs 283 with a particular direction and length may be less than an entirety of the DCTs 283.

Figure 9F:
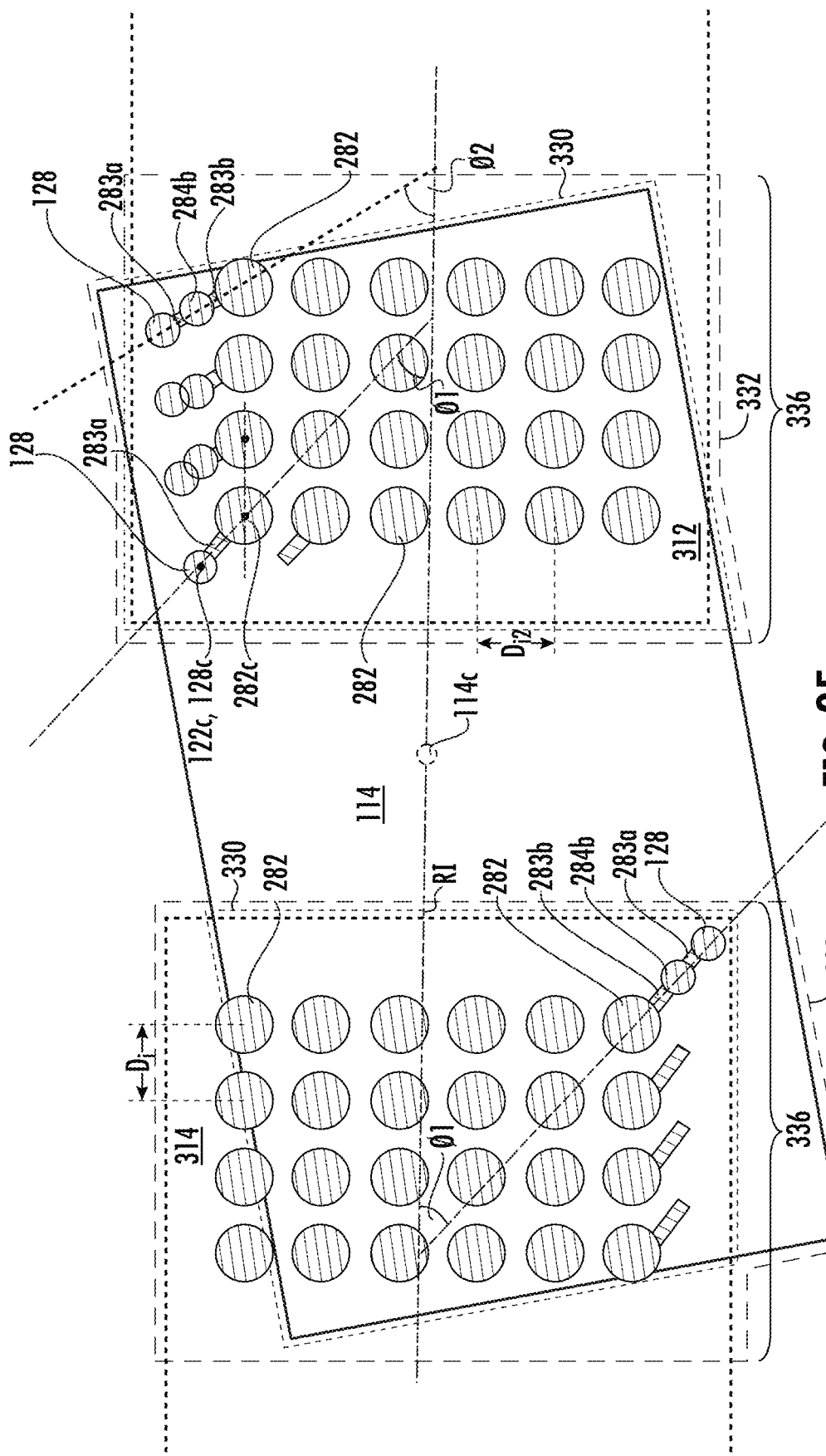

FIG. 9F illustrates the component 114 comprising a rotation. The rotation of the component 114 may be in a range of plus or minus about 0-5°, 0-4°, or 0-3°. The angle of rotation of the component 114 can be measured with respect to a reference line Lr such as a horizontal reference line Lr that passes through the center 114c of the component 114, and is parallel to lines that pass through centers 282c of interconnect pads 282 forming rows of interconnect pads 282. A correction for the rotation is made using DCTs 283 as a form of unit specific patterning. An angle ø of the DCTs 283 will change based on the rotation of the embedded component 114. An angle ø or direction of the DCTs 284 can be measured with respect to the direction or line between the center 282c of the interconnect pads 282 and each corresponding center 128c of the conductive stud 128, or the center 122c of conductive layer or conductive pad 122 with respect to reference line Lr.

An amount of the rotation and a corresponding length of the DCTs 283 (or a sum of a length of the DCT segments 284) for each interconnect pad 282 may increase proportionally to a distance from a component center 114c or from a center of rotation 114c of the component 114. For simplicity and ease of illustration, not every DCT 283 that would be coupled to a corresponding interconnect pad 282 has been shown, and many of the interconnect pad 282 that would comprise DCTs 283 are shown without the DCTs. However, a POSA will appreciate that each interconnect pads 282 could comprise a DCT 283. A length of each DCT 283 or a sum of lengths of DCT segment 283x may be proportional to a distance between each DCT 283 and a center 114c of its component 114. Similarly, an angle ø of each DCT 283 may increase proportionally to a distance between each DCT 283 and a center 114c of its component 114, such that ø1 will be less than ø2, as illustrated in FIG. 9F. In some instances, a component 114 will comprise both x-y shift and rotation, both of which may be compensated for by the DCTs 283.

Figure 10:
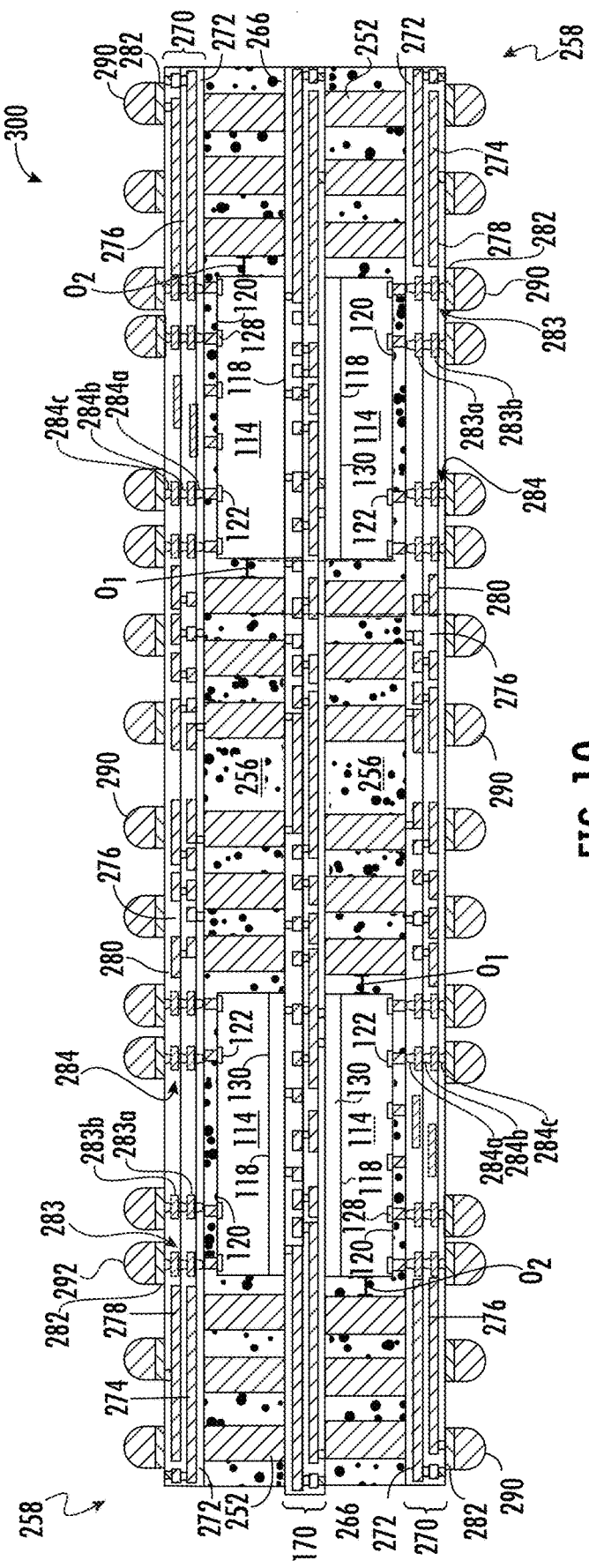
FIG. 10 illustrates a substrate or interposer comprising a two-sided arrangement in which embedded components are included both above and below an interconnect layer.

FIG. 10 is similar to FIG. 8P before singulation, and illustrates an instance in which a substrate or interposer 300 comprises a two-sided arrangement in which at least one additional arrangement of DCTs 283 is disposed over a backside 266 of the substrate 300. In some instances, the two-sided arrangement further comprises at least one additional embedded component 114 is included over a backside 266 of the substrate 300, opposite the embedded components 114 are included both above and below an interconnect layer 170. Each component 114 thereof may comprise DCTs 283 to account or compensate for shift or movement of the components 114.

Figure 11A:
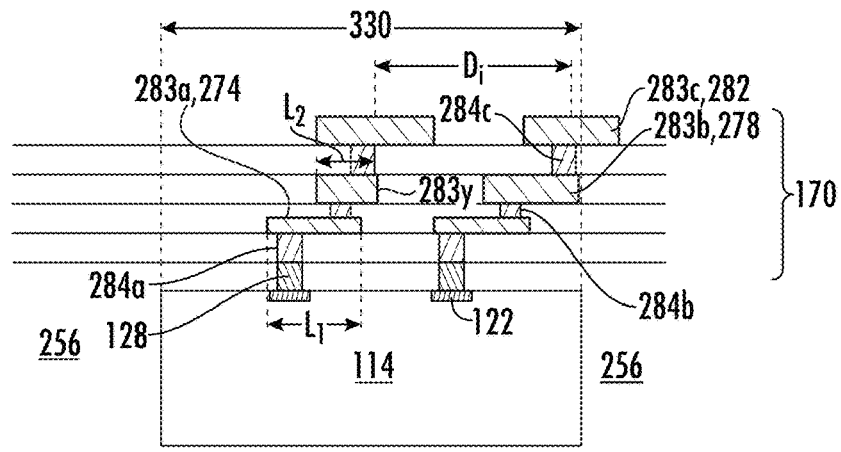
FIG. 11A-11C illustrate various aspects of substrates or interposers comprising embedded components that can be part of a chiplet arrangement.
Figure 11B:
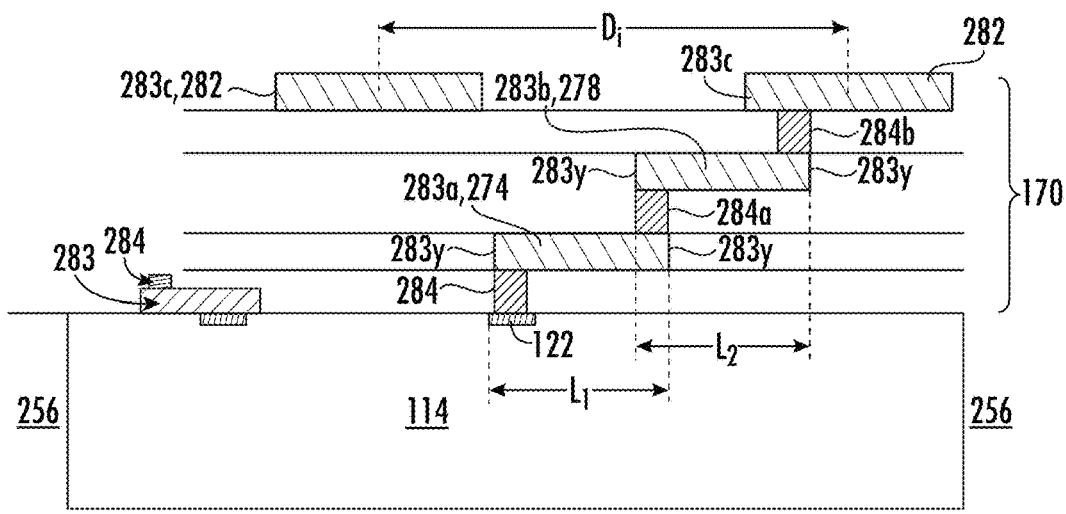
Figure 11C:
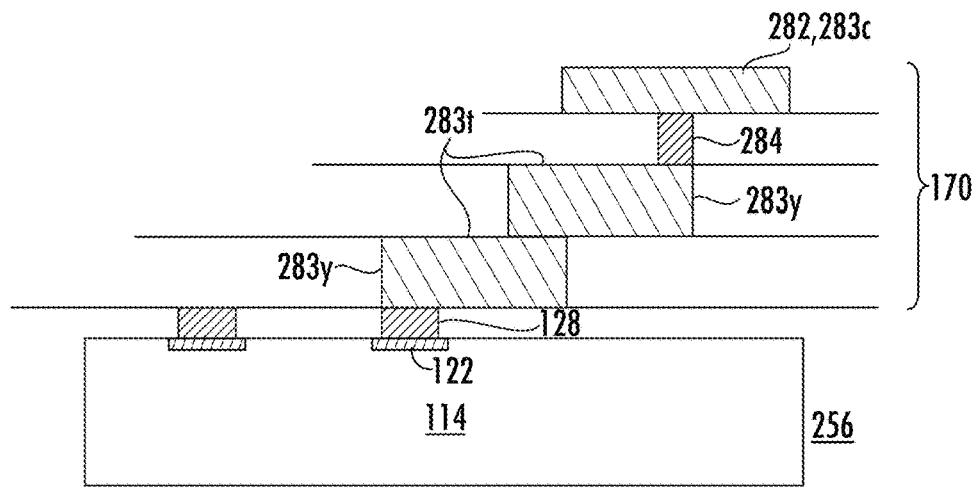

FIGS. 11A to 11C illustrate cross-sectional profile views of DCTs 283 formed over embedded components 114, similar to what is illustrated, e.g., in FIG. 8J. FIG. 11A illustrates an instance in which conductive studs 128 are present and connected to first DCT 283a as part of first conductive layer 274, and first via 284a connects first DCT 283a to second DCT 283b, as part of second conductive layer 278. Similarly, second via 284b connects second DCT 283b to third DCT segment or trace 283c as part of third electrically conductive layer or interconnect pad 282. FIG. 11B illustrates an instance in which the conductive studs 128 are not present, and the DCTs 283 or the vias 284 may directly contact the conductive contacts 122. FIG. 11B further illustrates an instance in which the arrangement of DCTs 283 comprises DCT segments of traces 283a, 283b, and 283c (collectively 283x) disposed on one or more vertically separated RDL layers that extend between two termini 283y and a majority of the traces 283x comprise distances or lengths L1 and L2 between the termini 283 y of the DCT traces 283x that is less than an interconnect pad pitch Di.

Building on the detail shared with respect to FIG. 8J, and repeated in FIGS. 11A-11B, FIG. 11C provides a sketch of another embodiment of a DCT 283 in which the DCT 283 is not formed separately from a via 284, but the DCT 283 is formed as a thick DCT 283*t* with a thickness of both a conventional DCT segment 283*x* and the via 284, with no dielectric layer 272 separating (or sandwiched between) portions of the various DCT segments 283*x*. Such thick DCTs 283*t* may be advantageously or desirably employed with materials, like ABF, PSPI, or other suitable material and eliminate a need for separate vias 284. Thick DCTs 283*t* may be advantageously or desirably employed when an amount of shift ox of component 114 or of rotation of the component 114 and the spacing and pitch of the conductive studs 128 allow sufficient space for the thick DCTs 283*t*.

Figure 12:
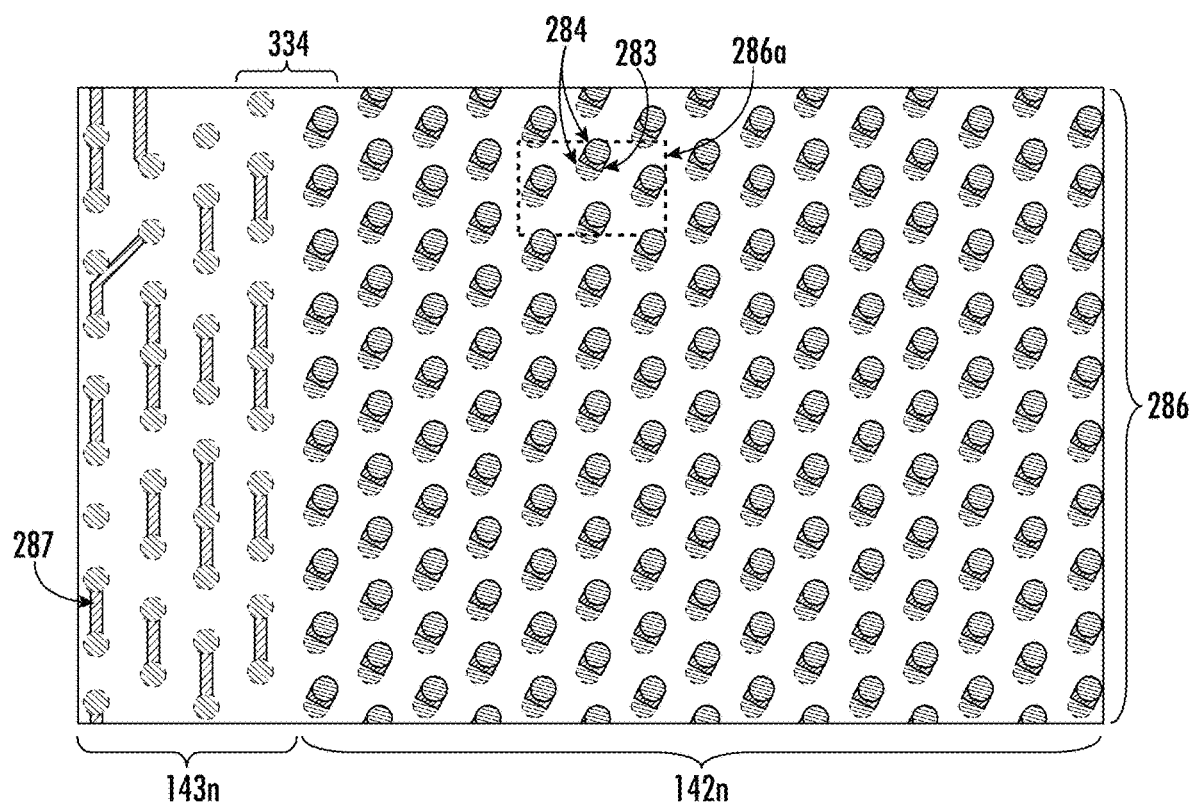
FIG. 12 illustrates an example of a substrate or interposer with embedded components coupled to DCTs, and further illustrates additional wires according to an aspect of the disclosure.
Figure 13:
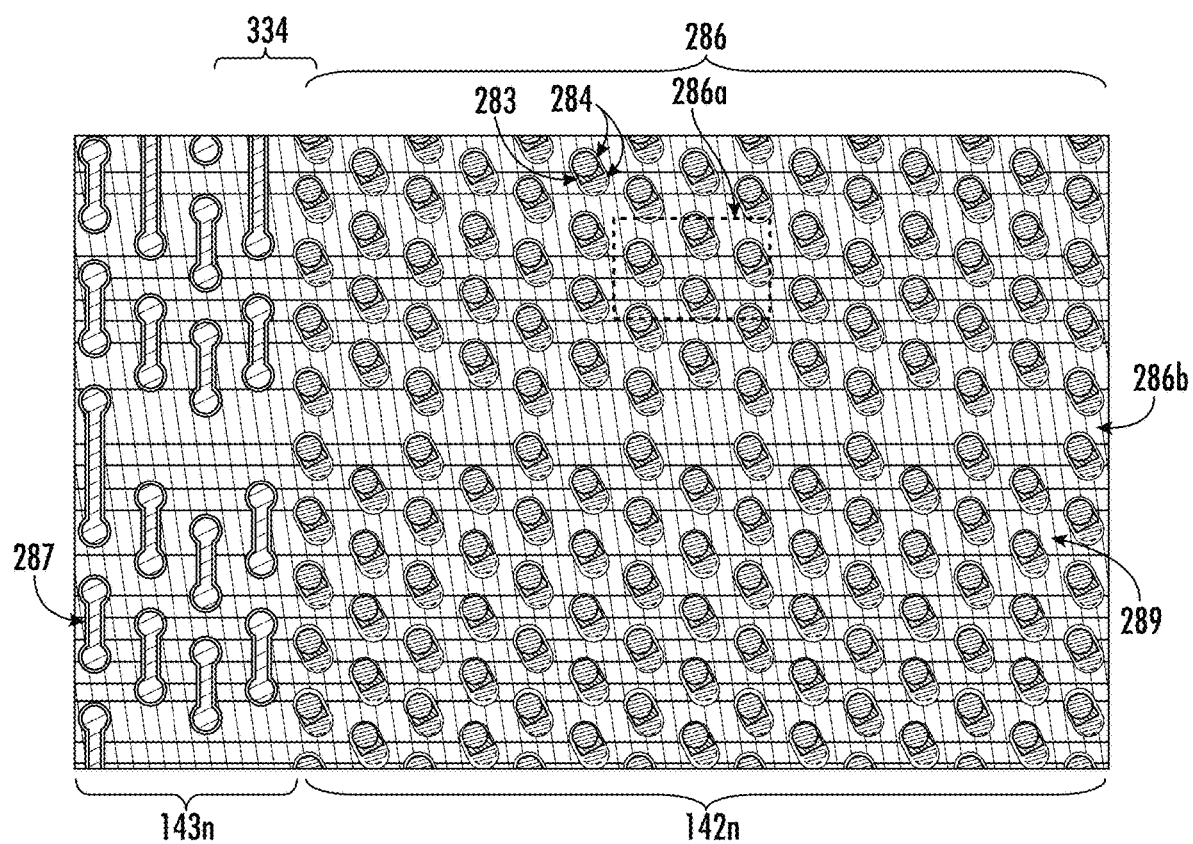
FIG. 13 illustrates an example of a substrate or interposer with embedded components coupled to DCTs and further shows a power plane according to an aspect of the disclosure.
Figure 14:
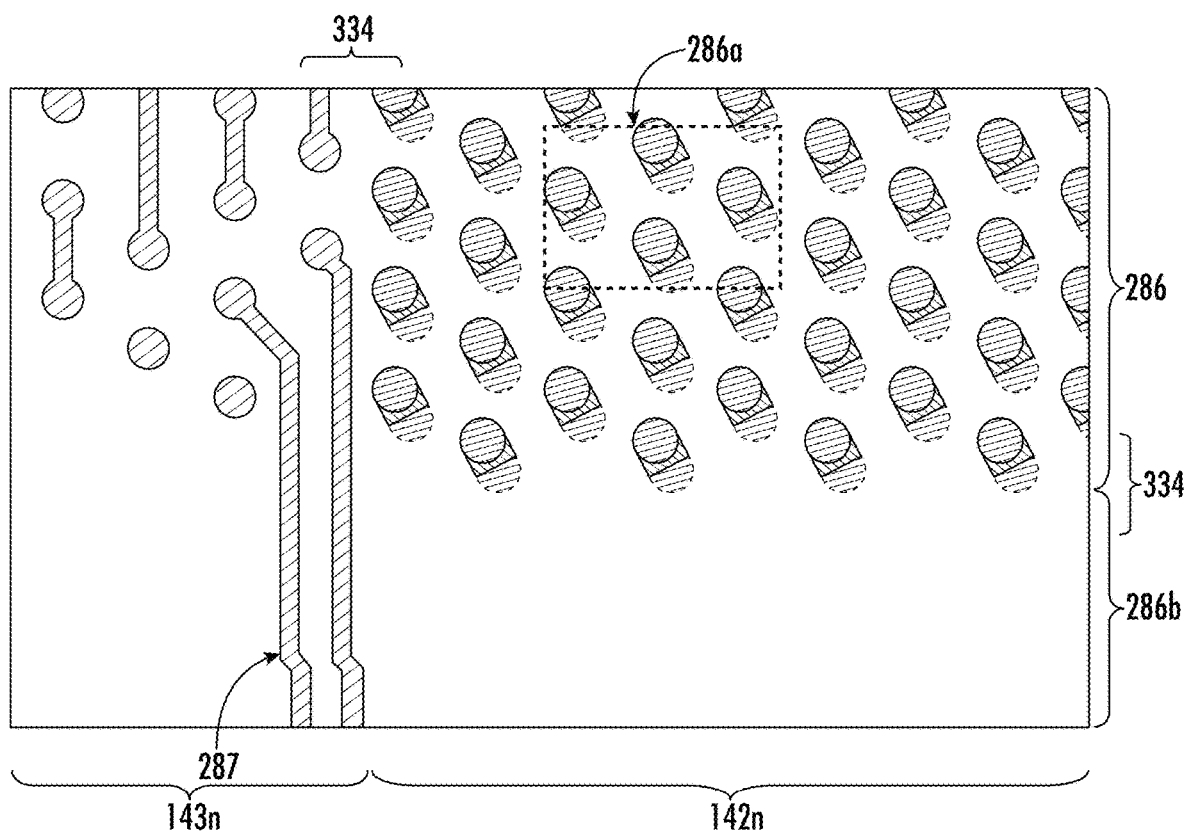
FIG. 14 illustrates an example of a substrate or interposer with embedded components coupled to DCTs and shows additional wires for connection to power planes or other components.

FIG. 12 illustrates an example of a substrate or interposer with embedded components 114 coupled to DCTs 283 and further shows wires, jumpers, jumper wires or runners 287 according to an aspect of the disclosure. In some embodiments, wires 287 may not be connected to, or be part of, the DCTs 283. FIG. 12 further depicts a region or lattice 286 that may be comprised of one or more regions, portions, arrangements, or grids 286*a* of DCTs formed across the frontside or backside interconnect structures of the substrate or interposer. The region 286 of DCTs may comprise at least one arrangement 286*a* of DCTs formed with unit specific patterning such that the arrangement 286*a* of DCTs is coupled to, and extends between, the conductive contacts 122 and the interconnect pads 282. The arrangement 286*a* of DCTs may be formed of various redistribution layers, vias, UBM layers or electrical interconnect structures 128. In some embodiments, the substrate or interposer of FIG. 12 may further comprise a power plane 289 disposed around the DCTs 283 and wires 287, as depicted in FIG. 13 following. FIGS. 12-14 each depict at least a portion of the nominal position, or design position 142*n* as part of die attach area 142 (as shown in FIGS. 8A-8D) of the embedded component 114, and at least a portion of an edge space or nominal space 143*n* as part of peripheral area or space 143 (as shown in FIGS. 8B, 8C and 8E).

FIG. 13 illustrates an example of a substrate or interposer with embedded components 114 coupled to DCTs 283 and further depicts a power plane 289 according to an aspect of the disclosure. In some embodiments, the power plane 289 may not be connected to, or be part of, the DCTs 283 or the wires 287. According to some embodiments, the arrangement 286*a* of DCTs may comprise about 80% by area of the footprint of the embedded component. Also shown in FIG. 13 are holes or channels 286*b* in the arrangement 286*a* of DCTs, which may provide for additional routing or thermal features therein.

FIGS. 12-14 also illustrate one or more of an edge case 334 may be present, such as at interface between 142*n* and 143*n* or at interface of 286 and 286*b*. In such instances, a DCT segment length (e.g. L1 or L2) for an edge case 334 of the region 286 that is outside the arrangement of DCTs (e.g. 286*a*, 286*b*, 286*c*) does exceed a spacing between the interconnect pads Di within the arrangement of DCTs. Further, in other instances a DCT segment length (e.g. L1 or L2) on each RDL layer within the arrangement of DCTs (e.g. 286*a*, 286*b*, 286*c*) does not exceed a spacing Di between a first interconnect pad 282 and a closest adjacent interconnect pad 282.

FIG. 14 illustrates an example of a substrate or interposer with embedded components 114 coupled to DCTs 283 and further showing wires 287 within the edge space or nominal space 143*n* for connection to additional power planes, components or other devices. According to some embodiments, the wires 287 may comprise from about 10% to about 40% by area of the footprint of the embedded component. In some embodiments, the substrate or interposer of FIG. 14 may further comprise a power plane 289 disposed around the DCTs 283 and wires 287, similar to as depicted in FIG. 13.

Figure 15:
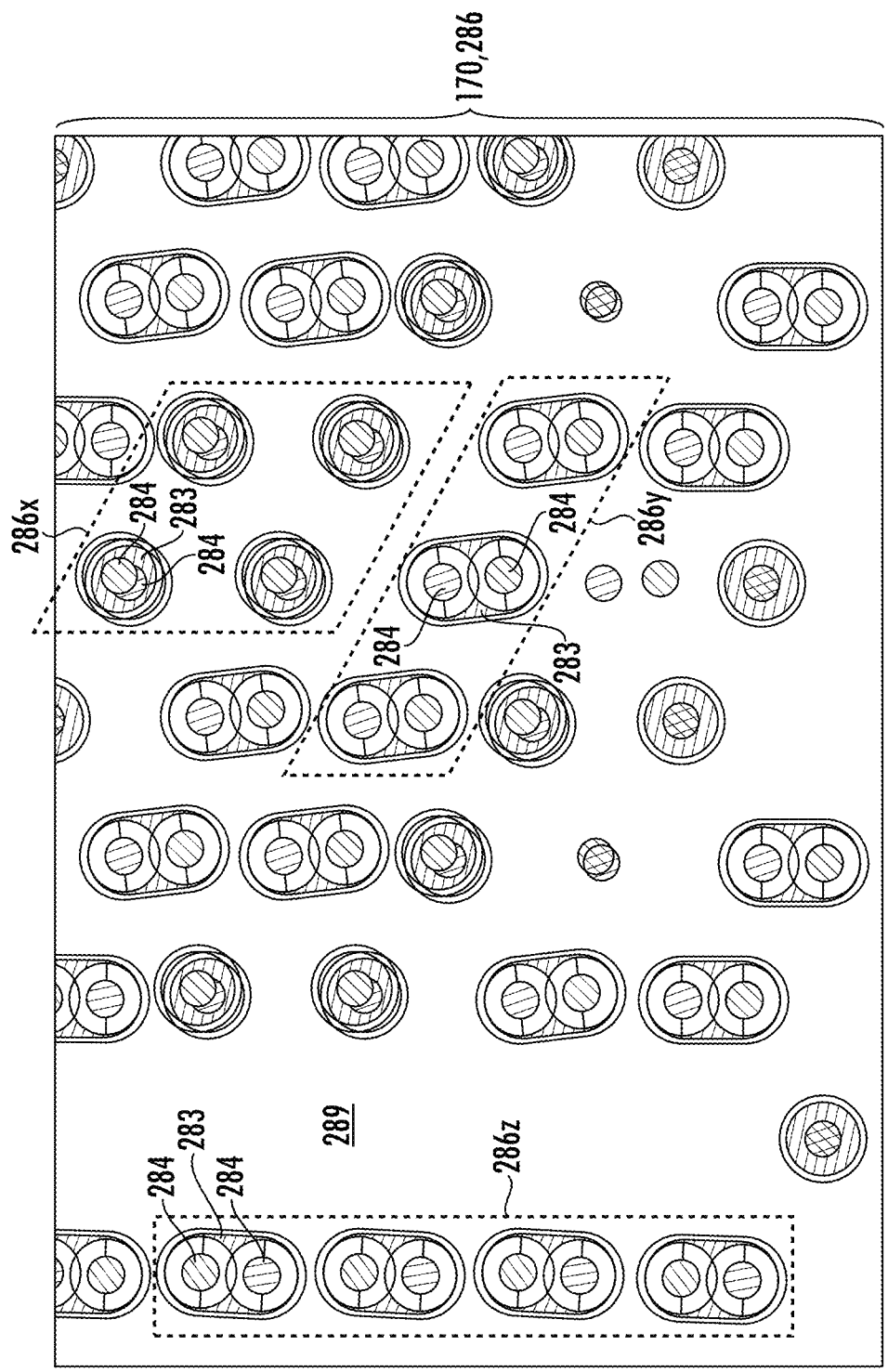
FIG. 15 illustrates an example of a substrate or interposer with a region comprising multiple portions or arrangements of DCTs.

FIG. 15 illustrates an example of a substrate or interposer 300 with embedded components 114 coupled to DCTs 283. According to some embodiments, region 286 may comprise multiple portions or arrangements 286, such as a first arrangement 286*x*, as second arrangement 286*y*, and a third arrangement 286*z* each differing from each other and functioning according to a configuration and design of the substrate 300. FIG. 15 also illustrates a plane 289, such as a power plane, disposed around the DCTs 283 and vias 284.

While this disclosure includes a number of embodiments in different forms, the drawings and written descriptions present detail of particular embodiments with the understanding that the present disclosure is to be considered as an exemplification of the principles of the disclosed methods and systems and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

What is claimed is:

1. A method of making a substrate comprising an embedded component and further comprising a region of displacement compensation traces (DCTs), the method of making the substrate comprising:
    providing a component comprising conductive contacts;
    measuring a shift of the component;
    forming a plurality of interconnect pads formed in an interconnect pad region over the component according to a nominal design position; and
    forming the region of DCTs comprising at least one arrangement of DCTs with unit specific patterning such that the arrangement of DCTs is coupled to, and extends between, the conductive contacts and the interconnect pads, wherein the arrangement of DCTs:
    compensates for the measured shift of the component, and
    comprises traces on one or more vertically separated RDL layers that extend between two termini and a majority of the traces comprise distances between the termini of the DCT traces that is less than an interconnect pad pitch;
    wherein a shift of the embedded component comprises a shift of a first embedded component, which is different than a shift for the shift of a second embedded component disposed within the same substrate, a first arrangement of DCTs compensates for a shift of the first embedded component, and a second arrangement of DCTs compensates for a shift of the second embedded component.

2. The method of claim 1, wherein the at least one arrangement of DCTs compensates for the measured shift of the component and does not extend beyond a shared footprint of the component and the interconnect pad region.

3. The method of claim 1, wherein a DCT segment length for an edge case of the region that is outside the arrangement of DCTs does exceed a spacing between the interconnect pads within the arrangement of DCTs.

4. The method of claim 1, further comprising a DCT segment length on each RDL layer within the arrangement of DCTs does not exceed a spacing between a first interconnect pad and a closest adjacent interconnect pad.

5. The method of claim 1, wherein the arrangement of DCTs comprises a length for each DCT segment that varies less than 20% of a length of each adjacent DCT for the arrangement.

6. The method of claim 1, further comprising at least one chip or chiplet mounted to the interconnect pads, wherein the at least one chip or chiplet may comprise functional structures of one or more of a processing unit, graphics processing unit (GPU), central processing unit (CPU), AI accelerator, AI processor, network processor, SOC, memory device, high-bandwidth memory (HBM) stack, optical interface device, and an application specific integrated circuit (ASIC).

7. The method of claim 1, wherein the substrate comprises an interposer.

8. The method of claim 1, wherein the component comprises one or more of an embedded bridge die, an active device, or a passive device.

9. The method of claim 1, further comprising a two-sided arrangement of DCTs in which at least one additional arrangement of DCTs is disposed over a backside of the substrate.

10. The method of claim 9, wherein the two-sided arrangement further comprises at least one additional embedded component is included over a backside of the substrate, opposite the embedded component.

11. The method of claim 1, wherein the substrate is formed comprising molded direct contact interconnect structures.

12. A method of making a substrate comprising an embedded component and further comprising a region of displacement compensation traces (DCTs), the substrate comprising:
   providing a component comprising conductive contacts;
   measuring a shift of the component;
   forming interconnect pads within an interconnect pad region over the component according to a nominal design position; and
   forming the region of DCTs comprising at least one arrangement of DCTs with unit specific patterning such that the arrangement of DCTs is coupled to, and extends between, the conductive contacts and the interconnect pads, wherein the arrangement of DCTs compensates for the measured shift of the component and a majority of the arrangement of DCTs does not extend beyond a shared footprint of the component and the interconnect pad region;
   wherein a length of each DCT within the arrangement is proportional to a distance between each DCT and a center of the embedded component.

13. The method of claim 12, wherein the at least one arrangement of DCTs extends across two or more vertically separated RDL layers.

14. The method of claim 12, wherein a DCT segment length for an edge case of the region that is outside the arrangement of DCTs does exceed a spacing between the interconnect pads within the arrangement of DCTs.

15. The method of claim 12, further comprising a DCT segment length on each RDL layer within the arrangement of DCTs does not exceed a spacing between a first interconnect pad and a closest adjacent interconnect pad.

16. The method of claim 12, wherein the arrangement of DCTs comprises a length for each DCT segment that varies less than 20% of a length of each adjacent DCT for the arrangement.

17. The method of claim 12, further comprising at least one chip or chiplet mounted to the interconnect pads, wherein the at least one chip or chiplet may comprise functional structures of one or more of a processing unit, graphics processing unit (GPU), central processing unit (CPU), AI accelerator, AI processor, network processor, SOC, memory device, and high-bandwidth memory (HBM) stack, optical interface device, and an application specific integrated circuit (ASIC).

18. The method of claim 12, wherein the substrate comprises an interposer.

19. The method of claim 12, wherein the component comprises one or more of an embedded bridge die, an active device, or a passive device.

20. The method of claim 12, further comprising:
   a shift of the embedded component comprises a shift of a first embedded component, which is different than a shift for the shift of a second embedded component disposed within the same substrate;
   a first arrangement of DCTs compensates for a shift of the first embedded component; and
   a second arrangement of DCTs compensates for a shift of the second embedded component.

21. The method of claim 12, further comprises a two-sided arrangement wherein at least one additional embedded component is included over a backside of the substrate, opposite the embedded component.

22. The method of claim 12, wherein the substrate is formed comprising molded direct contact interconnect structures.

23. A method of making a substrate comprising an embedded component and further comprising a region of displacement compensation traces (DCTs), the substrate comprising:
   providing a component comprising conductive contacts;
   measuring a shift of the component;
   forming interconnect pads within an interconnect pad region over the component according to a nominal design position; and
   forming the region of DCTs comprising at least one arrangement of DCTs with unit specific patterning such that the arrangement of DCTs is coupled to, and extends between, the conductive contacts and the interconnect pads, wherein the arrangement of DCTs compensates for the measured shift of the component and a majority of the arrangement of DCTs does not extend beyond a shared footprint of the component and the interconnect pad region;
   wherein a shift of the embedded component comprises a shift of a first embedded component, which is different than a shift for the shift of a second embedded component disposed within the same substrate;
   a first arrangement of DCTs compensates for a shift of the first embedded component; and
   a second arrangement of DCTs compensates for a shift of the second embedded component.

24. The method of claim 23, further comprising at least one chip or chiplet mounted to the interconnect pads, wherein the at least one chip or chiplet may comprise functional structures of one or more of a processing unit, graphics processing unit (GPU), central processing unit (CPU), AI accelerator, AI processor, network processor, SOC, memory device, and high-bandwidth memory (HBM) stack, optical interface device, and an application specific integrated circuit (ASIC).

\* \* \* \* \*